United States Patent
Ausserlechner

(10) Patent No.: US 10,782,116 B2
(45) Date of Patent: *Sep. 22, 2020

(54) DISCRETE MAGNETIC ANGLE SENSOR DEVICE, A MAGNETIC ANGLE SENSOR ARRANGEMENT, A METHOD FOR GENERATING AN ANGLE SIGNAL AND A METHOD FOR PROVIDING A SENSOR SIGNAL

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/697,993

(22) Filed: Nov. 27, 2019

(65) Prior Publication Data

US 2020/0124398 A1    Apr. 23, 2020

Related U.S. Application Data

(63) Continuation of application No. 15/223,586, filed on Jul. 29, 2016, now Pat. No. 10,514,246, which is a
(Continued)

(51) Int. Cl.
*G01B 7/30* (2006.01)
*G01R 33/02* (2006.01)
(Continued)

(52) U.S. Cl.
CPC .............. *G01B 7/30* (2013.01); *G01D 5/145* (2013.01); *G01D 5/147* (2013.01); *G01D 5/165* (2013.01); *G01R 33/02* (2013.01); *G01R 33/022* (2013.01)

(58) Field of Classification Search
CPC .......... G01D 5/145; G01D 5/147; G01B 7/30; G01R 33/02
(Continued)

(56) References Cited

U.S. PATENT DOCUMENTS

| 5,113,136 A | 5/1992 | Hayashi et al. |
| 5,187,436 A | 2/1993 | Mallick |

(Continued)

FOREIGN PATENT DOCUMENTS

| CN | 1643341 A | 7/2005 |
| CN | 1754080 A | 3/2006 |

(Continued)

OTHER PUBLICATIONS

U. Ausserlechner, "Inaccuracies of Anisotropic Magneto-Resistance Angel Sensors Due to Assembly Tolerances", Proqr. Electromaqn. Research B, vol. 40, pp. 79-99 (2012).
(Continued)

*Primary Examiner* — Reena Aurora
(74) *Attorney, Agent, or Firm* — Schiff Hardin LLP

(57) ABSTRACT

A discrete magnetic angle sensor device can include a first magnetic field gradiometer and a second magnetic field gradiometer. The first magnetic field gradiometer and the second magnetic field gradiometer can be of different types of a group of gradiometer types. The sensor advantageously improves an accuracy of a determination of a rotation angle.

21 Claims, 38 Drawing Sheets

Related U.S. Application Data continuation of application No. 13/944,410, filed on Jul. 17, 2013, now Pat. No. 9,671,214.

(51) Int. Cl.
  *G01D 5/14* (2006.01)
  *G01R 33/022* (2006.01)
  *G01D 5/165* (2006.01)

(58) Field of Classification Search
  USPC ............................ 324/207.2, 207.24, 207.21
  See application file for complete search history.

(56) References Cited

U.S. PATENT DOCUMENTS

| | | | |
|---|---|---|---|
| 5,247,278 | A | 9/1993 | Pant et al. |
| 5,311,129 | A | 5/1994 | Ludwig et al. |
| 5,657,756 | A | 8/1997 | Vrba et al. |
| 6,969,988 | B2 | 11/2005 | Kakuta et al. |
| 7,474,093 | B2 | 1/2009 | Ausserlechner |
| 8,664,945 | B2 | 3/2014 | Laville et al. |
| 9,671,214 | B2 | 6/2017 | Ausserlechner |
| 10,514,246 | B2 * | 12/2019 | Ausserlechner ....... G01D 5/165 |
| 2012/0001620 | A1 | 1/2012 | Laville et al. |
| 2012/0161755 | A1 | 6/2012 | Masson et al. |
| 2012/0217960 | A1 | 8/2012 | Ausserlechner |
| 2015/0022192 | A1 | 1/2015 | Ausserlechner |
| 2019/0242956 | A1 * | 8/2019 | Przytarski ............ G01R 33/093 |

FOREIGN PATENT DOCUMENTS

| | | |
|---|---|---|
| CN | 102564471 A | 7/2012 |
| JP | 2002054902 A | 2/2002 |

OTHER PUBLICATIONS

U. Ausserlechner, "Inaccuracies of Giant Magneto-Resistive Angle Sensors Due to Assembly Tolerances", IEEE Trans. Magn., May 2009, vol. 45, No. 5, pp. 2165-2174.
U. Ausserlechner, "The Optimum Layout for Giant Magneto-Resistive Angel Sensors", IEEE Sens. J., vol. 10, No. 10, DD. 1571-1582 (2010).
M. Demierre, et al., "Contactless 360??? Absolute AngularCMOS Microsystem Based on Vertical Hall Sensors", Sensors and Actuators, A 116, pp. 39-44 (2004).
M. Metz, et al., "Contactless Angle Measurement Using Four Hall Devices on SingleChip", Transducers '97, 1997 Int'l ,Conf Solid-State Sensors and Actuators, Chicago, Jun. 16-19, (1997), pp. 385-388.
Y. Takahashi, et al., "Development of a High Precision Angle Sensor", NTN Techn. Rev., No. 73, 98-103 (2005).
W. Granig, et al., "Performance and Technology Comparison of GMR Versus Commonly Used Angle Sensor Principles for Automotive Applications", in SAE World Congress & Exhibition, Detroit, USA, Apr. 2007, SAE document No. 2007-01-0397.
U. Ausserlechner, "A Theory of Mangetic Angle Sensors With Hall Plates and Without Fluxguides", vol. 49, pp. 77-106 (2013).
Chinese Office Action dated Aug. 8, 2016 for Chinese patent Application No. 201410343038.9 (with English translation).

* cited by examiner

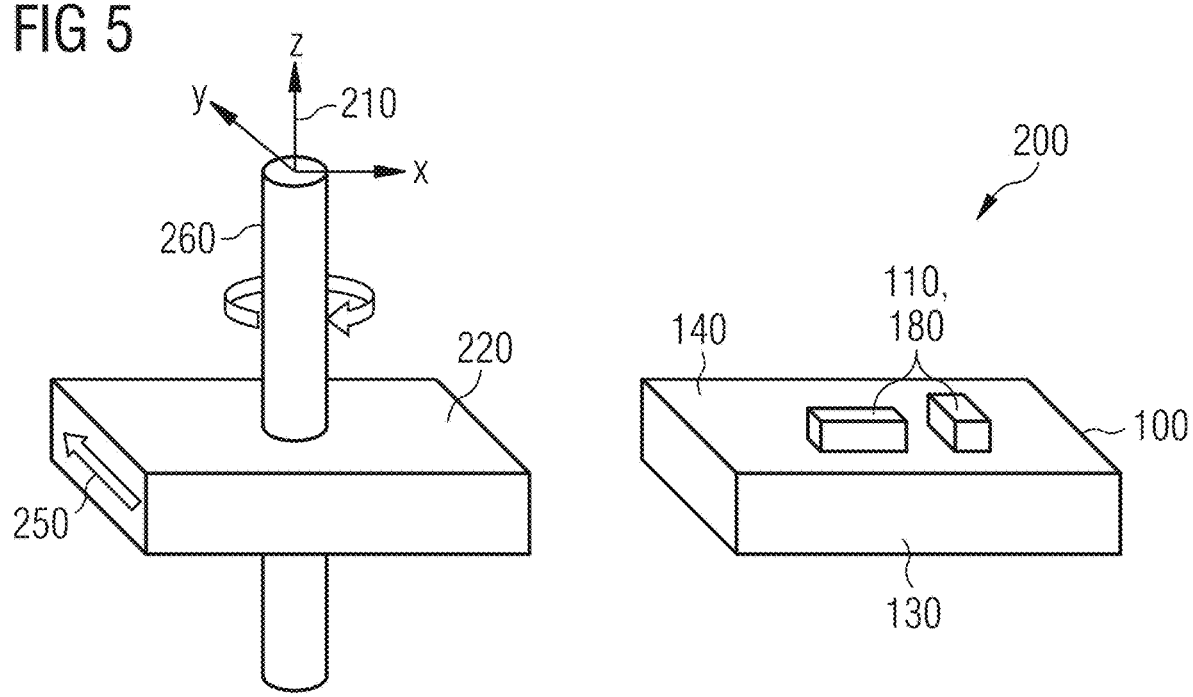
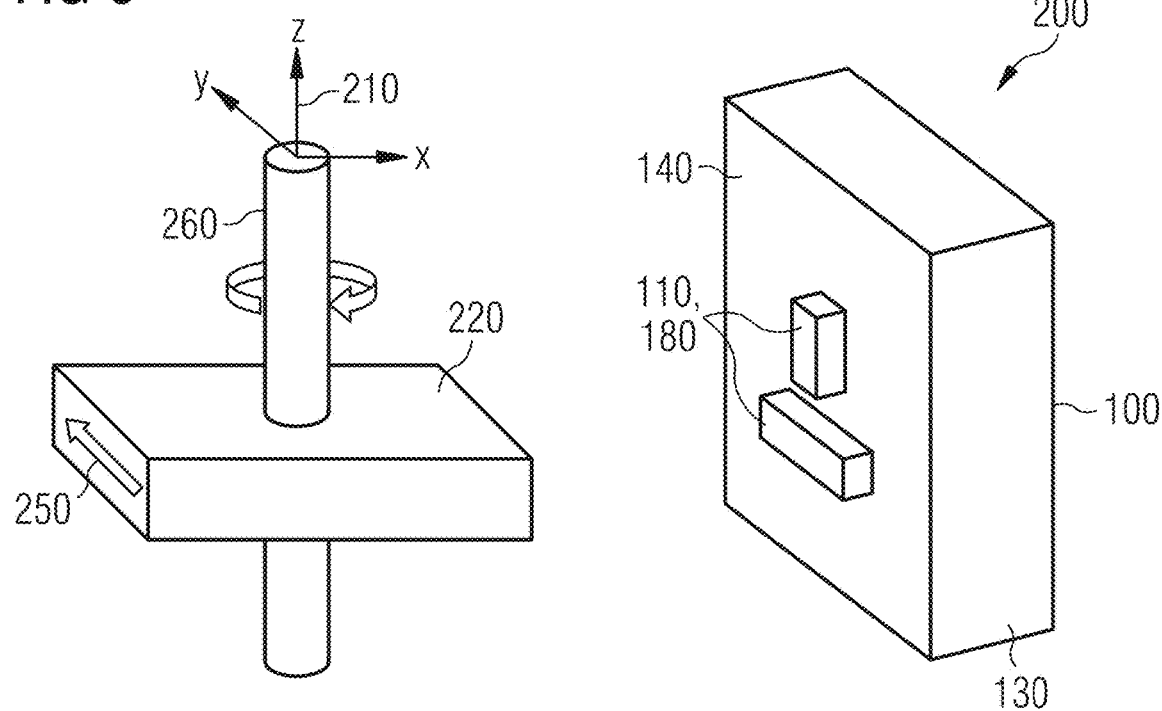

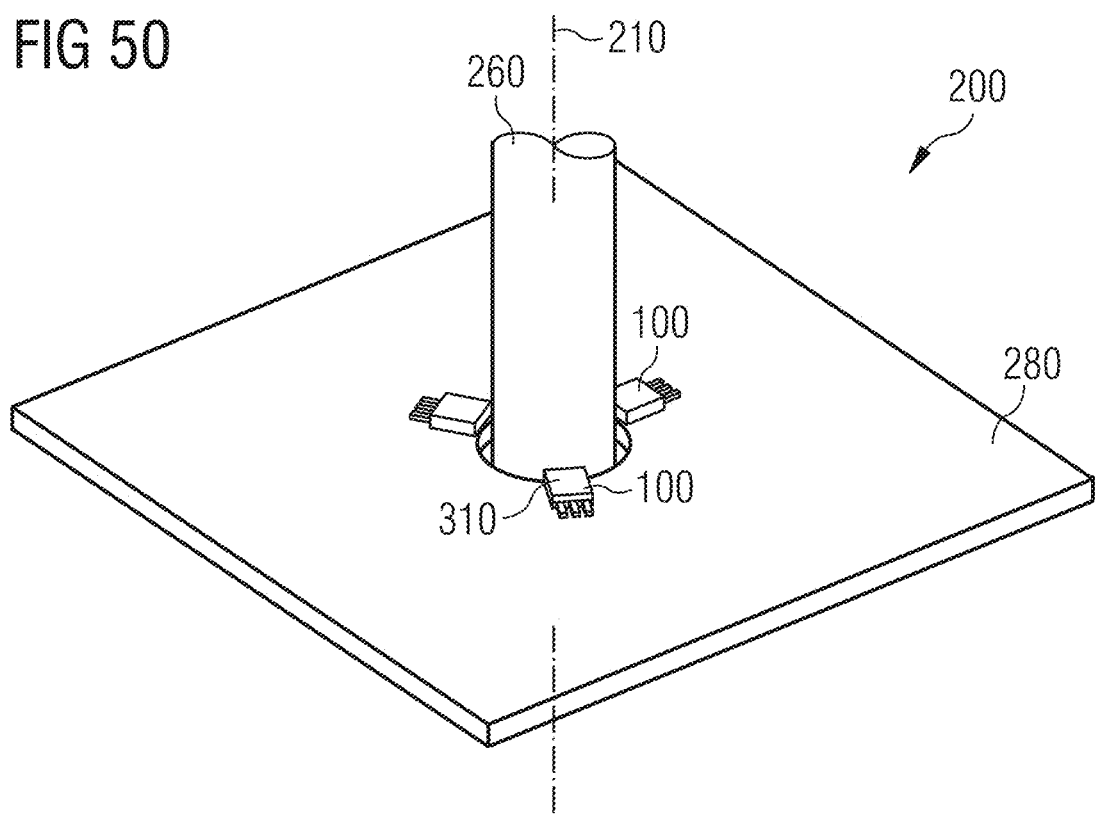

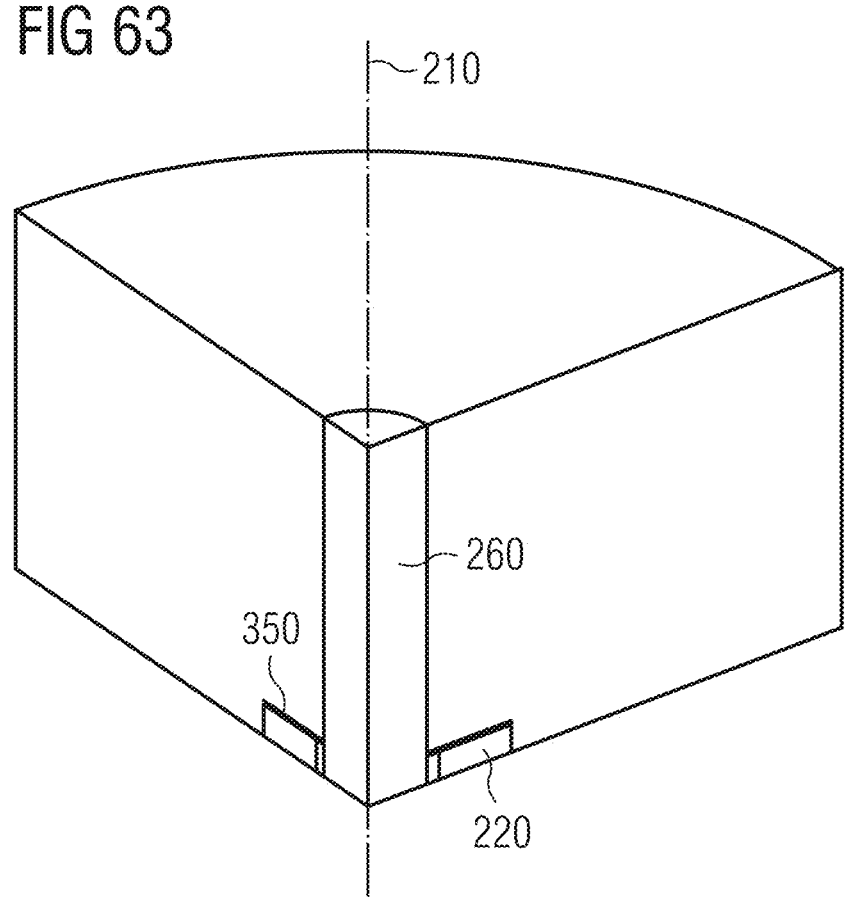

DISCRETE MAGNETIC ANGLE SENSOR DEVICE, A MAGNETIC ANGLE SENSOR ARRANGEMENT, A METHOD FOR GENERATING AN ANGLE SIGNAL AND A METHOD FOR PROVIDING A SENSOR SIGNAL

CROSS REFERENCE TO RELATED APPLICATION

This application is a continuation of U.S. patent application Ser. No. 15/223,586, filed Jul. 29, 2016, which is a continuation of U.S. patent application Ser. No. 13/944,410, filed Jul. 17, 2013, now U.S. Pat. No. 9,671,214. These application are each incorporated herein by reference in their entirety.

TECHNICAL FIELD

Embodiments relate to a discrete magnetic angle sensor device, a magnetic angle sensor arrangement, a method for generating an angle signal and a method for providing a sensor signal, which may, for instance, be used to determine a rotation angle of a first component with respect to a second component as, for instance, in the field of automotive applications.

BACKGROUND

In many applications a first component rotates or pivots with respect to a second component. Examples come, for instance, from the field of automotive applications such as determination of a steering angle. For instance, it may be advisable for a control unit of a car to determine the steering angle by measuring a rotation angle of the steering column. Conventionally, a magnet may be mounted on an end of a corresponding axle or shaft with a magnetization such that a magnetic field sensor arranged along the rotation axis of the axle or shaft is capable of detecting a change of the magnetic field in response to the rotation of the steering column. Such an arrangement is also referred to as an on-axis angle sensor since the magnetic field sensor is mounted along the rotation axis of the shaft or axle to the end of which the magnet is mounted.

However, for instance, due to installation space restrictions or rather circumstances such an on-axis angle sensor might not always be implementable. In such a case, an off-axis angle sensor with a through-shaft magnet may be used. This arrangement may be referred to as an off-axis sensor since the magnetic field sensor is not placed along the rotation axis of the respective shaft or axle.

Due to the arrangement of the magnet with respect to the magnet field sensor, the sensor might suffer from non-optimal magnetic field conditions, which may lead to a higher error of the angle of the magnetic field created by the magnet compared to a more conventional design.

Therefore, a demand exists to improve an accuracy of a determination of a rotation angle, for instance, of a magnetic field with respect to a reference direction. Similar technical challenges and a similar demand may also exist, when, for instance, the magnet is in an off-axis angle sensor arrangement attached to an end of a shaft or an axle or in an on-axis arrangement.

SUMMARY

A discrete magnetic angle sensor device according to an embodiment comprises a first magnetic field gradiometer and a second magnetic field gradiometer. The first and second gradiometers are of different types of a group of gradiometer types. Being comprised in a discrete magnetic angle sensor device, the first and second magnetic field gradiometers may be accommodated in a sensor package.

A discrete magnetic angle sensor device according to an embodiment is based on the finding that using at least two gradiometers of different types in a discrete magnetic angle sensor device may improve an accuracy and, therefore, decrease an error of an angle determination with respect to the angle of a magnetic field. Optionally, the discrete magnetic angle sensor device according to an embodiment may further comprise a sensor circuit configured to generate a sensor signal indicative of a rotation angle, for instance an angle of the magnetic field, based on a first gradiometer signal of a first magnetic field gradiometer and based on a second gradiometer signal of a second magnetic field gradiometer. The sensor signal may, thus, be generated to be robust against a background magnetic interference. Or, to put it in other words, the sensor circuit may optionally be configured such that the sensor signal is robust against background magnetic interference. Such an optional embodiment may be based on the finding that an implementation of an angle sensor device into a system or an arrangement may be simplified by integrating such a sensor circuit. This may enable a determination of the angle of the magnetic field without having to rely on gradiometer signals from external sources. Hence, the determination may be more accurate. Additionally or alternatively, by using two gradiometers of different types it may be possible to base the determination of the angle of the magnetic field on two different angle dependencies of the gradiometer signals. Moreover, it may also be possible to determine the angle more robustly against external interfering magnetic fields.

A magnetic angle sensor arrangement according to an embodiment comprises at least one discrete magnetic angle sensor device, the discrete magnetic angle sensor device comprising a first magnetic field gradiometer, a second magnetic field gradiometer, which may be accommodated in a package, and a sensor circuit configured to generate a sensor signal indicative of a rotation angle, which may be given by an angle of the magnetic field with respect to a reference direction or an angular position of a magnetic field source (e.g. a magnet or a coil), based on a first gradiometer signal of a first magnetic field gradiometer and on a second gradiometer signal of the second magnetic field gradiometer. The first magnetic field gradiometer and the second magnetic field gradiometer are of different types of a group of gradiometer types. The at least one discrete magnetic angle sensor device is arranged fixedly with respect to rotation axis around which a magnet is rotatably mountable such that the at least one discrete magnetic angle sensor is arranged off axis with respect to the rotation axis. For instance, the rotation axis and its mathematical extension may be oriented such that it does not penetrate or go through at least one of the discrete angle sensor(s), one or more of its sensor elements, effective positions of the gradiometers or similar center points of the sensor elements used.

A magnetic angle sensor arrangement according to an embodiment is based on the finding that by using at least one discrete magnetic angle sensor device as described before, an accuracy of the angle may be improved in an off-axis arrangement of the at least one discrete magnetic angle sensor device with respect to the rotation axis. Optionally a plurality of discrete magnetic angle sensor devices may be used, which may eventually increase an accuracy further, for instance, by making the arrangement more robust against external influences outside the plurality of discrete magnetic angle sensor devices.

A method for generating an angle signal according to an embodiment comprises providing a magnetic field. It further comprises generating a plurality of sensor signals, each sensor signal generated by an individual discrete magnetic angle sensor device, the sensor signals being indicative of a rotation angle. The sensor signals of the individual discrete magnetic angle sensor devices may be optionally essentially independent of a homogeneous external magnetic disturbance field. They may be optionally measured at the respective positions of the discrete magnetic angle sensor devices. The method further comprises generating the angle signal indicative of the angle of the magnetic field based on the plurality of sensor signals.

The method for generating an angle signal according to an embodiment is based on the finding that by employing a plurality of sensor signals generated by individual discrete magnetic angle sensor devices, each of the sensor signals being indicative of a rotation angle at a position of the discrete magnetic angle sensor device, an accuracy of the rotation angle, for instance of a magnetic field, which may be generated by a magnet or a coil, may be improved. In other words, by using a plurality of sensor signals an accuracy caused, for instance, by a misalignment or accuracy deteriorating effects may be reduced.

A method for providing a sensor signal according to an embodiment comprises generating a first gradiometer signal using a first gradiometer. The method further comprises generating a second gradiometer signal using a second gradiometer. It further comprises generating the sensor signal indicative of a rotation angle based on the first and second gradiometer signals, wherein the first magnetic field gradiometer and the second magnetic field gradiometer are of different types of a group of gradiometer types and the first and second gradiometers are comprised in a discrete magnetic angle sensor device.

The method for providing the sensor signal according to an embodiment is based on the finding that an accuracy of the rotation angle may be improved by using two gradiometers of different types, since it may be possible to base the determination of the angle of the magnetic field on two different angle dependencies of the gradiometer signals. Moreover, it may also be possible to determine the angle more robustly against external interfering magnetic fields. It may also be possible to increase an over-all sensitivity and, hence, an accuracy of the angle of the magnetic field to be determined.

BRIEF DESCRIPTION OF THE DRAWINGS

Several embodiments of the present invention will be described in the enclosed Figures.

FIG. 5 shows a schematic representation of a magnetic angle sensor arrangement in an off-axis configuration.

FIG. 6 shows a schematic representation of a further magnetic angle sensor arrangement according to an embodiment in an off-axis configuration.

FIG. 50 shows a perspective view of a magnetic angle sensor arrangement of FIGS. 48 and 49 without the magnet.

FIG. 51b shows a side view of the magnetic angle sensor arrangement shown in FIGS. 48 to 50 and FIG. 51a.

FIG. 63 shows a perspective partial sectional view of a shaft, a diametrically magnetized magnet and a disc.

DETAILED DESCRIPTION

In the following, embodiments according to the present invention will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

Figure 1:
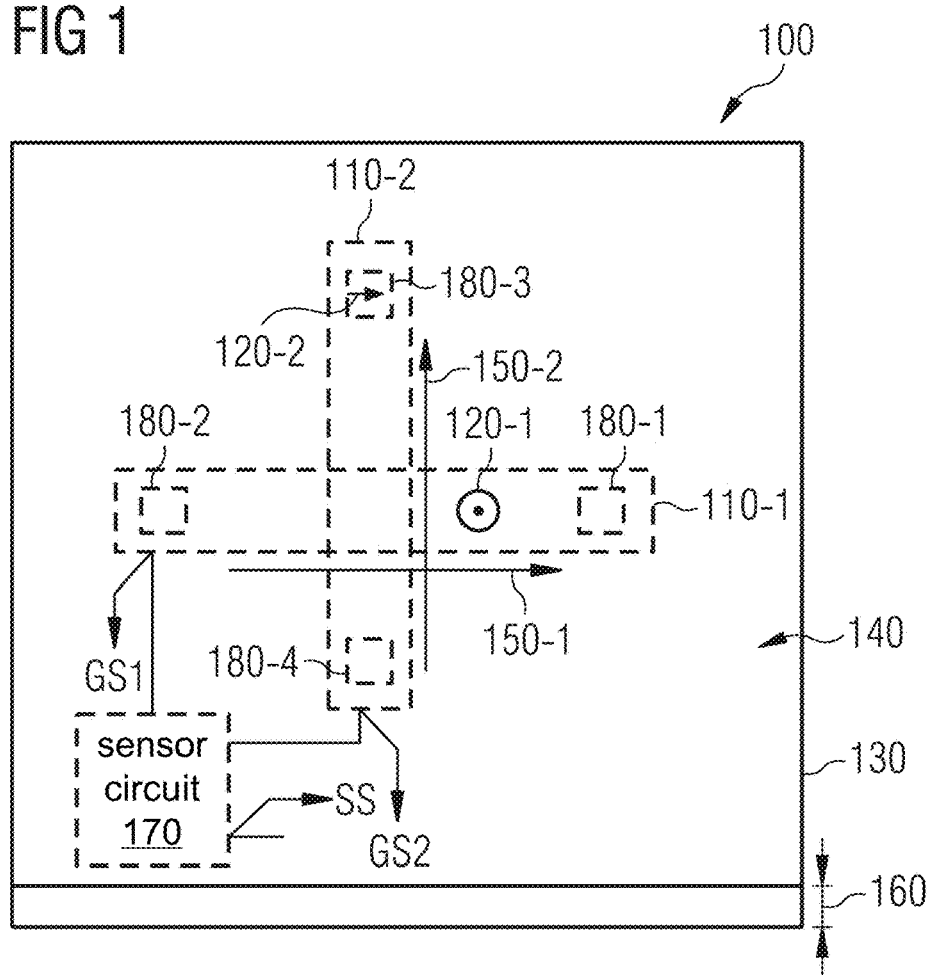
FIG. 1 shows a schematic view of a discrete magnetic angle sensor device according to an embodiment.

FIG. 1 shows a schematic view of a discrete magnetic angle sensor device 100 according to an embodiment. The discrete magnetic angle sensor device 100 comprises a first magnetic field gradiometer 110-1, which is sensitive to a gradient of a first magnetic field component 120-1 of a magnetic field. It further comprises a second magnetic field gradiometer 110-2, which is sensitive to a gradient of a second magnetic field component 120-2, which is different from the first magnetic field component 120-1. The first and second magnetic field components 120-1, 120-2 are illustrated in FIG. 1 by arrows indicating first and second directions, respectively, along which the magnetic field components 120 are taken. Since the magnetic field components 120 are different, also the corresponding directions and, hence, the corresponding errors are not parallel aligned or—to put it in other words—non-collinear. The discrete magnetic angle sensor 100 may, therefore, be referred to as a two-dimensional gradient sensor or sensor device 100.

In other words, the two gradiometers 110 are of different types of a group of gradiometer types. The group of gradiometer types comprises a gradiometer of a first order, a gradiometer of a second order and a gradiometer of n-th order, wherein n is an integer larger than 2, each gradiometer being sensitive at least either to a gradient of a first magnetic field component of a magnetic field or to a gradient of a second magnetic field component of the magnetic field different from the first magnetic field component the gradiometers further comprising at least one sensor element of a group of sensor types, wherein the group of sensor types comprises a vertical Hall-sensor, a horizontal Hall-sensor, a giant magneto-impedance device and a magnetoresistive sensor element. In other words, a gradiometer of a certain type is at least defined by an order of the gradiometer, at least one magnetic field component, to which it is sensitive and a type of sensor element 180 it comprises. For example, two gradiometers 110 may be of different types, when the gradiometers 110 are responsive to two different magnetic field components 120, are of different order or comprise different types of sensor elements (e.g. Hall sensor elements and anisotropic magnetoresistive sensor elements (AMR)).

As will be laid out in more detail below, a component of a vector is given by a direct product of the corresponding vector with a unity vector or direction vector having a length of 1 along the corresponding direction of the component. A gradiometer 110 of a first order may detect a difference of a (physical) quantity at two different locations. When these two different locations are located sufficiently close enough to one another, a gradiometer signal of a gradiometer 110 of the first order corresponds to a slope of the quantity along the direction of the two different locations between the two locations. It may be equal to the value of the slope at a midpoint (e.g. center) between the two locations multiplied by the distance between the two locations. The midpoint may be considered the place, where the gradiometer 110 essentially measures, for instance, a slope or a higher derivative of the quantity based on the order of the gradiometer.

Accordingly, a gradiometer signal of a gradiometer 110 of the second order is indicative of a difference of two gradiometer signals of gradiometers 110 of a first order, which are once again taken at a location between the midpoint of the two gradiometers 110. Hence, a gradiometer signal of a gradiometer of a second order may be indicative of a second derivative of the physical quantity along the corresponding gradiometer direction 150. This system continues for gradiometers 110 of higher orders, for instance, of a n-th order with n being an integer larger than 2.

Naturally, the physical quantity may be a component of a magnetic field, an angle of the magnetic field with reference to a reference direction or an angle of a projection of the magnetic field onto a plane in view of the reference direction. In other words, the angle may be indicative of the angular position of a magnet, a coil or—in more general terms—of magnetic source comprising, for instance, a coil and/or a magnet.

The discrete magnetic angle sensor 100 may optionally comprise a substrate 130 comprising a main surface 140 on which the first and second field gradiometers 110-1, 110-2 may be formed. However, alternatively or additionally, the first and second field gradiometers 110-1, 110-2 may also be formed within the substrate 130. As a consequence, it may be possible to fabricate the discrete magnetic angle sensor device 100 according to an embodiment using thin film processing steps such as depositing layers of metallic, semiconducting or insulating materials, patterning the same, milling the pattern structures, doping or other process steps. Additionally or alternatively, the gradients of the first and second magnetic field components 120-1, 120-2 may be taken along a first and second gradiometer direction 150-1, 150-2, respectively, by the first and second magnetic field gradiometer 110-1, 110-2, which are arranged parallel to the main surface 140 of the substrate 130. The gradiometer directions 150-1, 150-2 of the first and second magnetic field gradiometer 110-1, 110-2 may, for instance, coincide with an extension of the magnetic field gradiometers 110-1, 110-2, respectively.

The substrate 130 may comprises a plate-shape comprising a thickness perpendicular to the main surface 140 smaller than extensions on the substrate 130 parallel to the main surface 140. The substrate 130 may be, for instance, a semiconductor substrate. For instance, the substrate may be a silicon substrate (Si) or a silicon-on-insulator substrate (SOI). However, it may also be possible to use an insulating substrate depending on the application in mind.

As mentioned before, embodiments relate to a discrete magnetic angle sensor device 100. Being a discrete device, the discrete magnetic angle sensor device 100 may be implemented as an electrical or electronic system, which is arranged in a package. For instance, the substrate 130, which may be referred to as die or chip in embodiments, may be PEL plastic encapsulated to name just one example of an encapsulating material. In other words, the discrete magnetic angle sensor device 100 forms a single unit which can easily be handled and integrated into a more complex electronic circuit or mounted onto a printed circuit board or another carrier. Typically, dimensions of a discrete magnetic angle sensor device 100 according to an embodiment are at the most 50 mm, at the most 30 mm or at the most 20 mm, for instance, 4 mm. Naturally, a discrete magnetic angle sensor device 100 may comprise more than one substrate 130. In other words, it may be implemented as a multichip module comprising two or more chip substrates 130 housed in a same package. The two or more substrates may be arranged parallel or orthogonally with respect to one another. For instance, one or more substrate 130 may be arranged in a vertical position while another substrate 130 may be arranged horizontally. Such an arrangement may, for instance, be used when the discrete magnetic angle sensor device 100 according to an embodiment may be used as a compass sensor in a cellular phone. It is to be understood that in embodiments, discrete devices such as the discrete magnetic angle sensor device described herein may have implemented logic circuit elements for example to provide compensation, self-calibration, signal processing for the sensor device. These functionalities may be on a same chip substrate as the sensing element or on a different substrate housed within a same module package.

A discrete sensor device may be, for instance, contained within or formed on a single substrate. It may also be distributed over several substrates with the substrates being arranged or contained in a single package. For instance, all parts of the sensor may be manufactured in a single process sequence, such as a semiconductor wafer process to fabricate the discrete sensor device 100. Sometimes, parts of the sensors may be manufactured after a typical microelectronic wafer manufacturing process. For instance, magnetic flux concentrators may be glued to a top of a wafer or magnetoresistors may be sputtered on top of a wafer after the last interconnect layer has been manufactured. In order not to pollute the wafer fab, these parts may be done immediately after the ordinary wafer process, yet these processing steps may still be closely linked to the wafer fabrication, particularly, if a final passivation layer protecting circuit and sensor elements are applied afterwards. Another possible feature of a discrete sensor 100 may be that it has undergone a magnetic test, before it is assembled together with a rotatable magnet in the final angle sensor system. If such a test has been carried out, the individual parts that went through this test may be regarded as discrete sensors. For instance, the test may comprise a simplified test procedure allowing to verify if the discrete sensor devices work and if their performance is in their expected limits. In other words, the test may be used to see if an additional calibration may be unnecessary, advisable or perhaps even necessary. However, it may be interesting to try to avoid an additional calibration to avoid implementing an additional memory or other storage cells to store the calibration data. This may, for instance, be avoided by using a set of discrete sensor devices having similar properties and/or characteristics within a specified, application-specific margin. For instance, the discrete sensor devices may be coupled to the same power source and/or being fabricated from during the same process steps.

In other words, a discrete magnetic angle sensor device 100 according to an embodiment may be implemented as an angle sensor contained within a sensor package comprising two magnetic field gradiometers sensitive to two different magnetic field directions. An accuracy of the angle determination may be improved by more perfectly aligning the first and second gradiometers 110-1, 110-2. This may be achievable cost-efficiently and accurately by implementing the gradiometers 110-1, 110-2 on the same substrate 130, for instance, when they are manufactured simultaneously. For instance, the sensor elements may be placed within a pre-defined accuracy of, for instance, 10 μm or better. They may, additionally or alternatively, be placed in a single package.

The gradients or, to be more precise, the first gradiometer direction 150-1 and the second gradiometer direction 150-2 may be optionally arranged parallel to the main surface 140 on the substrate 130 or the chip surface. The same may also apply to the magnetic field components 120-1, 120-2 or their corresponding first and second directions. However, in the embodiment shown in FIG. 1, the first magnetic field component 120-1 and its first direction is perpendicular to the main surface 140 of the substrate 130 while the second magnetic field component 120-2 and its second direction is parallel oriented to the main surface 140. As a consequence, in the embodiment shown in FIG. 1, the first magnetic field component 120-1 is perpendicular to the second magnetic field component 120-2. This may also be implemented, when, for instance, one of the magnetic field components 120 is not oriented perpendicularly to the main surface 140 or even oriented parallel to the main surface 140. By configuring the magnetic field gradients 110 accordingly, it may be possible to determine an angle of the magnetic field more accurately than in different configurations.

A magnetic field may be split in three orthogonal components, for example, in orthogonal components Bx, By and Bz along a x-direction, a y-direction and a z-direction of an orthogonal Cartesian coordinate system, or, for example, along a radial component BR, a tangential component Bpsi and a z-component Bz along orthogonal directions of a cylindrical coordinate system. Mathematically, the components may be derived by determining the direct product of the vector indicative of the magnetic field and a unity vector along the corresponding direction.

Moreover, the gradient, for instance, along the x-direction may be obtained by differentiating the dependency with respect to x (e.g. dBx/dx and dBpsi/dx). To put it in more general terms, the gradient of a (physical) quantity T along the directions $\{nx, ny, nz\}$ are given by the inner product or direct product of the gradient of T (i.e. grad(T)=)={dT/dx, dT/dy,dT/dz}) and the directional vector $\{nx,ny,nz\}$ (i.e. nx*dT/dx+ny*dT/dy+nz*dT/dz), where the directional vector $\{nx,ny,nz\}$ is normalized to have a length 1. The gradient may be approximated by a difference. For instance, grad(T) along the x-direction may be approximated by dT/dx=(T(x+dx)−T(x))/dx. As a consequence, it may be possible to determine or approximate a gradient along a direction by detecting or measuring to values of the corresponding quantity at two locations separated from one another by a certain distance, and by dividing the difference of the two measured values by the distance.

In terms of magnetic field components, a gradient may also be determined based on the Maxwell equations. For instance, based on the Gauss's law for magnetism (absence of magnetic monopoles) dBx/dx+dBy/dy+dBz/dz=0, by measuring magnetic field gradients dBx/dx and dBy/dy along a substrate 130 with the main surface 140 arranged parallel to the x-y-plane, the gradient dBz/dz may be calculated. Therefore, it may be possible to measure the gradient perpendicular to the main surface 140 of the substrate 130.

Based on the further Maxwell equations, for instance, the Ampere's circuital law (magnetic B-field being curl-free) may allow to determine the gradients Bx and By perpendicular to the substrate 130 (along the z-direction) based on the equations dBx/dz=dBz/dx and dBy/dz=dBz/dy. As a consequence, a device or system may be capable of determining a gradient along a certain direction based on a more complex arrangement of two or more sensor elements 180.

Optionally, the discrete magnetic angle sensor device 100 according to an embodiment may further comprise a sensor circuit which may be, for instance, formed in or on the die of the magnetic angle sensor device 100 and configured to generate a sensor signal SS indicative of the angle of the magnetic field based on a first gradiometer signal GS1 of the first magnetic field gradiometer 110-1 and on a second gradiometer signal GS2 of the second magnetic field gradiometer 110-2. To facilitate this, the first gradiometer 110-1 may be configured to determine the gradient of a first magnetic field component of a magnetic field along the first direction and generate the first gradiometer signal GS1 indicative of the gradient accordingly. Similarly, the second gradiometer 110-2 may also be configured to determine the gradient of the second magnetic field component 120-2 of the magnetic field along the second direction and to generate the second gradiometer signal GS2 indicative of this gradient. To be able to receive the first and second gradiometer signals GS1, GS2, the sensor circuit 170 may be electrically coupled to the first and second magnetic field gradiometers 110-1, 110-2, respectively. An electrical coupling may be facilitated by directly connecting the respective components with one another or by indirectly coupling the respective components with one another, for instance, by connecting in between one or more further components, electrical elements or circuits.

As will be laid out in more detail below, by implementing the sensor circuit 170, the discrete magnetic angle sensor device 100 may be able to provide the sensor signal SS indicative of the rotation angle, of the angle of the magnetic field and/or of the angular position of the magnetic field source (e.g. comprising a magnet and/or a coil) more accurately, since by integrating the first and second magnetic field gradiometers 110-1, 110-2 into the discrete magnetic angle sensor device 100, an evaluation of the angle may be performed by the sensor circuit 170. In other words, a processing of the respective gradiometer signals GS1, GS2 may be performed inside the discrete magnetic angle sensor device 100 making an arrangement comprising such a discrete magnetic angle sensor device 100 more robust against mismatch of magnetic sensitivities of the gradiometers 110, misalignments and other mounting tolerances to name just a few examples. Due to using magnetic field gradiometers 110, the discrete magnetic angle sensor device 100 provides an output signal (sensor signal SS) which is robust against or independent of homogeneous interfering magnetic fields.

The sensor circuit 170 may be in such a case optionally configured to generate the sensor signal SS based on a combination of the first and second gradiometer signals GS1, GS2 such that a common dependency of the first and second gradiometer signals GS1, GS2 is cancelled out, such as a common gain factor, to name just one example. Such a common factor or—in more general terms—a common dependency, may be for instance the result of different magnetic sensitivities of the magnetic field gradiometers 110, which may create angle errors if these different magnetic sensitivities are not considered. However, by implementing the sensor circuit 170 such that such a common dependency is considered, different magnetic sensitivities in different discrete magnetic angle sensor devices 100 might not lead to an additional angle error in a system or arrangement comprising more than one discrete magnetic angle sensor device 100.

In other words, by implementing the sensor circuit 170, the gradiometer signals GS1, GS2 which may be based on different magnetic sensitivities, are processed inside the discrete magnetic angle sensor device 100. In other words, these sensitivities may be taken care of during a calibration process of the discrete magnetic angle sensor device 100, which can be carried out on a device-specific basis rather than a system-wide or arrangement-wide calibration when compared to an implementation in which a processing of the signals is not carried out inside the discrete devices 100.

The previously-mentioned combination of the first and second gradiometer signals GS1, GS2 may be based on an arctan-determination of a quotient of information comprised in the first and second gradiometer signals GS1, GS2. Such an arctan-determination may, for instance, be implemented based on look-up tables, a CORDIC algorithm (CORDIC=Coordinate Rotation Digital Computer) or a similar implementation.

The first and second gradiometer signals GS1, GS2 may, for instance, comprise a sine dependency or a sine-like dependency and a cosine dependency or a cosine-like dependency, respectively, versus a rotational position of the magnet or versus an azimuthal coordinate in a cylindrical reference frame concentric with the rotation axis or versus the angle of a magnetic field. Naturally, the same may also hold true vice-versa. A sine-like or cosine-like dependency on a physical quantity is a dependency with similar properties of a sine or a cosine dependency, respectively. However, deviations may, for instance, occur from an ideal sine or cosine dependency in terms of maximal values (amplitude), zero-crossings or the like with respect to each other and/or with respect to an ideal sine or cosine dependency. According to Fourier-series expansions, a sine-like or cosine-like dependence may be regarded as a sum of several sinusoidal terms, where the fundamental period is the basic sine or cosine, respectively, and all higher harmonics are deviations from this sine. These higher harmonics may have smaller amplitudes (typically ten times smaller) than the fundamental term and may be phase shifted against the fundamental term.

In other words, the discrete magnetic angle sensor device 100 is configured to generate the sensor signal SS based on the gradient of a first magnetic field component 120-1 with respect to the first gradiometer direction 150-1. Moreover, the discrete magnetic angle sensor device 100 may also be configured to generate the sensor signal SS based on the gradient of a second magnetic field component 120-2 with respect to the second gradiometer direction 150-2. However, in different embodiments, the second gradiometer direction 150-2 may be parallel or coincide with the first gradient direction 150-1. In such a case, the discrete magnetic angle sensor device 100 may be configured to generate the sensor signal SS based on the gradient of the second magnetic field component 120-2 with respect to the first gradiometer direction 150-1. In other words, the gradiometer directions 150-1, 150-2 may be identical, parallel or non-collinear depending on the concrete implementation of a discrete magnetic angle sensor device 100.

The gradiometer directions 150 may be parallel or non-collinear with respect to the direction of the corresponding magnetic field component 120 to which the respective magnetic field gradiometer 110 is sensitive. In other words, as shown in FIG. 1, the respective gradiometer directions 150 may be non-collinear with the magnetic field components 120 of the magnetic field gradients 110. To be even more precise, optionally, the magnetic field components 120 and the corresponding gradiometer direction 150 of the respective magnetic field gradiometer 110 may be perpendicular. However, in different embodiments of a discrete magnetic angle sensor device 100 the gradiometer direction 150 may be parallel or identical to a direction of a magnetic field component 120 of one or more magnetic field gradiometers 110.

Basically, the magnetic field gradiometers 110-1, 110-2 may be independently of one another implemented as gradiometers of arbitrary orders. For instance, a first order gradiometer is capable of providing information concerning a slope of a physical quantity along the respective gradiometer direction 150. A first order gradiometer therefore typically comprises at least two sensor elements capable of detecting the respective physical quantity at two different locations. In comparison, a second order gradiometer may also be able to provide information concerning a curvature along the respective gradiometer direction. Such a gradiometer typically comprises at least three corresponding sensor elements at three different locations. Higher order gradiometers may comprise additional sensor elements and, as a consequence, may be able to provide additional information on the spatial dependency of the respective physical quantity. For instance, a N-order gradiometer may comprise typically at least (N+1) sensor elements.

Although embodiments of a discrete magnetic angle sensor device 100 may utilize gradiometers independently of one another of any order, by implementing at least one of the first magnetic field gradiometer 110-1 and the second magnetic field gradiometer 110-2 as a first order gradiometer, implementational complexity and evaluation of the respective gradiometer signals GS1, GS2, respectively, may be simplified without sacrificing the achievable accuracy in determining the angle significantly. For instance, both, the first and second magnetic field gradiometers 110-1, 110-2 may be implemented as first order gradiometers.

Naturally, a discrete magnetic angle sensor device 100 may comprise further magnetic field sensor elements comprised in or associated with the first and/or the second gradiometer 110-1, 110-2. It may also comprise one or more additional gradiometers 110. Of course, the roles of the first and second gradiometers 110-1, 110-2 may be exchanged in other embodiments.

However, other discrete magnetic angle sensor devices 100 according to an embodiment may comprise exactly two gradiometers 110 or, to be more precise, the first magnetic field gradiometer 110-1 and the second magnetic field gradiometer 110-2. These gradiometers may, however, be implemented as first order gradiometers or fully or partially gradiometers of a higher order.

Optionally, in a discrete magnetic angle sensor device 100 according to an embodiment, the first magnetic field gradiometer 110-1 may comprise a first magnetic sensor element 180-1 and a second magnetic sensor element 180-2, which are of the same sensor type of a group of sensor types. Accordingly, the second magnetic field gradiometer 110-2 may comprise a third magnetic sensor element 180-3 and a fourth magnetic sensor element 180-4, which are of the same sensor type of the group of sensor types. The group of sensor types comprises a vertical Hall-sensor, a horizontal Hall-sensor, a giant magneto-impedance device (GMI), a magnetic field effect transistor (MAG-FET) and a magneto-resistive sensor element (xMR), such as an anisotropic magneto-resistance sensor element (AMR), a giant magneto-resistance sensor element (GMR), an extraordinary magneto-resistance sensor element (EMR) and a tunneling magneto-resistive sensor element (TMR). In other words, each of the gradiometers 110-1, 110-2 may comprise at least two sensor elements of the same sensor type. However, the sensor elements 180 of different gradiometers 110 may differ from one another. For instance, the first and second sensor elements 180-1, 180-2 may be implemented as lateral or horizontal Hall-sensor elements, while the third and fourth sensor element 180-3, 180-4 may be implemented as vertical Hall-sensor elements. A lateral Hall sensor or lateral Hall sensor element 180 is typically responsive to a magnetic field component perpendicular to a main surface 140 of the die or substrate 130. By choosing the appropriate sensor elements, it may be possible to configure the discrete magnetic angle sensor device 100 such that it may be designed to be sensitive to specific magnetic field components 120. In some cases it may also be favorable if several gradiometers share common elements, for instance, if two sensor elements are arranged along a first direction to constitute the first gradiometer 110-1 and two sensor elements of the same type are arranged in a second perpendicular direction to constitute the second gradiometer 110-2 one may arrange the sensor elements 180 in the ends and a corner of an L-shape, whereby in the corner two sensor elements would result, and they could be replaced by a single one that is part of both gradiometers 110. Optionally, the first or second gradiometers 110 may comprise at least one sensor element 180 responsive or sensitive to an in-plane magnetic field component 120 with respect to the main surface 140 of the substrate 130.

The first and second magnetic sensor elements 180-1, 180-2 may be optionally arranged along the first gradiometer direction 150-1. Accordingly, the third and fourth magnetic sensor elements 180-3, 180-4 may be arranged along the first gradiometer direction 150-1 or along the second gradiometer direction depending on whether the first and second gradiometer directions 150-1, 150-2 are parallel or identical or non-collinear. However, to simplify the description of embodiments, sometimes the second gradiometer direction 150-2 also may be parallel or identical to the first gradiometer direction 150-1.

In the embodiment shown in FIG. 1, the third and fourth magnetic sensor elements 180-3, 180-4 are arranged along the second gradiometer direction 150-2 perpendicular to the first gradiometer direction 150-1.

It should be noted that the first and second gradiometers 110 may share one or more sensor elements 180.

Figure 2:
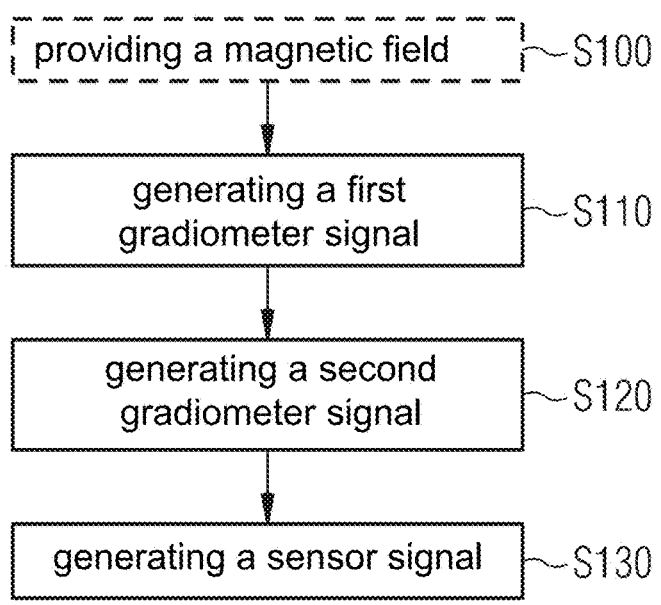
FIG. 2 shows a flowchart of a method for providing a sensor signal according to an embodiment.

FIG. 2 shows a flowchart of a method for providing a sensor signal SS according to an embodiment. After optionally providing a magnetic field in a sub-process S100, the method for providing the sensor signal SS comprises in a sub-process S110 generating the first gradiometer signal GS1 indicative of the gradient of the first magnetic field component 120-1 of the magnetic field with respect to the first gradiometer direction 150-1 using the first gradiometer 110-1. The method further comprises in a sub-process 120 generating the second gradiometer signal GS2 indicative of the gradient of the second magnetic field component 120-2 of the magnetic field different from the first magnetic field component 120-1 with respect to the first gradiometer direction 150-1 or with respect to the second gradiometer direction 150-2 different from the first gradiometer direction 150-1 using the second gradiometer 110-2 depending on the implementation of the gradiometers 110-1, 110-2. The first and second gradiometers 110-1, 110-2 are comprised in a discrete magnetic angle sensor device 100.

The method further comprises in a sub-process S130 generating the sensor signal SS indicative of the angle of the magnetic field based on the first and second gradiometer signals GS1, GS2.

However, although the flowchart of FIG. 2 shows a sequence of the sub-processes S100, S110, S120 and S130, the individual sub-processes may be carried out simultaneously, timely overlapping or in a different order than depicted in FIG. 2. For instance, generating the first and second gradiometer signals GS1, GS2 in the sub-processes S110 and S120, respectively, may be carried out simultaneously or quasi-simultaneously. However, since generating the sensor signal SS in sub-process S130, is based on the first and second gradiometer signals GS1, GS2, it may be advisable, however, not under all circumstances necessary, to carry out sub-process S130 after sub-processes S110 and S120.

Figure 3:
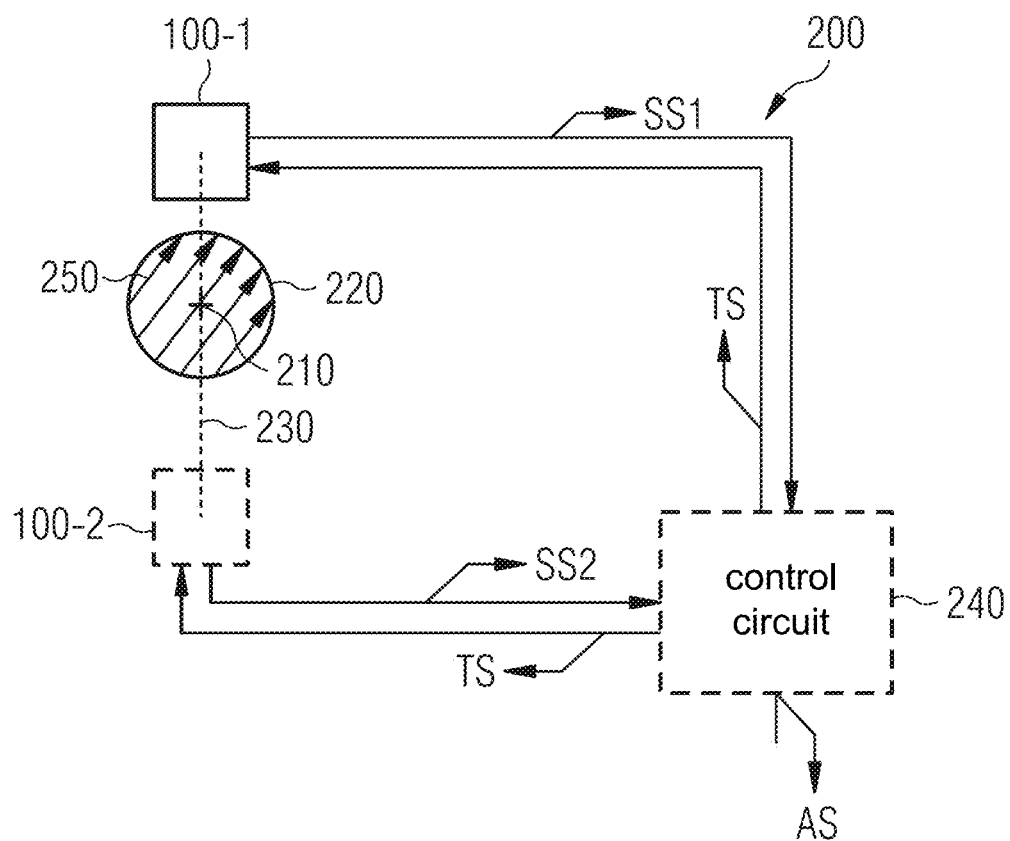
FIG. 3 shows a schematic diagram of a magnetic angle sensor arrangement according to an embodiment in an off-axis configuration.

FIG. 3 shows a schematic diagram of a magnetic angle sensor arrangement 200 according to an embodiment. The magnetic angle sensor arrangement 200 comprises at least one discrete magnetic angle sensor device 100 according to an embodiment as outlined before. In other words, the discrete magnetic angle sensor device 100 comprises a first magnetic field gradiometer 110-1, sensitive to a gradient of a first magnetic field component 120-1 of a magnetic field, a second magnetic field gradiometer 110-2 sensitive to a gradient of a second magnetic field component 120-2 of the magnetic field different from the first magnetic field component 120-1, and a sensor circuit 170 configured to generate a sensor signal indicative of an angle of the magnetic field based on a first gradiometer signal GS1 of a first magnetic field gradiometer 110-1 and on a second gradiometer signal GS2 of the second magnetic field gradiometer 110-2.

The at least one discrete magnetic angle sensor device 100 is fixedly arranged with respect to a rotation axis 210 around which a magnet 220 is rotatably mountable such that the at least one discrete magnetic angle sensor device 100 is arranged off-axis with respect to the rotation axis 210. In other words, the at least one discrete magnetic angle sensor device 100 is radially displaced with respect to the magnet 200 when mounted.

As outlined before, a discrete magnetic angle sensor device 100 may, for instance, be used in an off-axis configuration of the discrete magnetic angle sensor device 100 with respect to the magnet 200. Due to the implementation of the first and second gradiometers 110-1, 110-2, different magnetic field components 120-1, 120-2 may improve an accuracy of an angle determination in such an off-axis configuration. However, as outlined before, discrete magnetic angle sensor devices 100 may also be used in different applications, such as an on-axis configuration, in which the discrete magnetic angle sensor device according to an embodiment is aligned along the rotation axis 210.

Optionally, the magnetic angle sensor arrangement according to an embodiment may comprise more than one discrete magnetic angle sensor devices 100. In other words, it may comprise a plurality of discrete magnetic angle sensor devices 100 arranged according to a predefined pattern around the rotation axis 210. In the schematic diagram of FIG. 3, the magnetic angle sensor arrangement 200 comprises a first discrete magnetic angle sensor device 100-1 and a second discrete magnetic angle sensor device 100-2.

To be even more precise, in the embodiment shown in FIG. 3, the magnetic angle sensor arrangement 200 according to an embodiment comprises two discrete magnetic sensor devices 100 which are diametrically arranged at an angle of 180° with respect to each other around the rotation axis 210 such that—under ideal conditions—a connecting line 230 connecting a common central point of the first and second gradiometers 110-1, 110-2 of the discrete magnetic angle sensor devices 100 with one another intersects the rotation axis 210. Using this predefined pattern may be able to compensate at least partially an eccentricity of the magnet 220 with respect to its rotation axis 210. In other words, this configuration may further improve an accuracy of the angle determination.

To put it in more general terms, whenever a plurality of discrete magnetic angle sensor devices 100 is implemented, optionally, the discrete magnetic angle sensor devices 100 may be arranged equidistantly around the rotation axis 210 in terms of an angle around or perpendicular to the rotation axis 210. FIG. 3 shows this arrangement in the case of two discrete magnetic angle sensor devices 100. By arranging the discrete magnetic angle sensor devices 100 equidistantly around the rotation axis 210, it may be possible to improve an accuracy of an angle determined by the magnetic angle sensor arrangement 200 to compensate an eccentric mounting of the magnet 220 with respect to the rotation axis 210. In other words, when the magnetic angle sensor arrangement 200 comprises n discrete magnetic angle sensor devices 110-1, . . . , 110-n, it may be advisable to arrange the discrete magnetic angle sensor devices 100 such that two neighboring discrete magnetic angle sensor devices 100 comprise an angle between them of 360°/n. In yet other words, an equidistant or regular azimuthal arrangement may be advisable. Or to put it in yet other words, optionally, the arrangement 200 may comprise a n-fold rotational symmetry with respect to the rotation axis 210 with n being an integer.

Optionally, the discrete magnetic angle sensor devices 100 may further be arranged at an essentially constant radial distance from and around the rotation axis 210, around which the magnet is rotatable when mounted. The radial arrangement of the discrete magnetic angle sensor devices 100 with respect to the rotation axis 210 as shown, for instance, in FIG. 3, may also beneficially influence an accuracy of the angle determination. Due to the same radial distance from the rotation axis 210 in the case of an ideally-mounted magnet 220 all the discrete magnetic angle sensor devices 100 will be subjected to the same gradient of the magnetic field with respect to the first and second magnetic field components 120-1, 120-2 when the magnetic 220 rotates around the rotation axis 210. As a consequence, the discrete magnetic angle sensor devices 100 may sense the same or a similar amplitude of the gradient of the magnetic field components 120. As a consequence, similar signal strengths may be achievable by all the discrete magnetic angle sensor devices 100. A ratio of the amplitudes of the sinusoidal gradiometer signals GS in a sensor package may depend on a radial position. It may be advisable to arrange the sensor devices 100 such that the ratios of all satellites (devices 100) may be identical or similar. This may result in a more accurate average or similar determination of an over-all angle, as will be laid out in more detail below, since it may be possible to more evenly cancel out error when calculating an angle signal AS indicative of the angle.

The magnetic angle sensor arrangement according to an embodiment may additionally or alternatively comprise a control circuit 240, which is configured to receive the sensor signals SS1, SS2 from the plurality of discrete magnetic angle sensor devices 100. It is further configured to generate an angle signal AS indicative of the angle of the magnetic field provided or generated by the magnet 220 based on the sensor signals SS1, SS2, received from the plurality of discrete magnetic angle sensor devices 100.

To enable this, the control circuit 240 may be coupled to the discrete magnetic angle sensor devices 100 in such a way that the control circuit 240 is capable of receiving an information-comprising signal from the discrete magnetic angle sensor devices 100. This may be fully or partially comprised transmitting the respective signals, such as the sensor signals SS1, SS2, electrically, optically, inductively or by a radio-based transmission. Once again, coupling the discrete magnetic angle sensor devices 100 with the control circuit 240 directly or indirectly via one or more additional components or circuits can be effected. Such additional components or circuits may, for instance, comprise a receiver, a transmitter, an amplifier or a signal-influencing circuit. Naturally, although FIG. 3 shows the control circuit 240 using a point-to-point contact, also other communication networks such as a data bus or a daisy-chain configuration may be used to send, receive or interchange signal, to name just a few examples.

To illustrate this, the gradiometer signals GS1 and GS2 may be considered to be two independent coordinates. A pair of values (GS1, GS2) may be associated to a point in a GS1-GS2-plane. A position of this point, its distance from the origin of the GS1/GS2-coordinate axes, as well as an angle with respect to a reference direction (e.g. GS1-axis) may be determined. The distance may be of no or lesser importance compared to the angle of the point, which may be transmitted to the controller circuit 240. However, this may be more complex, since it may comprise determining the arctan of the ratio. Transmitting the ratio of the two values GS1 and GS2 may be more feasible. However, this may be more problematic, when the denominator becomes (approximately) zero. Moreover, information might be lost, since, for instance, by mirroring the point (GS1, GS2) with respect to both coordinate axes leading to point (−GS1, −GS2) still leads to the same ratio, since the sign cancels out. However, it may be possible to transmit a quotient of the minimum of the absolute values of GS1 and GS2 divided by the maximum of the absolute values of GS1 and GS2 (min(abs(GS1),abs(GS2))/max (abs(GS1),abs(GS2))). In a two-dimensional plane only 8 different points per radius value from the origin exist with the same value indicated above. Hence, it may be sufficient to additionally transmit a piece of information concerning the 45°-spanning sub-quadrant comprising the respective (GS1,GS2)-point. For that, only three additional bits may be necessary.

The sensor signals SS1, SS2 of the discrete magnetic angle sensor devices 100 may comprise information on a ratio of values comprised in the first and second gradiometer signals GS1, GS2 and on a quadrant of the angle of the magnetic field and on a quadrant or sub-quadrant of these gradiometer signals GS. However, in other embodiments it may be sufficient to use information on a sign of the values comprised in both gradiometer signals GS1 and GS2 of a single or some sensor devices 100. However, when, for instance, the sign-related information may be distorted by an offset error or other influences, for instance, during or in the vicinity of a zero-crossing, it may be advisable to obtain and use information on the sign of at least a further sensor device 100.

If the system is to be robust against a random failure of any sensor device 100, it may be advisable to implement more than one satellite providing sign-related information. However, when, for instance, an angle range to be detected is sufficiently small, it may be possible to implement the arrangement without using sign-related information.

By implementing the discrete magnetic angle sensor devices 100, accordingly, it may be eventually possible not to implement the angle determination, for instance, not to implement the look-up table for the arctan-computation or the previously-mentioned CORDIC algorithm. In such a case, the discrete magnetic angle sensor devices 100, which are also referred to as satellites will only provide the ratios of a gradiometer signal along with the respective information on the quadrant or sub-quadrant of the angle of the magnetic field while the master or control circuit 240 combines these signals, for instance, using a linear combination, wherein the coefficients of this linear combination may be functions of the information regarding the quadrant or sub-quadrant of the angle. Afterwards, the control circuit 240 may implement the arctan-function or an equivalent look-up table as outlined before, to generate the angle signal AS.

Instead or additionally implementing the control circuit 240, it may also be possible to implement at least one of the discrete magnetic angle sensor devices 100 in such a way that this at least one discrete magnetic angle sensor device 100 is configured to receive the sensor signals SS from the other discrete magnetic angle sensor devices of the plurality of discrete magnetic angle sensor devices 100. This at least one discrete magnetic angle sensor device may then also be configured to generate the angle signal AS indicative of the angle of the magnetic field of the magnet 220 based on the sensor signals SS received from the other discrete magnetic angle sensor devices 100 and based on the sensor signal and based on its own determined gradients of the first and second magnetic field components 120-1, 120-2. This may, for instance, be based on the first and second gradiometer signals GS1, GS2, or the sensor signal SS of said discrete magnetic angle sensor device 100.

While implementing a separate control circuit 240 may eventually provide the opportunity of simplifying the individual discrete magnetic angle sensor devices 100 according to an embodiment, using at least one discrete magnetic angle sensor device 100 capable of performing the previously-described generation of the angle signal AS based on the sensor signals of the other discrete magnetic angle sensor devices 100 may reduce a number of electrical connections and simplify wiring of the magnetic angle sensor arrangement 200. Hence, depending on the circumstances and boundary conditions, it may or may not be advisable to implement a separate control circuit 240. Or to put it in other words, the control circuit 240 may be comprised in one or more of the discrete magnetic angle sensor devices 100.

Optionally, the control circuit 240 or at least one of the discrete magnetic angle sensor devices 100 depending on the implementation chosen, may further be configured to generate a triggering signal TS. The discrete magnetic angle sensor devices of a plurality of discrete magnetic angle sensor devices may further be configured to generate their respective sensor signals SS indicative of synchronous measurements by the discrete magnetic angle sensor devices 100 based on the trigger signal TS. However, the individual sensor signals SS may be transmitted sequentially and asynchronously. The triggering signal TS causes the devices 100 (satellites) to start, carry out or to provide synchronous measurements of the devices 100. This may further improve an accuracy of the angle determination since by providing sensor signals indicative of synchronous measurements errors or inaccuracies due to deviations in terms of points of time, when the measurements are taken, may be reduced.

In other words, in this case, one of the discrete magnetic angle sensor devices 100 will be the master controlling the other discrete magnetic angle sensor devices 100, which are then considered the slaves or satellites.

The discrete magnetic angle sensor devices 100 may be configured to generate their respective sensor signals SS periodically, intermittently or, for instance, when a predefined condition is fulfilled. Any parameter or the condition may eventually be programmable or changeable.

In the embodiment shown in FIG. 3, the control circuit 240 is furthermore coupled to the discrete magnetic angle sensor devices 100 to provide the triggering signal TS to the respective discrete magnetic angle sensor devices 100. Upon receiving the triggering signals TS, the discrete magnetic angle sensor devices 100 may perform the respective determination of the gradients of the first and second magnetic field components 120-1, 120-2 by, for instance, sampling the respective gradiometer signals GS1, GS2 or by another similar technical implementation. After receiving the triggering signal TS, the sensor signals SS corresponding to the previously-mentioned synchronous measurements may then be transmitted to the control circuit 240 or the discrete magnetic angle sensor device 100 operating as the master. However, the measurements may be made in the past, for instance, 10 μs or 50 μs before. In yet other words, the triggering signal TS may provide the opportunity of making the satellites (the discrete magnetic angle sensor devices 100) to carry out the measurements preferably at the same moment of time. Under ideal circumstances, the triggering signal TS starts the data acquisition in all or at least some of the devices 100. However, this may be difficult to achieve, since the devices 100 may operate asynchronously, unless they may be provided with a common clock signal. Each data acquisition may take a period of time. Depending on the moment with respect to the period for the data acquisition, the sensor 100 may provide the previously determined value, the present value or any combination of these and optionally of earlier data. Such a combination may comprise an interpolation or an extrapolation to a point of time being identical to the time the trigger signal TS is received or shifted by a defined timespan against this time.

Depending on the implementation, the control circuit 240 or the discrete magnetic angle sensor device 100 acting as the master may be configured to generate the angle signal AS taking the predefined pattern of the discrete magnetic angle sensor devices 100 into account. This may be, for instance, done based on averaging the angles comprised in the sensor signals of the discrete magnetic angle sensor devices 100 after subtracting the positions of the discrete magnetic angle sensor devices from the angles comprised in the sensor signals according to the predefined patter. In other words, the angle signal AS may be indicative of an angle which is given by an average of a difference between an angle $\psi i$, of which the respective sensor signal of the i-th discrete magnetic angle sensor device 100-$i$ is indicative of, and an angle position $\psi i0$, under which the respective discrete magnetic angle sensor device 100-$i$ is arranged with respect, for instance, to a reference direction. The averaging may be done, for instance, based on an arithmetic averaging, a weighted arithmetic averaging or another plain or weighted averaging algorithm.

However, in this context, it is important to note that the previously-described averaging and subtracting do not have to be implemented as indicated above. It is merely sufficient that the control circuit 240 or the discrete magnetic angle sensor device 100 acting as the master is capable of performing a calculation or determination based on this or a similar equation this optional feature is implemented. For instance, the averaging may comprise manipulating analog voltages or currents manipulating digital values simply indicative of the respective angles. For instance, these calculations may be carried out using a linear combination or another more easily implemented function based on the respective sensor signals themselves, without calculating the explicit angles of which the sensor signals are indicative.

However, in other embodiments, the previously-described averaging may, for instance, be carried out in terms of the actual angle values.

Optionally, the discrete magnetic angle sensor devices 100 may be configured to generate the sensor signal based on the gradient of the first magnetic field component 120-1 with respect to a first gradiometer direction 150-1 of a discrete magnetic angle sensor device 100. The discrete magnetic angle sensor devices 100 may further be configured to generate the sensor signal based on the gradient of the second magnetic field component 120-2 with respect to the first gradiometer direction 150-1 of the discrete magnetic angle sensor device 100 or with respect to a second gradiometer direction 150-2 of the discrete magnetic angle sensor device different from the first gradiometer direction 150-1. The discrete magnetic angle sensor devices 100 may in such a case be arranged such that all first magnetic field components 120-1 are of the same type of magnetic field components and all second magnetic field components 120-2 are also of the same type of magnetic field component. The group of magnetic field components comprises an axial component with respect to the rotation axis 210 and a position of a respective discrete magnetic angle sensor device 100, a radial component with respect to the rotation axis 210 and the position of the respective discrete magnetic angle sensor device 100, and a tangential component with respect to the rotation axis 210 and the position of the respective discrete magnetic angle sensor device 100. Moreover, all first gradiometer directions 150-1 may be of a same type of direction and all second gradiometer directions 150-2 may also be of a same type of direction. Similar to the group of magnetic field components, the group of types of directions comprises an axial direction with respect to the rotation axis 210 and the position of the respective discrete magnetic angle sensor device 100, a radial direction with respect to the rotation axis 210 and the position of the respective discrete magnetic angle sensor device 100, and a tangential direction with respect to the rotation axis 210 and the position of the respective discrete magnetic angle sensor device 100. Hence, all first types of gradiometers 110 may be sensitive to the same cylindrical components of the magnetic field (either radial, azimuthal, or axial) and the gradients of all gradiometers 110 may be along the same cylindrical directions (either radial, azimuthal, or axial), whereby the circular cylindrical reference frame is concentric to the rotation axis.

The magnetic angle sensor arrangement 200 may optionally comprise the rotatably mounted magnet 220. The magnet 220 may comprise an essentially diametrical magnetization 250 oriented such that the magnetization 250 is essentially oriented perpendicularly to the rotation axis 210. Optionally, it may further be advisable for the magnet 220 to comprise along with optional ferromagnetic parts in its vicinity an essentially rotational symmetrical shape, as will be outlined below in more detail.

In other words, the magnet 220 as shown in FIG. 3 does not comprise a radial magnetization, but a magnetization which is essentially oriented perpendicular to the rotation axis 210 being essentially constant in terms of its direction throughout the whole magnet 220. Such a magnet 220 may be especially beneficial for using in an off-axis configuration as shown in FIG. 3.

The first gradiometer 110-1 of the discrete magnetic angle sensor devices 100 may comprise a first lateral Hall sensor element and a second lateral Hall sensor element as the first and second magnetic sensor elements 180-1, 180-2, respectively. Accordingly, the second gradiometer 110-2 may comprise a first vertical Hall sensor element and a second vertical Hall sensor element as the third and fourth magnetic sensor elements 130-3, 130-4, respectively. In this case, the at least one discrete magnetic angle sensor device 100 may be arranged such that an amplitude of the gradient of the first magnetic field component 120-1 is smaller than an amplitude of the gradient of the second magnetic field component 120-2 with respect to a maximum specified rotation angle range of the magnet 220. The maximum specified rotation angle range may, for instance, comprise a full rotation (i.e. 360°), for instance for an application in which the magnet 220 can rotate freely around the rotation axis 210, or it may be an angle range smaller than 360°, for instance for applications in which the angle is to be determined only with respect to a smaller maximum specified rotation angle range. Examples may, for instance, come from the field of windscreen wipers in the field of automotive applications.

In other words, the discrete magnetic angle sensor devices 100 may be arranged with respect to the magnet 220 such that the magnetic field gradient having the larger amplitude will be monitored or detected by the vertical Hall sensor elements, while the lateral Hall sensor elements are arranged such that these sensor elements detect the weaker gradient. Only in very rare cases, both orthogonal gradients along the first and second directions (first magnetic field component 120-1 and second magnetic field component 120-2) are essentially equally strong. In other words, in most applications, always one gradient is significantly stronger than the other one. In such a case, it may be advisable to use the Hall sensor elements having a lower off-set error—in other words, the lateral Hall sensor elements—for the weaker gradient and the Hall elements with the larger off-set error—in other words, the vertical Hall sensor elements—for the stronger gradients to improve the overall accuracy compared to the opposite arrangement. Naturally, this may also be true for other sensor elements 180. Generally speaking, it may be advisable to use sensor elements 180 with a higher accuracy for a gradiometer 110 having the lower amplitude of the two gradiometers 110. The accuracy of a sensor element may be predominantly influenced by a hysteresis, an off-set error, a gain error, noise or crosstalk. The amplitudes of the gradiometer signals GS1, GS2 may be the amplitude values of the sine- or cosine-like gradients of the magnetic field component(s) in question.

An embodiment of an arrangement 200 may comprise more than one device 100. It may, for instance, comprise N discrete magnetic sensor devices 100 with N being an integer larger than 1. The devices 100 may be arranged at a constant radial distance with respect to the rotation axis 210 having angle differences of 360°/N between neighboring devices 100. The devices 100 may be attached or arranged on a stator, where a diametrically magnetized magnet 220 may be mounted rotatably against the stator. The magnet 220 may comprise a geometry with a M-fold rotational symmetry with respect to the rotation axis 210, where M is an integer, which may be larger than or equal to N. The rotor may be pivotable with respect to the stator. The arrangement may be configured to generate the angle signal AS and/or to determine an angle of the magnet 220 relative to the stator by combining the sensor signals SS of the discrete magnetic sensor devices 100. An object may comprise an M-fold rotational symmetry, when an axis exists such that the object may be mapped in a mathematical sense by rotating same around the axis by 360°/M. The axis may coincide with the rotation axis 210. Naturally, the magnet may comprise exactly one part, but also more than one part.

Figure 4:
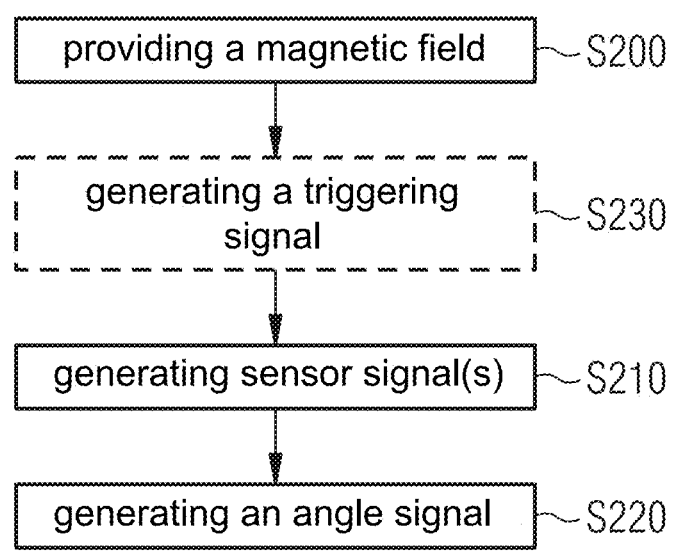
FIG. 4 shows a flowchart of a method for generating an angle signal according to an embodiment.

FIG. 4 shows a flowchart of a method for generating an angle signal AS. The method comprises in a sub-process S200 providing a magnetic field. In a sub-process S210, the method comprises generating a plurality of sensor signals SS, each sensor signal SS being generated by an individual discrete magnetic angle sensor device according to an embodiment. Accordingly, the sensor signals SS are indicative of an angle of the magnetic field at a position of the discrete magnetic angle sensor device 100 based on the gradient of the first magnetic field component 120-1 of the magnetic field with respect to the first gradiometer direction 150-1. It is further based on the gradient of the second magnetic field component 120-2 of the magnetic field different from the first magnetic field component 120-1 with respect to the first gradiometer direction 150-1 or the second gradiometer direction 150-2 different from the first gradiometer 150-1 depending on the design and implementation of the respective discrete magnetic angle sensor devices 100. In a further sub-process S220, the method further comprises generating the angle signal AS indicative of the angle of the magnetic field based on the plurality of sensor signals SS.

As indicated above and outlined in more detail below, by employing a plurality of discrete magnetic angle sensor devices 100 it may be possible to increase an accuracy of the angle determination. This may, for instance, be beneficial in the case of an off-axis configuration. For instance, providing the magnetic field may optionally comprise providing the magnetic field by a rotatably mounted magnet 220, wherein the magnet 220 comprises an essentially diametrical magnetization 250 oriented such that the magnetization is essentially oriented perpendicular to a rotation axis 210, around which the magnet 220 is rotatable. In such a case, it may be advisable to implement the magnet 220 along with ferromagnetic parts in its closer vicinity to be essentially rotationally symmetric or having at least M-fold symmetry with M being an integer larger than 1.

As outlined before, the method may optionally also or alternatively comprise in a sub-process S230 generating a triggering signal TS. In such a case it may be advisable that generating the plurality of sensor signals SS in sub-process S210 comprising generating each sensor signal SS indicative of a synchronous measurement based on the triggering signal. As a consequence, it may once again be possible to increase an accuracy of the angle determination.

However, generating and using the triggering signal TS is optional. The sensor devices 100 may periodically generate the sensor signals SS indicative of their most recent measurements or at least based on the most recent measurements. The sensor signals SS may comprise a time index, and the controller circuit 240 or the device 100 acting as the master may use the data based on the time indices, for instance, to extrapolate or interpolate the data.

Naturally, also the sub-processes described in the context of FIG. 4 are not required to be executed in the order as indicated by FIG. 4. The individual sub-processes may be executed simultaneously, timely overlapping, in a different order or any combination thereof.

In the following, further embodiments will be described in more detail focusing on both the theoretical background but also on technical details. For instance, in many of the following embodiments, vertical Hall sensor elements, which are also referred to as vertical Hall elements or vertical Hall sensors, and lateral Hall sensor elements, which are also referred to as horizontal or lateral Hall sensors or Hall plates, will be described. However, these magnetic sensor elements may, for instance, be exchanged or supplemented by other types of magnetic sensor elements 180 such as the previously mentioned magneto-resistive sensor elements (xMR) or giant magneto-impedance sensor elements (GMI). Therefore, whenever a Hall sensor element is described, it may be possible to replace this Hall sensor element by another type of magnetic sensor element 180 as described and mentioned before. The same may also apply to other components such as the sensor circuit 170, which may, for instance, be implemented by a processor or another circuit. Therefore, it is to be noted that the specific details of the following embodiments may equally well be implemented differently.

FIG. 5 shows a schematic representation of a magnetic angle sensor arrangement 200 according to an embodiment. As outlined earlier, embodiments relate to magnetic angle sensors 100, which may also be referred to as a two-dimensional gradient sensor, and arrangements as, for instance, shown in FIG. 5. A magnet 220 is mounted, for instance, on a through-shaft 260 and sensor elements 180 arranged as gradiometers 110 are placed aside or off a rotation axis 210. The gradiometers 110 are arranged on or inside a substrate 130 of the magnetic angle sensors 100, which may be implemented as a silicon die. For the sake of simplicity, the rotation axis 210 is identical to a z-axis of a corresponding coordinate system.

Such systems may be used when the end of the shaft 210 is not available for attachment of the magnet 220 or when there is no space available to place the sensor 100 on the axis 210 of rotation. FIG. 5 shows the sensor die 130 arranged perpendicular to the rotation axis 210 or, in other words, with an orthogonal orientation of sensor die 130. In other words, FIG. 5 shows an off-axis angle sensor 100 with through-shaft magnet 220. The magnet 220 comprises a diametrical magnetization 250, which is oriented in a plane perpendicular to the z-axis. In the situation shown in FIG. 5, the magnetization 250 is oriented along a y-axis, which along with a x-axis and the z-axis forms a orthogonal coordinate system.

FIG. 6 shows a schematic representation of a further magnetic angle sensor arrangement 200 according to an embodiment, in which the sensor die 130 is aligned parallel to the rotation axis 210. A main surface 140 of the silicon die 130 is, hence, arranged parallel to the rotation axis 210 (axial orientation of sensor die 130), while in the arrangement 200 shown in FIG. 5, the main surface 140 of the silicon die 130 was arranged orthogonally to the rotation axis 210. The arrangement 20 of FIG. 6 comprises an off-axis angle sensor 100 according to an embodiment with diametrically magnetized through-shaft magnet 220.

In principle, there are infinitely many such axial orientations of the sensor die 130. One edge of the sensor die 130 may be kept parallel to the rotation axis 210 and the die 130 may be turned around this edge. In particular, two such directions comprise the cases of the main surface 140 of the die 130 being arranged tangential to a cylindrical surface, where the axis of the cylinder coincides with the rotation axis 210, and the main surface 140 of the die 130 being arranged perpendicular to this cylindrical surface.

Figure 7:
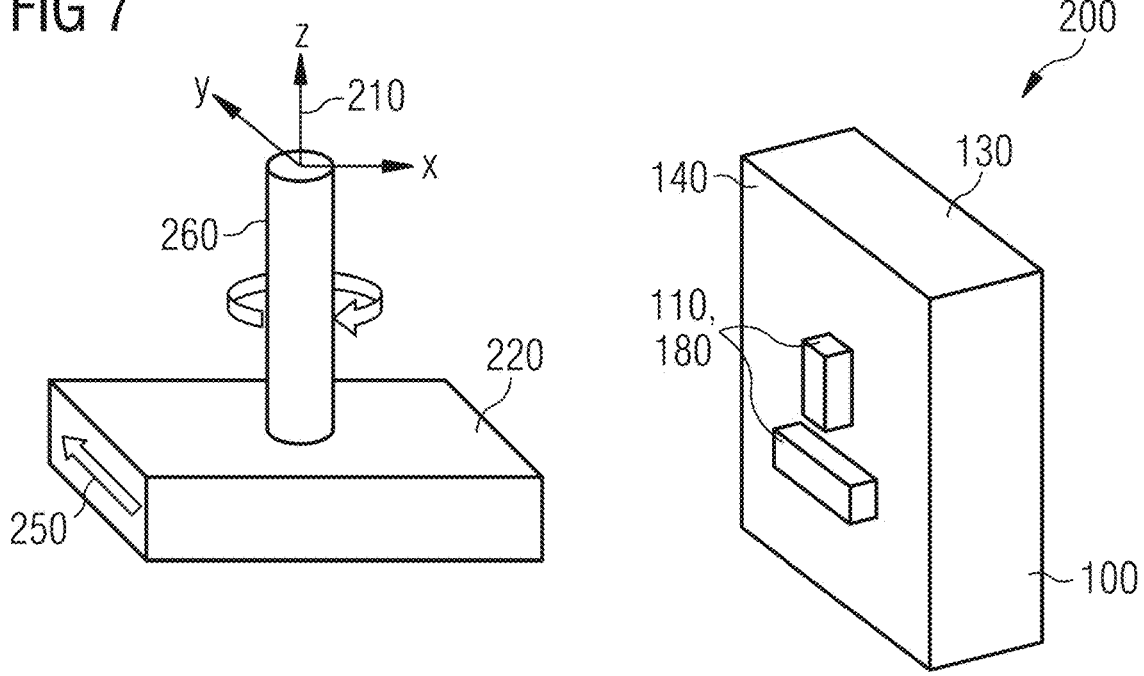
FIG. 7 shows a schematic representation of a magnetic angle sensor arrangement according to an embodiment in an off-axis configuration.

Naturally, the magnet 220 may also be mounted on the end of the shaft 260 as shown in FIG. 7. The orientation and the number of the sensors 100 may be chosen independently. FIG. 7, hence, shows an embodiment of an off-axis angle sensor 100 with a diametrically magnetized end-of-shaft magnet 220. The sensor die 130 is axial oriented with respect to the rotation axis 210.

Embodiments may offer the possibility of increasing a robustness against external magnetic disturbances. The sensor 100 may be configured to estimate the rotation angle of the magnet 220 independent of superimposed homogeneous magnetic fields in any direction up to a limiting magnetic field strength. Depending on the magnetic sensor elements 180 used, the limiting magnetic field strength may be about 100 mT. In other cases, it may be higher or lower. Conventional sensor may be more sensitive to external magnetic disturbances.

Figure 8:
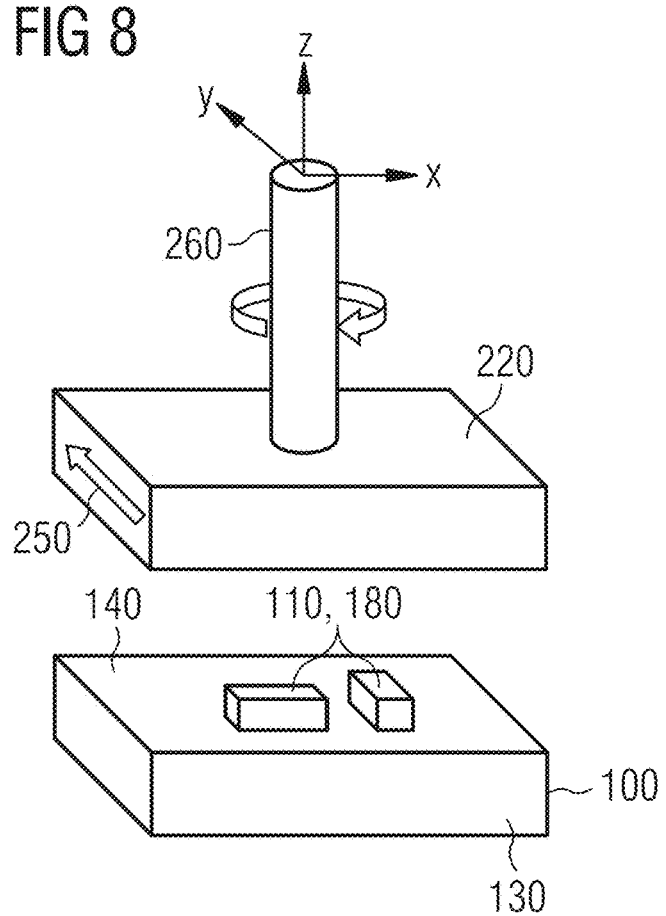
FIG. 8 shows a schematic representation of a magnetic angle sensor arrangement comprising a discrete magnetic angle sensor device according to an embodiment in an on-axis configuration.

FIG. 8 shows a schematic representation of a magnetic angle sensor arrangement comprising a discrete magnetic angle sensor device 100 or sensor 100 according to an embodiment in an on-axis configuration. Here, the main surface 140 of the sensor die 130 is essentially perpendicular arranged to the rotation axis 210. The arrangement comprises an on-axis angle sensor 100 with a diametrically magnetized end-of-shaft magnet 220.

To outline the operation of embodiments more closely, in the following a magnet 220 will be assumed, which is mirror symmetric to the plane z=0. Therefore, the z-axis coincides with the rotation axis 210 as shown before. Of course in many real-world implementations this is true only in an approximate sense, because many magnets 220 may have mounting tolerances and comprise slight asymmetries of the geometry.

The magnet 220 is diametrically magnetized. Without loss of generality, we assume that it is magnetized in the y-direction as shown above. The magnetization 250 may be homogeneous, although in reality there may be often some small inhomogeneity present. Therefore, it will be assumed that the magnet 220 comprises at least a significant dipole moment in the y-direction and all relevant higher multi-pole moments are small compared to the dipole moment. The number of embodiments, magnet arrangements and configurations is, nevertheless, vast.

The dipole moment is typically equivalent to the volume average of the magnetization 250. It is often the most important magnetic contribution to the magnetic field. However, if the magnet has a shape that differs from a homogeneously magnetized sphere, the magnetic field can be decomposed into dipole and higher multi-pole contributions. Typically, the magnets for angle sensors have the shape of tablets (short cylinders), flat parallel epipeds or general blocks. Consequently, these magnets 220 typically comprise a dipole moment and higher multi-pole moments.

It might be advisable that the dipole moment is present and dominates all other moments. Higher multi-pole moments may have partly beneficial and partly deteriorating effects on the angle measurement. It is explained in the references "Inaccuracies of Anisotropic Magneto-Resistance Angle Sensors due to Assembly Tolerances" (U. Ausserlechner, Progr. Electromagn. Research B, vol. 40, pp. 79-99 (2012)), "Inaccuracies of Giant Magneto-Resistive Angle Sensors Due to Assembly Tolerances" (U. Ausserlechner, IEEE Trans. Magn., May 2009, vol. 45, no. 5, pp. 2165-2174), and "The Optimum Layout for Giant Magneto-Resistive Angle Sensors" (U. Ausserlechner, IEEE Sens. J., vol. 10, no. 10, pp. 1571-1582 (2010)), which are incorporated by reference, how the higher multi-pole moments affect the accuracy of the angle sensor. The origin of higher multi-pole moments may be due to the magnet geometry and an inhomogeneous magnetization 250. The origin of inhomogeneous magnetization may be mainly attributed to the finite coercivity of the magnet 220 and/or an insufficiently large magnetization pulses.

By "relevant higher multi-pole moments" those are meant, which lead to magnetic field components that affect the magnetic field sensor elements in the angle sensor. For instance, if the sensor elements 180 are Hall plates then they may be affected only by magnetic field components perpendicular to the sensor die 130, as long as the other components are below a critical value of, for instance, about 100 mT. On the other hand magneto-resistive (MR) devices are typically not affected by out-of-plane magnetic field components 120 as long as they are below another critical value of, for instance, about 500 mT. These may be considered irrelevant.

In an ideal case the magnets 220 should have a shape of rotational symmetry. Yet it will become clear that deviations from this ideal symmetry may be allowable at the costs of accuracy in the angle estimation by the sensor 100.

An angle sensor system 100 may comprise at least four angle sensor elements 180, which may be preferably located on a single sensor die 130 at at least two positions thereon. The sensor die 130 may have an axial orientation such that a line perpendicular to the die 130 and through a center point of the sensor 100, which may be considered "the gravity center" of these sensor elements 180, crosses the rotation axis 210. A first set of two magnetic field sensor elements 180-1, 180-2 of a first type may be shifted along a first gradiometer direction 150-1. They may form a first gradiometer 110-1. A second set two magnetic field sensor elements 180-3, 180-4 of a second type may be shifted along the first gradiometer direction 150-1 or a second gradiometer direction 150-2. Assuming that the first and second gradiometer directions 150-1, 150-2 may also be parallel or essentially identical, these directions 150 may be parallel or orthogonal.

The first type of magnetic field sensor elements 180 may, for instance, mainly respond to an out-of-plane magnetic field component 120, while the second type of magnetic field sensor elements 180 may mainly respond to an in-plane magnetic field component 120. The second type of magnetic field sensor elements 180 may mainly respond to that in-plane magnetic field component 120, which is parallel to the second gradiometer direction 150-2.

A sensor circuit 170 may compute a first difference of magnetic field components 120-1 detected by the first two magnetic field sensor elements 180-1, 180-2 and it may also compute a second difference of magnetic field components 120-2 detected by the second two magnetic field sensor elements 180-3, 180-4. The sensor circuit 170 may, for instance, compute an arc-tangent of a ratio of these first and second differences. The first type of magnetic field sensor elements 180 may be Hall plates, while the second type of magnetic field sensor elements 180 may be vertical Hall effect devices or magneto-resistors. The shaft 260 may be ferrous or non-ferrous. In other words, it may have a relative permeability between $\mu r=1$ and, as an example, $\mu r=10000$.

Embodiments facilitate a concept, which will be explained in more detail now. Assuming the simplest case of a non-magnetic shaft 260 along the z-direction, around which a magnet 220 of rotational geometry is mounted with a homogeneous magnetization 250 in the y-direction, the magnetic field can be expressed by the following equations. In the general case (like e.g. a cone) the radius R' of the magnet is a function of the z'-coordinate. In cylindrical coordinates one arrives at the following formulas:

$$B_x(R, \psi, z) = B_{rem}\sin(2\psi)b_1 \qquad (1)$$

$$B_y(R, \psi, z) = B_{rem}\{b_0 - \cos(2\psi)b_1\} \qquad (2)$$

$$B_z(R, \psi, z) = B_{rem}\sin\psi b_2 \qquad (3)$$

-continued with $$b_0(R, z, H, R'(z')) = \frac{1}{16}\int_{z'=-H/2}^{H/2} R'\frac{3Rk_2F_1(5/4, 7/4, 2, k^2) - 4R'_2F_1(3/4, 5/4, 1, k^2)}{(R^2 + R'^2 + (z-z')^2)^{3/2}}dz' \qquad (4)$$

$$b_1(R, z, H, R'(z')) = \frac{R}{8}\int_{z'=-H/2}^{H/2} R'^2\frac{3R_2F_1(5/4, 7/4, 2, k^2) - (15/8)R'k_2F_1(7/4, 9/4, 3, k^2)}{(R^2 + R'^2 + (z-z')^2)^{5/2}}dz' \qquad (5)$$

$$b_2(R, z, H, R'(z')) = \frac{3R}{4}\int_{z'=-H/2}^{H/2} \frac{(z-z')R'^2_2F_1(5/4, 7/4, 2, k^2)}{(R^2 + R'^2 + (z-z')^2)^{5/2}}dz' \qquad (6)$$

and with $k=2RR'/(R^2+R'^2+(z-z')^2)$, H being the thickness of the magnet, and $B_{rem}$ the remanence. $_2F_1(a,b,c,x)$ denotes the hypergeometric function. The primed coordinates (R', z') denote the source points whereas the unprimed coordinates (R, $\psi$, z) denote the test point. Equations (1)-(6) are based on the assumption that the magnet 220 has no bore. A magnet 220 with a bore can be treated as a superposition of the magnet 220 without the bore and another magnet in the shape of the bore, but with a negative remanence. The radial and azimuthal field components are given by:

$$B_R(R,\psi,z) = B_{rem}\sin\psi(b_0+b_1) \qquad (7)$$

$$B_\psi(R,\psi,z) = B_{rem}\cos\psi(b_0-b_1) \qquad (8)$$

For magnets 220 with mirror symmetry to the mid-plane z=0 it holds $b_2(R,0)=0$ and $\partial b_0(R,0)/\partial z=0$ and $\partial b_1(R,0)/\partial z=0$. This follows from equations (7) and (8) when we insert z=0 and assume mirror symmetry R'(z')=R'(-z'). For instance, for $\partial b_0(R,0)/\partial z=0$ it follows:

$$\int_{z'=-H/2}^{H/2}\int_{\psi'=0}^{2\pi}\frac{(R/\sqrt{2} - R'\sin\psi')R'\sin\psi' z'}{(R^2 + R'^2 + \sqrt{2}\,RR'(\cos\psi' + \sin\psi') + z'^2)^{5/2}}d\psi'dz' = 0 \qquad (9)$$

This condition may be fulfilled if the magnet 220 is mirror-symmetric with respect to its mid-plane (z=0), because then the integrand in the lower half has opposite sign than the integrand in the upper half. Therefore, it might be advisable to look for a magnet 220, which is mirror-symmetric to its mid-plane (z=0).

With equations (3), (7) and (8), it follows:

$$B_z\left(R, \psi, \frac{\Delta z}{2}\right) - B_z\left(R, \psi, \frac{-\Delta z}{2}\right) \cong B_{rem}\Delta z\frac{\partial b_2(R, z=0)}{\partial z}\sin\psi \qquad (10)$$

$$B_R\left(R, \psi + \frac{\Delta\psi}{2}, z=0\right) - B_R\left(R, \psi - \frac{\Delta\psi}{2}, z=0\right) \cong \qquad (11)$$
$$B_{rem}\Delta\psi(b_0(R, z=0) + b_1(R, z=0))\cos\psi$$

$$B_\psi\left(R, \psi + \frac{\Delta\psi}{2}, z=0\right) - B_\psi\left(R, \psi - \frac{\Delta\psi}{2}, z=0\right) \cong \qquad (12)$$
$$-B_{rem}\Delta\psi(b_0(R, z=0) - b_1(R, z=0))\sin\psi$$

For angle sensing, determination or estimation, it might be advisable to use a pair of equations comprising sine and cosine dependency, respectively. Thus, several possibilities of varying implementation principles exist, which will be outlined below.

Figure 9:
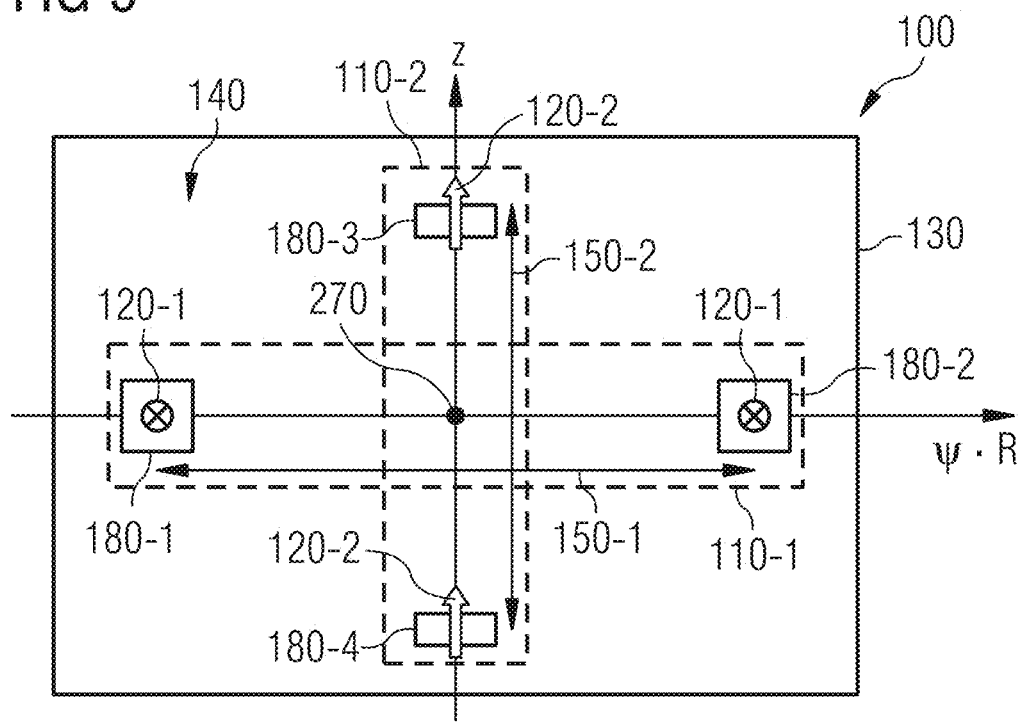
FIG. 9 shows a schematic plan view of a discrete magnetic angle sensor device according to an embodiment.

FIG. 9 shows a schematic plan view of a discrete magnetic angle sensor device according to an embodiment. FIG.

9 is similar to FIG. 1, but differs with respect to some aspects. On the substrate or sensor die 130, once again two gradiometers 110-1, 110-2 are arranged comprising two magnetic sensor elements 180 each. Similar to the embodiment shown in FIG. 1, the first gradiometer 110-1 is responsive or sensitive to the magnetic field component 120-1 perpendicular to the sensor die 130. In other words, the first magnetic field component 120-1 may be an out-of-plane magnetic field component. The magnetic sensor elements 180-1, 180-2 may, for instance, be Hall plates or rather out-of-plane magnetic field sensor elements 180.

The second gradiometer 110-2 comprising the magnetic sensor elements 180-3, 180-4 is responsive to magnetic field components 120-2 in the z-direction. Accordingly, the magnetic sensor elements 180-3, 180-4 may, for instance be implemented as vertical Hall effect devices or vertical Hall sensor elements. However, also other in-plane magnetic field sensor elements 180 may be used since the corresponding second magnetic field component 120-2 is oriented along the main surface 140 of the die 130, because of which the second magnetic field component 120-2 is also referred to as an in-plane magnetic field component.

The first and second magnetic sensor elements 180-1, 180-2 are oriented along the first gradiometer direction 150-1 which is, in the embodiment shown in FIG. 9, oriented along the circumferential direction of the magnet. In other words, the horizontal direction corresponds to the direction ψ. The two Hall plates 180-1, 180-2, therefore, are spaced from one another at a distance of R×Δψ, whereby R is the radial distance of point 270 from the rotation axis. Correspondingly, the third and fourth magnetic sensor element 180-3, 180-4 or, in other words, in the embodiment shown in FIG. 9, the two vertical Hall element 180-3, 180-4, are separated by a distance Δz along the z-axis.

A center point 270 of the magnetic sensor elements 180-1, 180-2, 180-3, 180-4 of the two gradiometers 110-1, 110-2, which may, for instance, correspond to an intersecting point of the connecting lines between the sensor elements 180 of a first gradiometer 110-1 and the corresponding connecting line of the sensor elements 180 of the second gradiometer 110-2. As outlined before, the center point 270 may, for instance, be oriented such that it lies on a plane being in the center of the magnet 220 in the arrangement as depicted, for instance, in FIG. 6 or 7.

Figure 10:
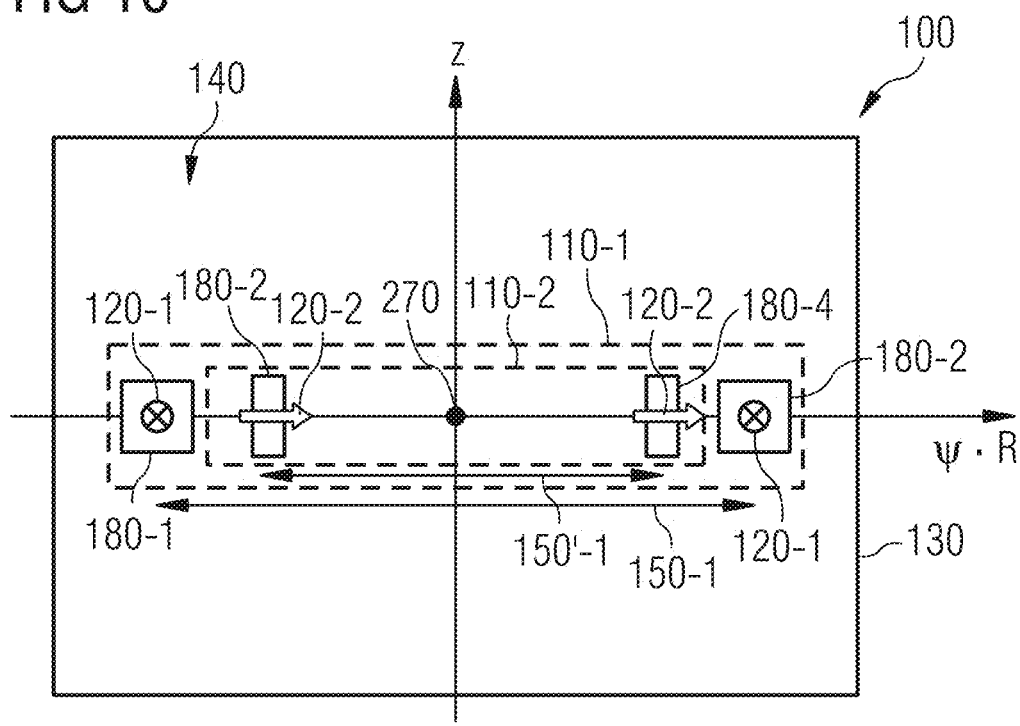
FIG. 10 shows a schematic plan view of a discrete magnetic angle sensor device according to an embodiment.

FIG. 10 shows a similar schematic plan view of a further discrete magnetic angle sensor device 100, which differs from the one shown in FIG. 9 by several aspects. For instance, the second gradiometer 110-2 is now oriented along the first gradiometer direction 150-1. To be more precise, a distance between the third and fourth magnetic sensor elements 180-3, 180-4 is now oriented along the first gradiometer direction 150-1. However, a distance between the third and fourth magnetic sensor elements 180-3, 180-4 differs from the corresponding distance of the first and second magnetic sensor elements 180-1, 180-2 as illustrated by the arrow indicating the first gradiometer direction 150'-1 corresponding to the second gradiometer 110-2.

Irrespective of this aspect, the discrete magnetic angle sensor device 100 once again comprises a common center point 270 for both, the first and second gradiometers 110-1, 110-2. The common center point 270 is situated along half of a connecting line between the first and second magnetic sensor elements 180-1, 180-2 and along the connecting line connecting the third and fourth magnetic sensor elements 180-3, 180-4.

A common center point 270 is situated at a center point of a connecting line connecting the first and second magnetic sensor elements 180-1, 180-2 along the first gradiometer direction 150-1 and at a midpoint of a connecting line connecting the third and fourth magnetic sensor elements 180-3, 180-4 of the second gradiometer 110-2 along the second gradiometer direction 150-2. In other words, the center point 270 corresponds to both midpoints of the two gradiometers 110-1, 110-2 and, simultaneously, to all of the four magnetic center elements 180-1, . . . , 180-4. It, therefore, can be considered a center of gravity of the sensor device 100.

Moreover, the second magnetic field component 120-2 is tilted by 90° compared to the sensor device 100 shown in FIG. 9 in a plane parallel to the main surface 140. Therefore, also the third and fourth magnetic sensor elements 180-3, 180-4 are sensitive to an in-plane magnetic field component 120 parallel to the main surface 140 of the silicon die 130.

However, it should be noted that the gradiometers 110-1, 110-2 may be arranged in such a way that the midpoints of the connecting lines and, hence, their center points 270 do not coincide. This may, however, be under some circumstances suboptimal.

Figure 11:
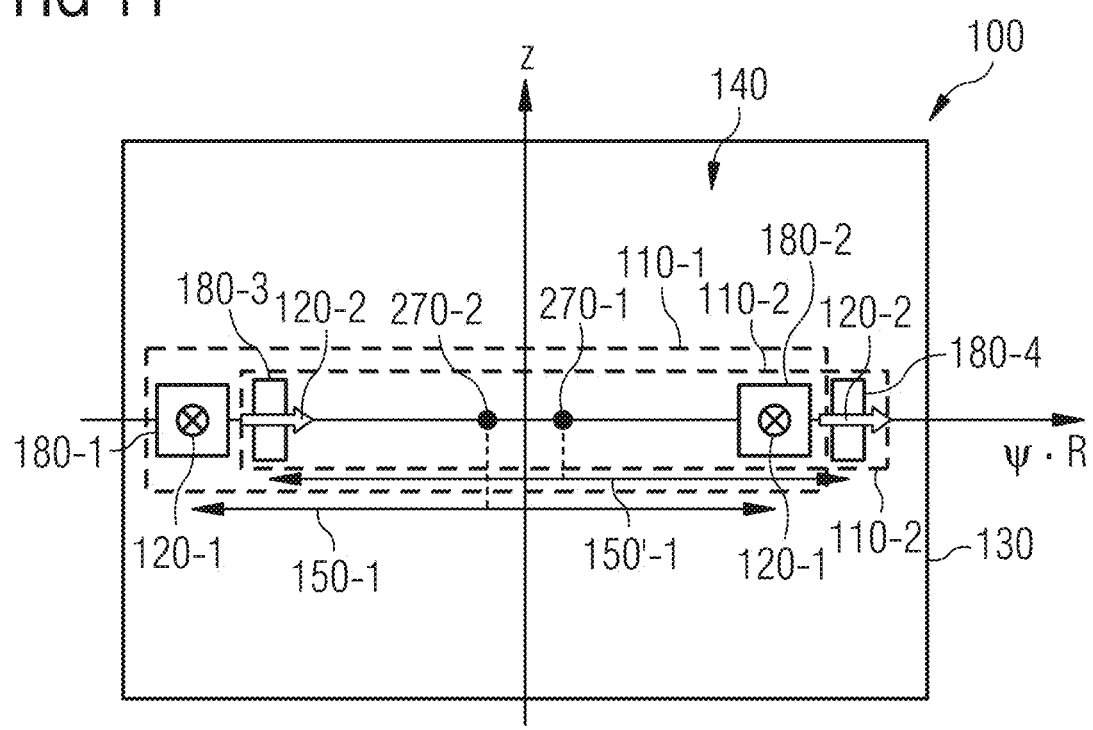
FIG. 11 shows a schematic plan view of a discrete magnetic angle sensor device 100 according to a further embodiment.

FIG. 11 shows a corresponding schematic plan view of a discrete magnetic angle sensor device 100 according to an embodiment, which differs from the one shown in FIG. 10 such that the gradiometers 110-1, 110-2 and their magnetic sensor elements 180-1, . . . , 180-4 are displaced in terms of their midpoints of the connecting lines such that their center points are displaced along the horizontal axis corresponding to the R·ψ direction. Hence, the previously-described common center point 270 is replaced by two center points 270-1, 270-2 of the first and second gradiometers 110-1, 110-2, respectively. In the embodiment shown in FIG. 11, the gradiometers 110-1, 110-2 are arranged such that their center points 270-1, 270-2 are symmetrically arranged with respect to the vertical axis corresponding to the z-axis in the case of an implementation in a magnetic angle sensor arrangement 200 as shown, for instance, in FIGS. 6 and 7.

Embodiments of a magnetic angle sensor device 100 may, therefore, comprise two in-plane magnetic field sensor elements 180 spaced apart by a first distance along a first gradiometer direction 150-1 and, for instance, two out-of-plane magnetic field sensor elements 180 spaced apart by a second distance along the first gradiometer direction 150-1 or a second gradiometer direction 150-2, which may be different from the first gradiometer direction 150-1. It may further comprise sensor circuit 170 configured to compute or determine a difference of magnetic fields or—in other words—a gradient of the magnetic field based on the two in-plane magnetic field sensor elements 180. Similarly, the sensor circuit 170 may be configured to compute the difference of fields or the corresponding gradient based on the two out-of-plane magnetic field sensor elements 180. It may further be configured to estimate the angular position the magnet 220, whose magnetic field the sensor elements 180 detect, on the basis of these two differences or gradients based on an algorithm. This may be done based on an arc-tangent computation or based on a lookup table. However, there are numerous ways to perform this computation or estimation.

Furthermore, a magnetic angle sensor arrangement 200 according to an embodiment may comprise a magnet 220. A position of the at least one sensor device 100 with respect to the magnet 220 may be chosen based on a large number of parameters, some of which will be outlined below in more detail.

A corresponding magnetic angle sensor arrangement 200 may comprise at least one magnetic angle sensor device 100 according to an embodiment as outlined before along with a diametrically magnetized magnet 220 mounted or mountable on a rotor. The sensor die 130 of the magnetic angle sensor device 100 may be mounted on a stator. Naturally, also a configuration is possible with the at least one sensor device 100 being mounted or mountable to the rotator, while the magnet 220 is mounted or mountable on to the stator.

The die 130 of the at least one magnetic angle sensor device 100 may, for instance, comprise two in-plane magnetic field sensors elements 180 spaced apart by a first distance, and two out-of-plane magnetic field sensor elements 180 spaced apart by a second distance, whereby "in-plane" and "out-of-plane" refers to the main surface of the substrate, onto or in which they are located. As outlined before, the angle sensor device 100 may further comprise a circuit 170, which may be configured to subtract the magnetic field components 120 detected by the two in-plane magnetic field sensor elements 180 to obtain a first difference or gradient. It may further be configured to subtract the magnetic field components 120 detected by the two out-of-plane magnetic field sensor elements 180 to obtain a second difference or gradient and estimate the angular position of the rotor against the stator using an algorithm operating on the basis of the first and second differences or gradients.

Optionally, the die 130 may be placed off-axis with respect to the rotation axis 210. The rotation axis 210 may be parallel to the main surface 140 of the die 130. In other words, the discrete magnetic sensor device 100 may be used as a differential out-of-axis angle sensor.

Embodiments of a magnetic angle sensor device 100 may, for instance, use four magnetic field sensor elements 180, two of which constitute a first group or the first gradiometer 110-1. They may be sensitive to a first component 120-1 of two orthogonal components 120-1, 120-2 of the magnetic field. The other two magnetic field sensor elements 180 constitute a second group or the second gradiometer 110-2. They may be sensitive to the second component 120-2 of the magnetic field.

In embodiments, the spacing of the sensor elements 180 of one discrete magnetic angle sensor device may be often less than 10 mm or less than 5 mm, since the magnetic sensor elements 180 are typically arranged on or in a single die 130. This arrangement of the sensor elements 180 may be beneficial, since the sensor elements 180 may be more easily matched, for instance, in terms of their magnetic sensitivities. This may lead to a more efficient suppression of homogeneous background magnetic fields and other disturbances. Moreover, the spacing of the sensor elements 180 may be kept smaller, which may also improve a suppression of background magnetic fields.

Embodiments of a magnetic angle sensor device 100 and a corresponding arrangement 200 may use sensors sensitive to tangential magnetic field components 120. This may be beneficial, since a differences of radial field components 120 may be smaller for magnets of a large diameter. Embodiments may utilize for radial components horizontal Hall sensor elements 180 for these components, which may be better suited for weaker magnetic field components than, for instance, vertical Hall sensor elements.

In the embodiments shown in FIGS. 10 and 11, the gradiometers 110-1, 110-2 are both oriented such that the sensor elements 180 of the two gradiometers 110-1, 110-2 are offset along the movement direction of the magnet 220. In the embodiment shown in FIG. 9, only the two sensor elements 180-1, 180-2 of the first gradiometer 110-1, which may be implemented as horizontal or lateral Hall plates for the gradient along the radially oriented first gradiometer direction 150-1, may be offset along the movement direction ($\psi$-direction), whereas the other elements 180-3, 180-4 may be implemented as vertical Hall elements for the magnetic component along the z-direction, which are offset in the z-direction.

As the FIGS. 10 and 11 have shown, the sensor elements may be arranged such that the center points 270 of the two gradiometers 110 coincide or may be offset from one another. In other words, the center spots 270 are not necessarily at the same spot, although this may also be implemented.

In embodiments, the signals in the nominator and denominator of a possible arctan-implementation (cf. the signals in equations (10)-(12)) may also be sinusoidal. Yet for general magnets, these signals may have different amplitudes. This may have to be addressed in an implementation. The question of the different amplitudes may have to be separately considered as will be outlined below.

However, embodiments are based on measuring slopes or gradients of magnetic field components 120. In other words, the arctan-determination is not directly carried out on the magnetic field components 120, but the differences or gradients accessible by using the gradiometers 110 are used instead. Therefore, although an angle sensor device 100 according to an embodiment uses four sensor elements 180, two slopes or gradients at two spots (the center points 270), which are close nearby are used for the angle determination. The points are located on the same die 130 so that they are less than the size of the die 130 separated from one another.

Naturally, using a gradiometer 110 to determine the gradient results in an approximation of the gradient by sensing the respective magnetic field component 120 in two spots given by the locations of the magnetic sensor elements 180, using their difference and dividing same by the distance between the relevant sensor devices 180. Hence, taking two sensor elements 180, which are sensitive to the same magnetic field component 120 at two locations, then the subtraction of both divided by their spacing gives an approximation for the slope or gradient of the respective field component 120 at the midpoint or center point 270 between both elements 180.

According to an embodiment, the rotational position of the magnet 270 may, for instance, be estimated based on pairs of $(dB_R/d\psi, dB_\psi/d\psi)$ or with $(dB_R/d\psi, dB_z/dz)$, to name just some examples. The first pair of numbers are slopes along the same direction $d/d\psi$, whereas the second pair of numbers are slopes along orthogonal directions $d/d\psi$ and $d/dz$.

On the other hand the amplitude of the curve $dB_z/dz$ may depend mainly on an axial dimension or thickness of the magnet 220. So the thickness of the magnet 220 may offer a further degree of freedom in the design of the sensor system or arrangement 200. It may be possible to trim it in order to adjust the amplitude of the $dB_z/dz$-curve to values close to the amplitudes of the $dB_R/d\psi$-curve.

These considerations open up an insight into the general operational principles of differential off-axis angle sensors 100 according to an embodiment. Gradients in other directions (e.g. radial direction) may also be used. With regard to equations (3), (7) and (8) the following table is derivable, that gives the psi-dependencies ($\psi$-dependencies) of the slopes of the magnetic field components 120:

|      | BR     | Bψ     | Bz     |
| ---- | ------ | ------ | ------ |
| d/dR | sin ψ  | cos ψ  | sin ψ  |
| d/dψ | cos ψ  | sin ψ  | cos ψ  |
| d/dz | sin ψ  | cos ψ  | sin ψ  |

From the three components $B_R$, $B_\psi$, $B_z$ and three derivatives d/dR, d/dψ, d/dz corresponding to three gradiometer directions 150, when integrated into a magnetic angle sensor arrangement 200 or a similar arrangement, a total of nine combination arises. As the table shows, this gives five signals with sine-of-psi-dependency (sine signals) and four signals with cosine-of-psi-dependency (cosine signals). For an angle sensor, in principle arbitrary pairs including one sine- and one cosine-function may be chosen.

However, not all of the nine functions in this table are independent. According to Maxwell's equations the curl of the B-field vanishes in free space. This leads to the equations $dB_z/d\psi=RdB_\psi/dz$ and $dB_z/dR=dB_R/dz$. Therefore, the two fields in the table with identical or similar accentuated borders are identical.

From a sensor point of view, it may be interesting to use horizontal Hall sensor elements 180, because their errors (e.g. offset and noise) are smaller than those of vertical Hall sensor elements. This may mean that systems detecting slopes of the first magnetic field component 120-1 (along a first direction, which is the out-of-plane direction) in second and third directions (gradiometer directions 150) might be interesting, whereby the three directions are mutually perpendicular. For instance, if R is the first direction, using the pair $(dB_R/d\psi, dB_R/dz)$ may be interesting. If ψ (psi) is the first direction, using the pair $(dB_\psi/dR, dB_\psi/dz)$ may be interesting, yet both signals have a cosine dependency—so this pair might not work for an angle sensor 100. If z is the first direction, using the pair $(dB_z/dR, dB_z/d\psi)$ may be interesting.

Figure 12:
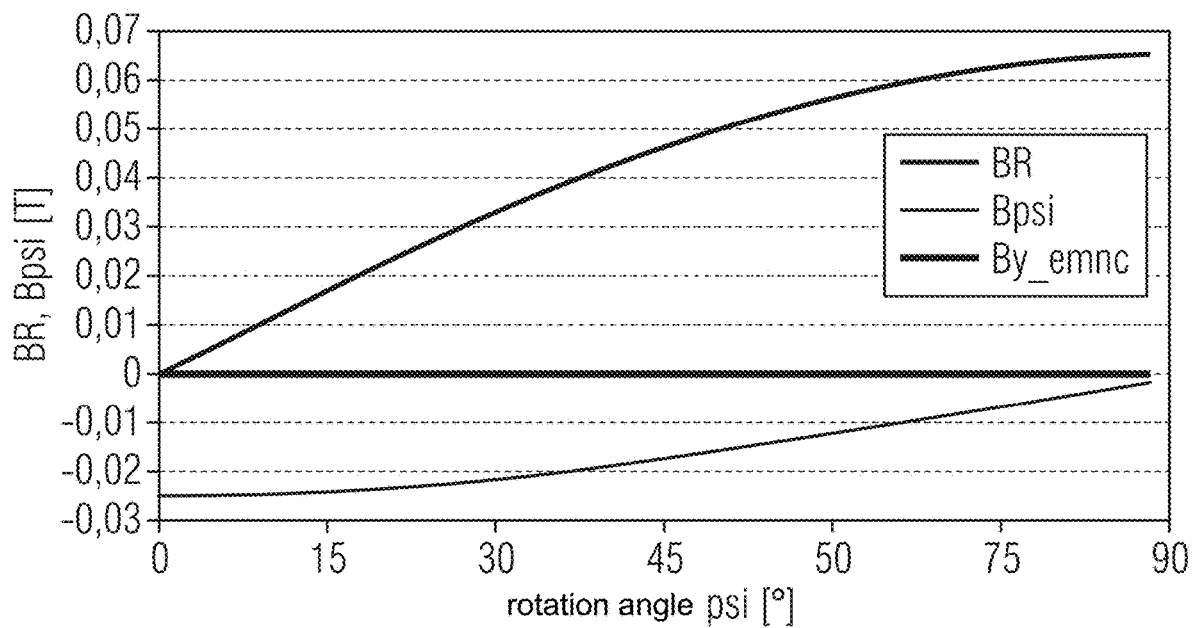
FIG. 12 shows a diagram of two magnetic field components along a rotation angle for a magnet.
Figure 13:
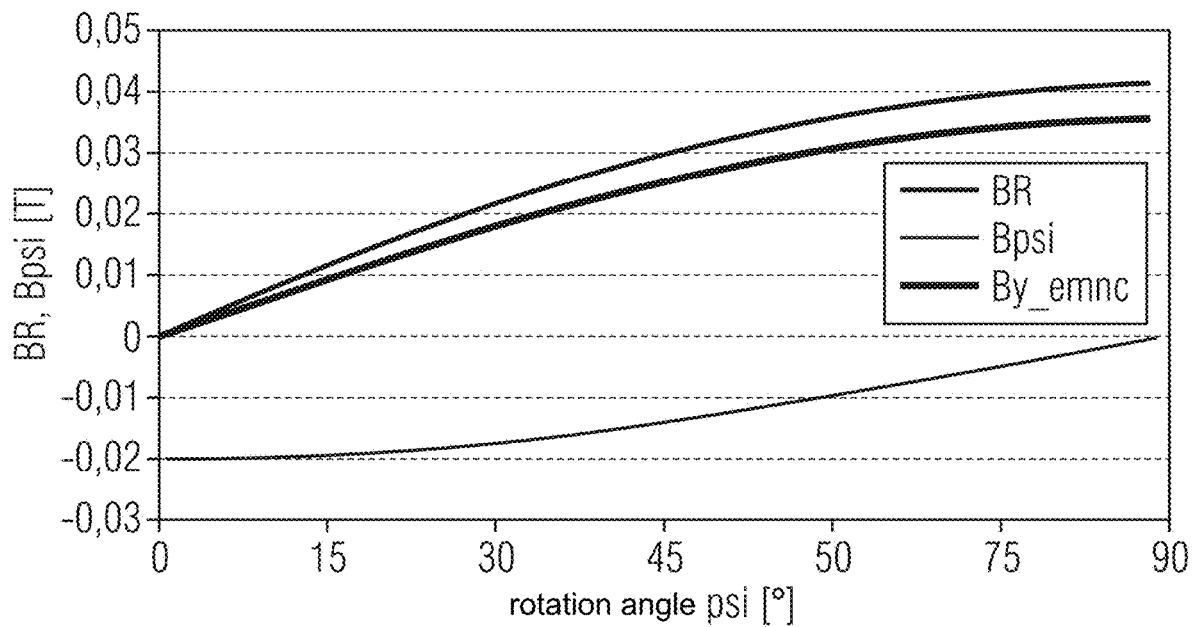
FIG. 13 shows a diagram of the two magnetic field components along the rotation angle for the magnet of FIG. 12 at a different location along a rotation axis.

FIGS. 12 and 13 show results of a three dimensional simulation of a magnet 220. The magnet 220 has an outer diameter of about 30 mm with a 6 mm diameter bore and an iron shaft 260 through the bore along the z-axis. The magnet 220 is 8 mm thick along the z-axis and comprises a remanence Brem of 220 mT pointing in the y-direction. FIG. 12 shows diagrams for BR and Bpsi as a function of psi for the plane z=0, which is the mid-plane of the magnet 220. FIG. 13 shows the curves for the same magnetic field components 120 at a shifted plane shifted by a distance of 3.5 mm to 4 mm.

Figure 14:
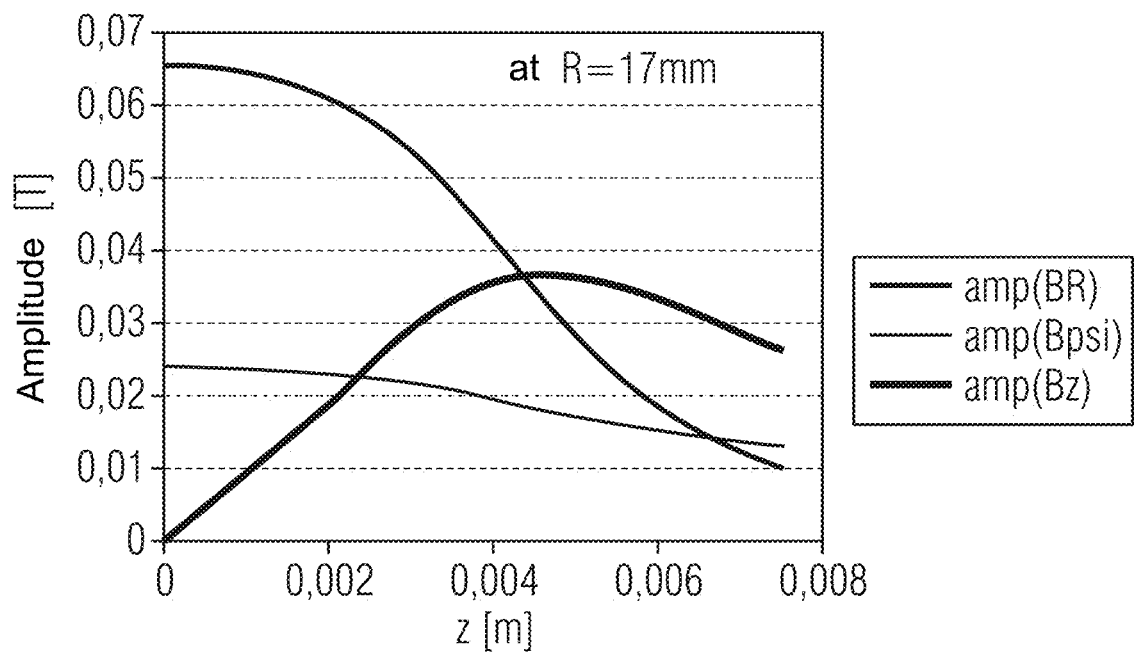
FIG. 14 illustrates amplitudes of different magnetic field components as a function of a distance from a mid-plane of the magnet.

FIG. 14 shows at radial distance of 17 mm from the rotation axis 210 amplitudes of the three magnetic field components 120 versus their axial position (z-coordinate along the z-axis), where the position z=0 corresponds to the mid-plane of the magnet 220. Starting from the mid-plane (z=0), the amplitude of the Bz-component increases linearly until the test point reaches roughly the position of the top surface of the magnet 220, where it falls again. At about z=t/2 with t being the thickness of the magnet 220, the Bz-field has the largest amplitude, which is nearly twice as large as the Bpsi-field component there, and about as large as the BR-field component.

Figure 15:
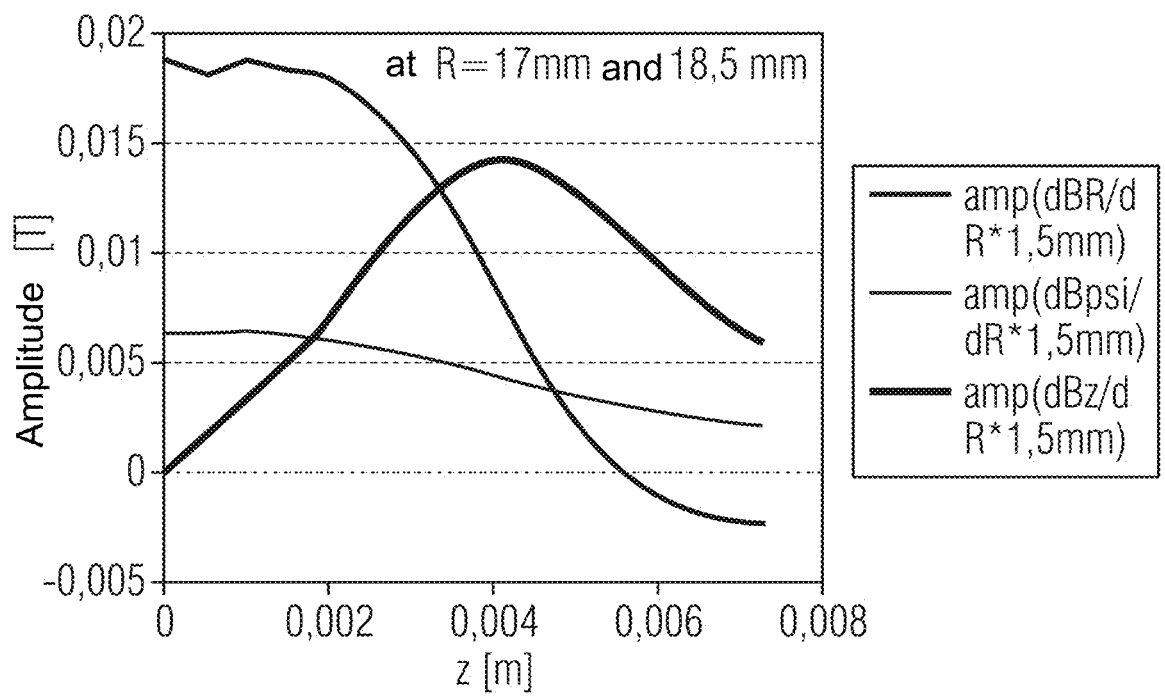
FIG. 15 shows a diagram of amplitudes of field differences or gradients taken at a distance of 1.5 mm for three different magnetic field components as a function of a distance from a mid-plane.

FIG. 15 shows a field difference of the three magnetic field components at a 1.5 mm radial distance with one point being located at a distance of R=17 mm and one point being located at R=18.5 mm. So this is the relevant magnetic input for gradiometers with radial gradiometer direction. Here the dBR-signal is strongest in a range of about z=0 mm to about z=2 mm, whereas the dBz-signal is strongest near z=4.0 mm to 4.5 mm. Near z=3.5 mm both signals are equally or comparably strong according to this simulation.

Figure 16:
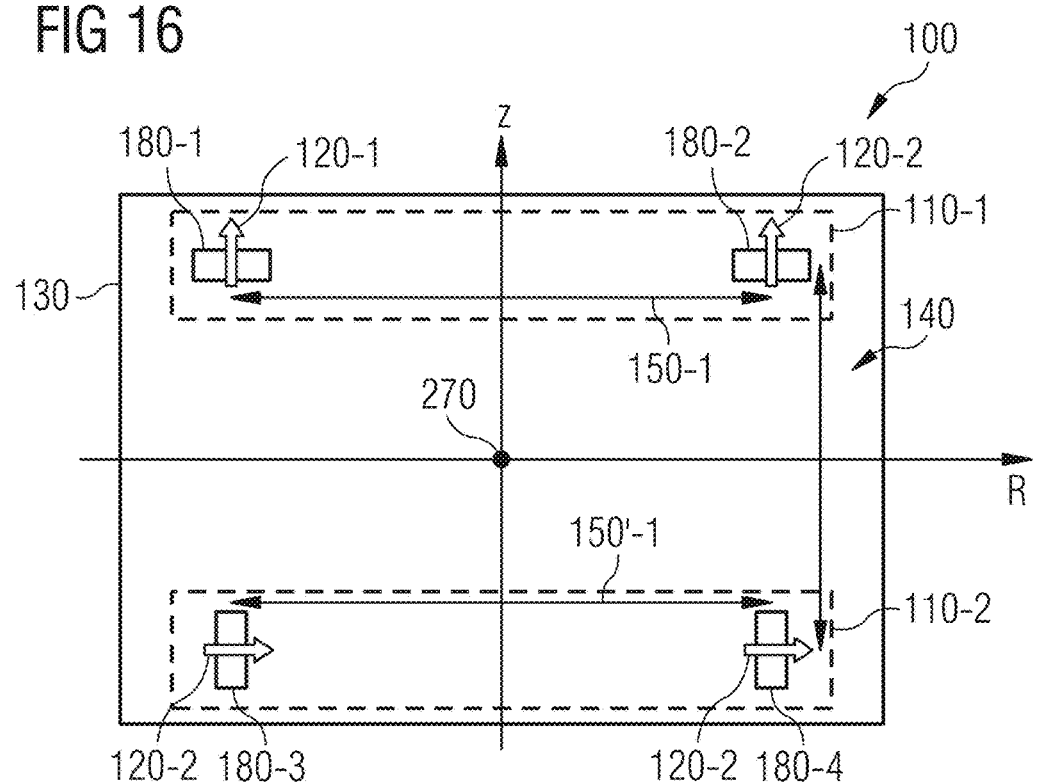
FIG. 16 shows a schematic diagram of a discrete magnetic angle sensor device according to an embodiment.
Figure 17:
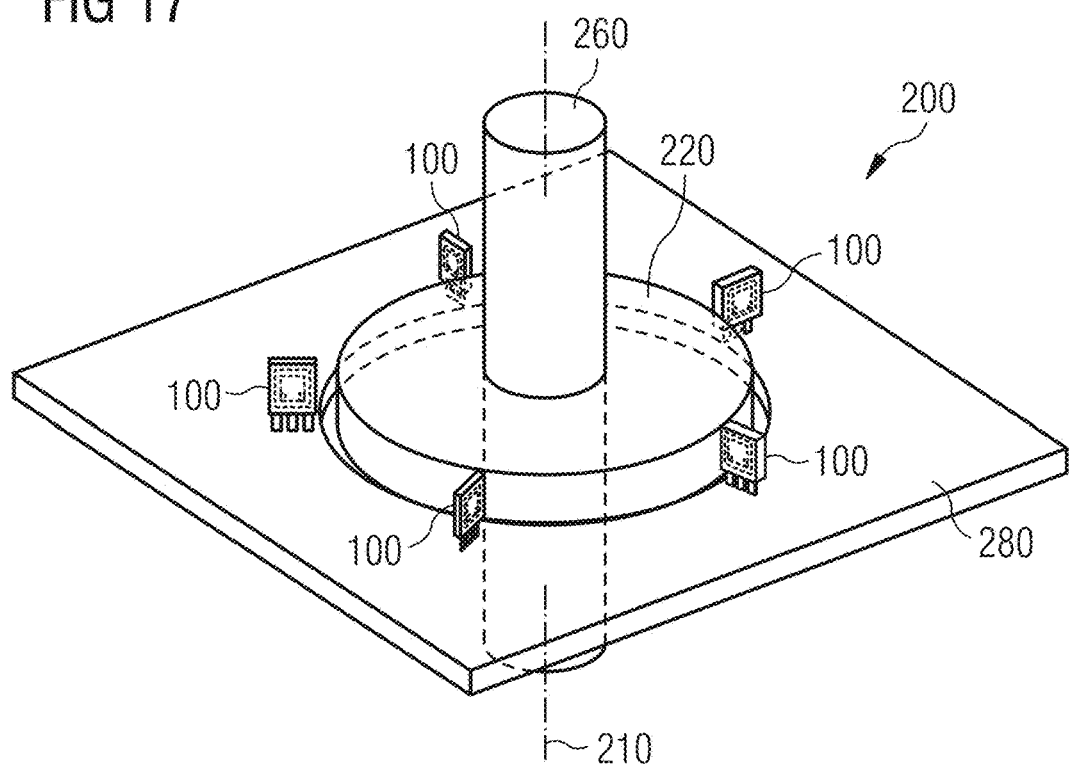
FIG. 17 shows a semi-transparent perspective view of a magnetic angle sensor arrangement according to an embodiment in an off-axis configuration.
Figure 18:
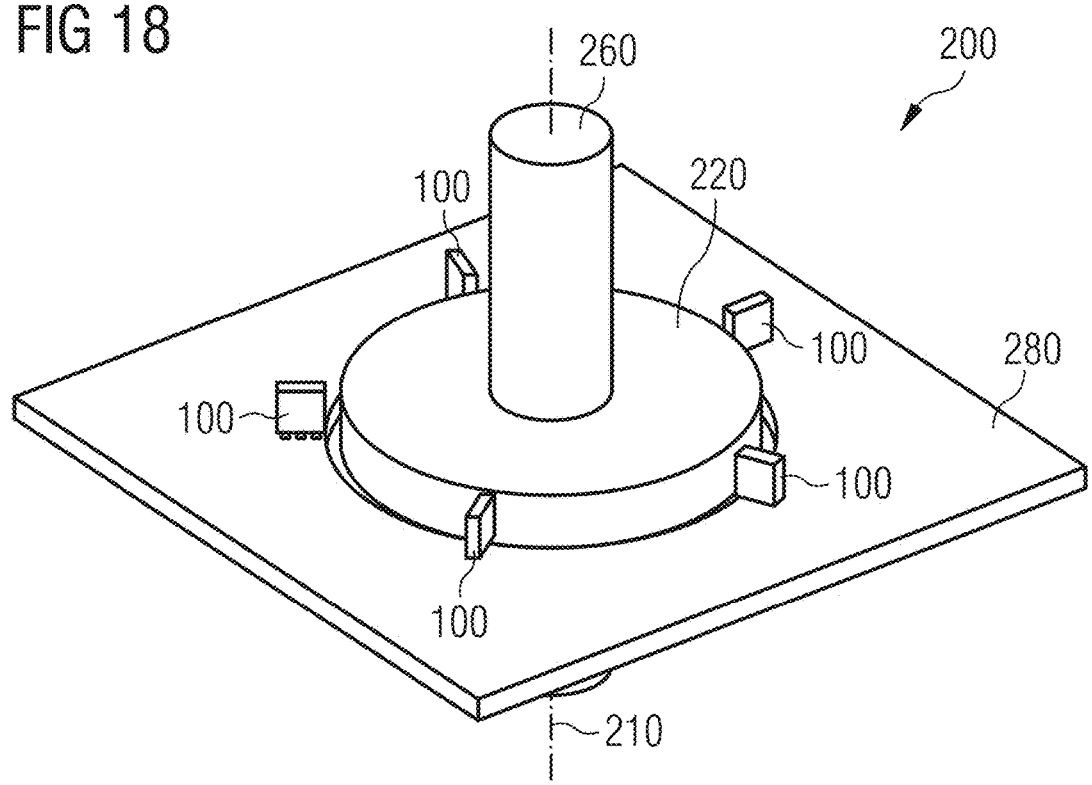
FIG. 18 shows a perspective view of a magnetic angle sensor arrangement shown in FIG. 17.

FIG. 16 shows a schematic diagram of a discrete magnetic angle sensor device 100 according to an embodiment, which may be used in the framework of a differential out-of-axis sensor arrangement 200 according to an embodiment. The magnetic angle sensor device 100 comprises once again a sensor die 130 with a main surface 140, on which a first gradiometer 110-1 and a second gradiometer 110-2 are implemented. The gradiometers 110-1, 110-2 are both arranged along a first gradiometer direction 150-1, 150'-1, respectively, which is parallel to a radial direction with the rotation axis being the symmetry center.

The first gradiometer 110-1 comprises a first and a second magnetic sensor element 180-1, 180-2, which is sensitive or responsive to a first magnetic field component 120-1 along the z-direction. These magnetic sensor elements 180-1, 180-2 may, for instance, be implemented as vertical Hall effect devices. The two magnetic sensor elements 180-1, 180-2 are arranged along the first gradiometer direction 150-1 at a distance along the radial direction of $\Delta R_z$. The index Z indicates that the two magnetic sensor elements 180-1, 180-2 are arranged to be responsive to the first magnetic field component 120-1 along the z-direction. Center points of the first and second gradiometers 110-1, 110-2 are shifted along the z-direction on purpose to allow determining the gradients dBR/dR at z=0 and dBz/dR at z=4.5 mm as shown in FIG. 15. In other words, a position and/or an orientation of the devices 100 may be adapted according to the geometry of the arrangement 200.

The second gradiometer 110-2 comprises a third and a fourth magnetic sensor elements 180-3, 180-4 which are also arranged along the first gradiometer direction 150'-1, which are responsive to a second magnetic field component 120-2, which is oriented in the arrangement depicted in FIG. 16 along the radial direction (R). In other words, the magnetic sensor elements 180-3, 180-4 are responsive to the radial magnetic field component, which may, for instance, be detected by appropriately oriented vertical Hall effect devices. Therefore, the magnetic sensor elements 180-3, 180-4 may be implemented as vertical Hall effect sensor elements. They are separated along the gradiometer direction 150'-1 by a distance $\Delta R_R$, where the index R indicates the sensitivity of the magnetic sensor elements 180 to the radial component.

The first and second gradiometers 110-1, 110-2 are furthermore separated along the z-axis corresponding to the actual direction by a distance $\Delta z$. A center point 270 of the four magnetic sensor elements 180-1, . . . , 180-4 is furthermore shown in FIG. 16, corresponding to a "gravity center" of these sensor elements 180.

The sensor die 130 may be placed near the perimeter of the magnet 220 with the z-axis parallel to the rotation axis 210 and the R-axis aligned such that its projection goes through the rotation axis 210. The axial position of the sensor die 130 may be adjusted so that the BR-sensor-pair (gradiometer 110-2) may be as close as possible to the mid-plane (z=0) of the magnet 220 and the Bz-sensor-pair (gradiometer 110-1) may be close to the maximum of the amp(dBz)-curve shown in FIG. 15 (z=4 mm).

Theoretically, this might call for $\Delta z=4$ mm, which may often be too large for usual silicon dies. A cheap silicon die often offers a size of about 1.6 mm·1.6 mm so that the distances may be in such a case $\Delta z=\Delta R_z=\Delta R_r=1.5$ mm. Under these boundary conditions it may be advisable if the gravity center or center spot 270 has a z-position close to where the amp(dBR/dR) and amp(dBz/dR)-curves cross each other. In other words, it may be located near z=3.5 mm. Then both signals may have an amplitude of about 13 mT in the case outlined above. If the vertical Hall sensor elements used as the sensor elements 180 have, for instance, 75 µT worst case offset error, this may correspond to 75µ/13 m·180°/π=0.33° worst case angle error with π=3.1415 . . . . If four such devices are placed at psi-angles of 0°, 90°, 180° and 270° the offset error may effectively halve, which may give quite a good angle accuracy.

FIGS. 17, 18, 19 and 20 show a semi-transparent perspective view, a perspective view, a close-up and a side view of a magnetic angle sensor arrangement 200 according to an embodiment comprising five of the previously described discrete magnetic angle sensor devices 100. The magnetic angle sensor devices 100 are arranged equally spaced around a shaft 260 to which a magnet 220 is mounted. As outlined before, the magnet 220 is diametrically magnetized and fixed to the shaft 260 in a through-hole configuration. The magnet 220 is furthermore in a ring-like shape as outlined before.

Figure 19:
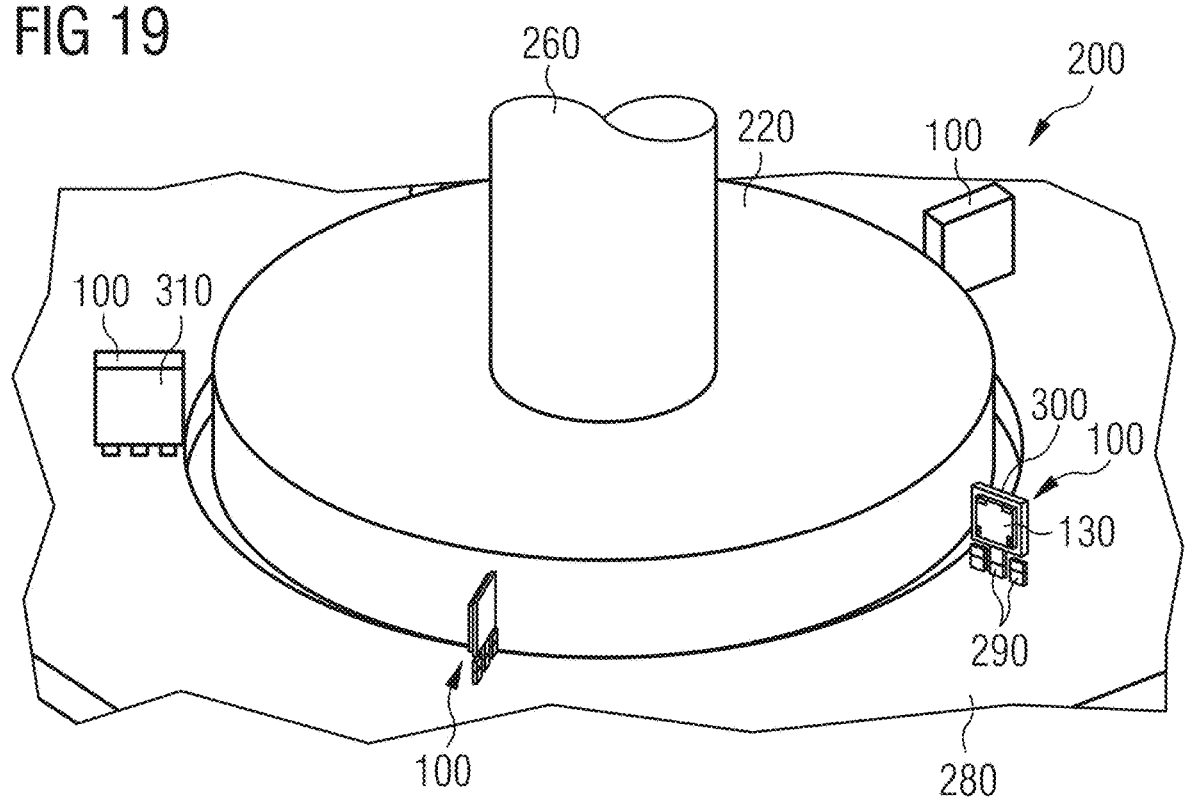
FIG. 19 shows a close-up of the perspective view of FIG. 18 with a mold compound removed from two discrete magnetic angle sensor devices according to an embodiment removed.
Figure 20:
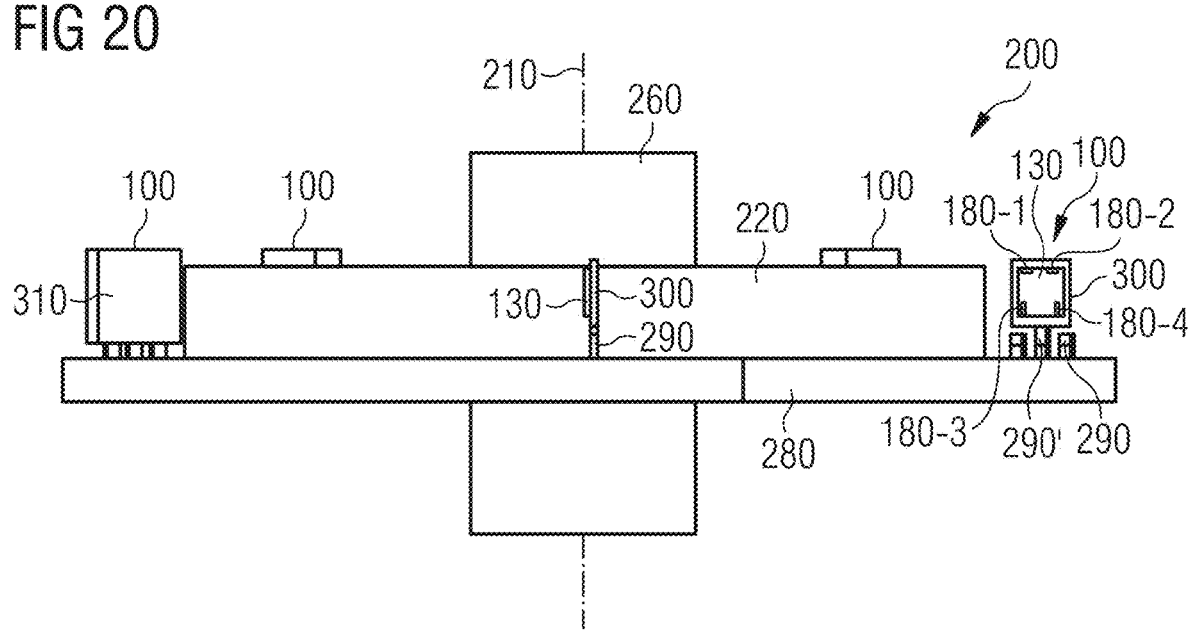
FIG. 20 shows a side view of the arrangement shown in FIG. 19.

The discrete magnetic angle sensor devices 100 are arranged on a carrier plate 280, which is oriented essentially perpendicular to the shaft 260 and, hence, to the rotation axis 210 of the shaft 260. As, for instance, FIGS. 19 and 20 show, the discrete magnetic angle sensor devices 100 are mechanically and electrically coupled to the carrier plate 280 by three pins 290. A middle pin 290' is mechanically and electrically coupled to a leadframe 300 onto which the substrate or die 130 of the discrete magnetic angle sensor device 100 is mounted. FIGS. 19 and 20 furthermore show the positions and orientations of the four magnetic sensor elements 180-1, . . . , 180-4 as previously outlined in the context of FIG. 16.

To show the inner structure of the discrete magnetic angle sensor devices 100, in FIGS. 19 and 20 two of these devices 100 are shown without a surrounding mold component 310 encapsulating the leadframe 300 and the die 130. Naturally, instead of a mold compound 310 also other encapsulating techniques may be used.

Figure 21:
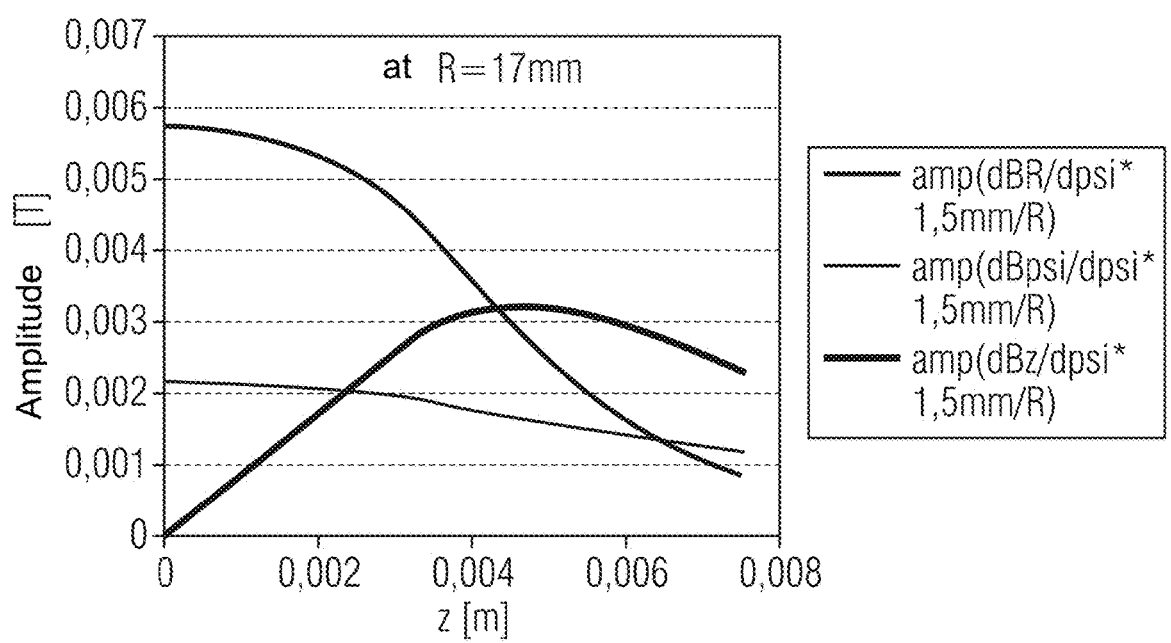
FIG. 21 shows a diagram of amplitudes of magnetic field components of a magnet as a function of a distance from a mid-plane.

FIG. 21 shows a diagram of amplitudes of psi-gradients of magnetic field components of the same magnet as shown in FIG. 14, 15 as a function of a distance from a mid-plane. As FIG. 21 shows, the slopes of the magnetic field components 120 versus psi-direction may be smaller than in FIG. 15. In the case shown here, the psi-gradient of the radial field component 120 has the largest slope which lies at the mid-plane (z=0) at a radial distance of about 17 mm, but its value is still only a third of the slope in the R-direction. The signals (dB/dpsi*1.5 mm/R) are essentially identical to the signals B multiplied by a factor (1.5 mm/R=1.5/17=1/11.3). Thus, the difference fields are only $\frac{1}{11}^{th}$ of the absolute field. In other words, if the mismatch between both sensors 180 of the difference pair (gradiometer 110) is about 0.1% it may add a contribution of about 1.13% to the difference signal, which is in quadrature to it and which might give an additional angle error.

In the z=0 plane or—in other words—near the mid-plane of the magnet 220, the signal amplitudes acquire the following absolute values (sign of the signals is not accounted for):

| in {R = 17.75 mm, z = 0 mm}: | $B_R$ | $B_\psi$ | $B_z$ |
|---|---|---|---|
| d/dR × 1.5 mm | 18.9 mT × sinψ | 6.2 mT × cosψ | 0 × sinψ |
| d/dψ × 1.5 mm/R | 5.8 mT × cosψ | 2.1 mT × sinψ | 0 × cosψ |
| d/dz × 1.5 mm | 0 × sinψ | 0 × cosψ | 12.0 mT × sinψ |
| Absolute field amplitudes | 65.3 mT$^{\times sin\psi}$ | 24.3 mT$^{\times cos\psi}$ | 0$^{\times sin\psi}$ |

The largest gradient signals are 1.5 mm×$dB_R$/dR and 1.5 mm×$dB_z$/dz, yet they are both in phase and therefore not appropriate for an angle sensor. Either of these two signals may be combined with 1.5 mm×dR or (1.5 mm/R)×$dB_R$/dψ to make up an angle sensor 100 with sine- and cosine-signals. Although both signals are nearly equally strong it might be better to use 1.5 mm×$dB_\psi$/dR, because Bpsi may be much smaller than BR and therefore the Bpsi-versus-R-gradiometer might be less affected by mismatches of the sensor pair then the BR-versus-psi-gradiometer.

Similarly, for the sine-signal it might be advisable to use 1.5 mm×$dB_z$/dz over 1.5 mm×$dB_R$/dR. Although the latter signal may be stronger, it might be more affected by a mismatch of the sensors in the BR-pair due to the large BR-field. This may give a sensor that is similar to the sensor 100 described above on context of FIG. 9.

Figure 22:
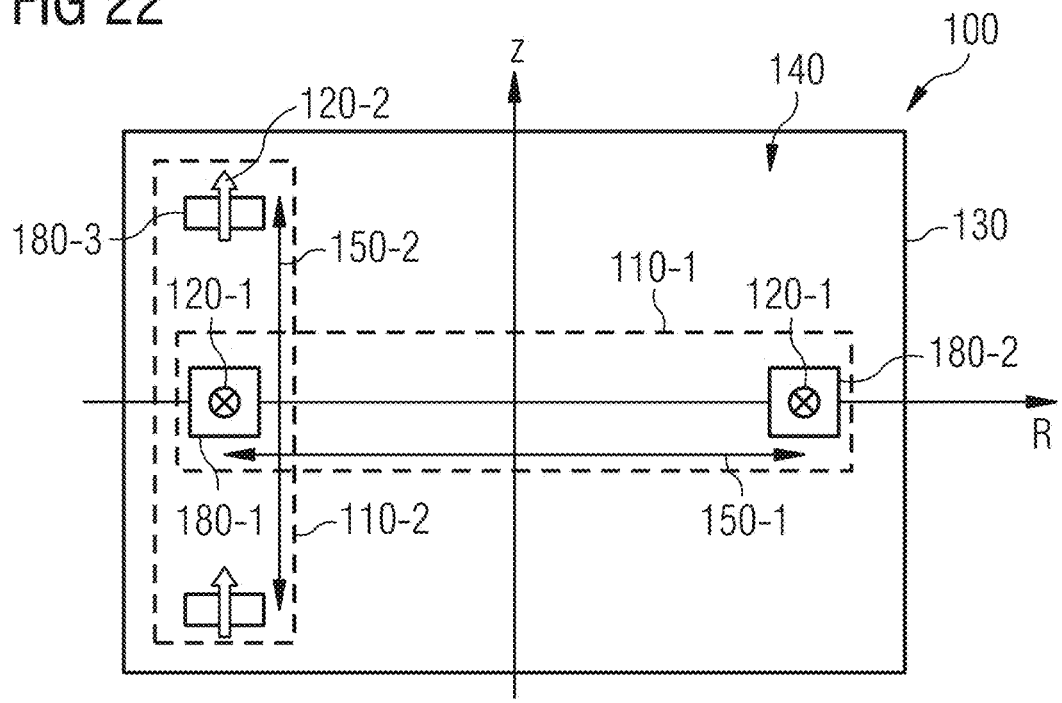
FIG. 22 shows a schematic diagram of a further discrete magnetic angle sensor device according to an embodiment.

FIG. 22 shows a schematic diagram of a magnetic angle sensor device 100 according to an embodiment, which is similar to the device 100 shown in FIG. 9. However, compared to the device 100 in FIG. 9, the second gradiometer 110-2 (the Bz-sensor-pair) is shifted to the left side of the die 130. In other words, the second gradiometer 110-2 is shifted along the first gradiometer direction 150-1 or the radial direction (R). Here, the first magnetic sensor element 180 of the first gradiometer 110-1 and the magnetic sensor elements 180-3, 180-4 of the second gradiometer 110-2 are arranged on a straight line perpendicular to the first gradiometer direction 150-1. Hence, the die 130 may be oriented in such a way that the horizontal axis points in the radial and not in the azimuthal direction.

As a consequence, in the plane at the z=4 mm coordinate or—in other words—near the top surface of the magnet 220, the signal amplitudes may assume the following absolute values (sign of the signals is not accounted for).

| in {R = 17.75 mm, z = 4 mm}: | $B_R$ | $B_\psi$ | $B_z$ |
|---|---|---|---|
| d/dR × 1.5 mm | 9.3 mT × sinψ | 4.3 mT × cosψ | 14.2 × sinψ |
| d/dψ × 1.5 mm/R | 3.6 mT × cosψ | 1.7 mT × sinψ | 3.2 × cosψ |
| d/dz × 1.5 mm | 15.7 × sinψ | 3.0 × cosψ | 4.9 mT × sinψ |
| Absolute field amplitudes | 41.3 mT × sinψ | 19.7 mT × cosψ | 36.0 × sinψ |

The largest gradient signals are 1.5 mm×$dB_R$/dz and 1.5 mm×$dB_z$/dR. Both are in phase, so it might be advisable to use an additional cosine(psi)-signal. Since the Bz-field is 15% smaller than the BR-field (radial field component), it may be slightly better to use 1.5 mm×$dB_z$/dR, because it might be less affected by a mismatch of the sensor elements 180 in the Bz-pair (gradiometer 110-1). Unfortunately, all cosine-signals may be weak (4.3 mT or less) so that it is not clear, which combination of signals might give the best available results. Generally, the gradiometers 110 may be chosen so that one has sine-like and the other cosine-like dependence and from the various possibilities of sine-like dependence (or cosine-like dependence) one may choose a gradiometer with large gradiometer amplitudes and not too large amplitudes of the field component, to which the gradiometer is sensitive. So if the gradient, for instance, detects dBx/dy (x and y denoting any of the R-, psi- and the z-direction) then of course the amplitude of dBx/dy should be sufficiently large (amp(dBx/dy)), but also the ratio of amplitudes of Bx and dBx/dy should be small (amp(Bx)/amp(dBx/dy)), for instance, smaller than 10.

As shown above, there are numerous sensor layouts. Embodiments may utilize one or more basic ideas. Embodiments may, for instance, be based on sensor units 110 or nodes, which measure the gradients of two magnetic field components 120, for instance, orthogonal ones like BR, Bpsi, Bz. However, it is not necessary to use orthogonal components. It is sufficient when they are not collinear. This may be done, for instance, in two locations, that are close together. In other words, the two locations are on the same sensor die 130 and typically less than 3 mm distant from one another. Often, a distance between them is less than the radius of the magnet 220. Therefore, their spacing may be defined very accurately, for instance, with micrometer precision due to the accuracy achievable with which modern integrated circuit technology defining the geometry and positions of the sensor elements 180. The gradiometers 110 may cancel homogeneous background magnetic disturbances so that all gradiometer outputs may be combined arbitrarily without getting errors due to background fields.

Each sensor unit 100 may estimate the rotation angle by an algebraic combination, which cancels out common multiplicative factors on both gradiometer outputs (e.g. ratio or arctangent of ratio). This class of algebraic combinations may cancel out magnetic field strength. Therefore, the sensor 100 might not be affected by lifetime or temperature drifts of magnetization of the magnet 220. Furthermore, this class of algebraic combinations may allow to combine angles obtained by different sensors 100 or sensor dies 130, even if the magnetic sensitivity of magnetic field sensors 100 may vary between the dies 130.

For example, when a first sensor unit 100 with a first gradiometer output GN1 and a second gradiometer output GT1, both outputs may be proportional to the magnetization M of the magnet 220 and to the sensitivity S1 defined by a common bias circuit, and to a function of the rotation angle N1(psi), T1(psi). Thus one may obtain $$GN1 = M*S1*N1(\text{psi}) \quad (13)$$

$$GT1 = M*S1*T1(\text{psi}) \quad (14)$$

Since the algebraic combination cancels common multiplicative factors, the first sensor unit 100 may estimate the rotation angle according to $$\text{psi1} = f1(GN1/GT1) = f1(N1(\text{psi})/T1(\text{psi})). \quad (15)$$

Thereby f1 is some function, such as the arctangent or a more complicated algorithm. The strength of the magnet 220 and the sensitivity of the magnetic field sensors 100 on sensor unit 1 cancel out.

Having a second sensor unit 100, it may have again a first and second gradiometer outputs GN2 and GT2. With the equations $$GN2 = M*S2*N2(\text{psi}) \quad (16)$$

$$GT2 = M*S2*T2(\text{psi}) \quad (17)$$

the circuit may compute the angle $$\text{psi2} = f2(GN2/GT2) = f2(N2(\text{psi})/T2(\text{psi})). \quad (18)$$

Consequently, the sensitivity of the field sensors 180 on sensor unit 2—namely S2—cancels out. This may be used to achieve a higher accuracy, because it is typically almost not possible to have perfectly identical sensitivities (S1=S2) on different discrete sensors (e.g. different sensor units 100 and/or different sensor dies 130). Embodiments may cope with this fact simply by eliminating the sensitivities in the estimation of the angles (psi1, psi2).

Imperfect magnetizations and assembly tolerances may also lead to large errors in the estimated angle of a single sensor unit 100. However, when several sensor units are arranged around the magnet 220 and their outputs is combined, for instance by averaging their outputs taking the positions of the sensor units 100 into account, this combining of outputs may lead to drastically smaller angle errors. For instance, an eccentricity of the magnet 220 with respect to the rotation axis 210 when being mounted to the shaft 260 may be eventually counteracted by placing, for instance, at least two sensor elements 180 diametrically at an angle of 180° around the rotation axis 210. Thereby it may be possible to increase an accuracy by averaging the angle estimations of the two sensors 100. Similarly, material inhomogeneities within the magnet 220, such as voids, may eventually be counteracted by placing several sensors 100 on a circle around the axis 210 and average their angle estimations. By these measures it may be possible to at least partially counteract deviations from a pure sine wave-like magnetic field dependency when the magnet 220 rotates around the rotation axis 210.

The previously described averaging merely represents one way of combining the outputs of the sensor devices or units 100. Other schemes of combing the information comprised in the outputs may be used, which are indicative of different positions spread over a larger area (e.g. around the circumference of the magnets or around the rotation axis).

The main surface 140 of the sensor die 130 may be tangential to the magnet 220—thus the surface normal may be identical with a radial ray that is sent from the rotation axis 210 outwards through the sensor 100. It may be apt for leaded packages. Thus the gradiometers 110 may be able to detect, for instance, two sorts of slopes directly (d/dpsi and d/dz) and the third one (d/dR) indirectly by exploiting Maxwell relations between the field components—for each one of the components BR, Bpsi, Bz. This may give 2·3=6 direct gradiometer outputs.

As outlined before, various orientations of the sensor die 130 may be used. For instance, horizontal Hall sensor elements 180 only, vertical Hall sensor elements 180 only or mixed Hall sensor elements 180 may be used. Depending on the carrier for the sensor devices 100, the orientation of the sensor dies 130, the available gradients and possible combinations of sensor elements 180, different package types may eventually be used. For instance, for an (R,z)-plane oriented sensor die 130, magnetic field gradients dB{R,psi,z}/d{R,z} may be directly available. The gradients dB{R,psi,z}/dpsi may be computed out of the gradients dB{R,psi,z}/d{R,z} by use of Maxwell's equations. These may be detected by horizontal and vertical Hall sensor elements 180. A leaded package type may be used. For a (R,psi)-plane oriented sensor die 130, magnetic field gradients dB{R,psi,z}/d{R,psi} may be directly available. These may be detected by horizontal and/or vertical Hall sensor elements 180. An SMD-package type may be used (SMD=surface mountable device). For a (psi,z)-plane oriented sensor die 130, magnetic field gradients dB{R,psi,z}/d{psi,z} may be directly available. These may be detected by horizontal and/or vertical Hall sensor elements 180. A leaded package type may be used.

In order to figure out, which magnetic field gradients are strongest, simulations concerning three magnets will be outlined in the sequel. Magnet M1 has a 4 mm inner diameter, a 12 mm outer diameter, and 3 mm thickness. The remanence Brem is 220 mT. Magnet M2 has an 8 mm inner diameter, a 28 mm outer diameter, a 7 mm thickness, and a remanence Brem of 220 mT. Magnet M3 has a 30 mm inner diameter, a 60 mm outer diameter, a 10 mm thickness with a remanence Brem of 220 mT. Magnet M3 has a relative permeability $\mu_r$, of 1.5. For some simulations, it will be assumed to be mounted on an iron shaft 260 with a 24 mm diameter and an iron disk 1 mm thick.

A radial position of the sensor die 130 is 7 mm for M1 (1 mm air gap), 15.5 mm for M2 (1.5 mm air gap), and 32 mm for M3 (2 mm air gap). The gradiometers 110 are assumed to be made up of two point-like sensor elements at 1.5 mm spacing.

Figure 23:
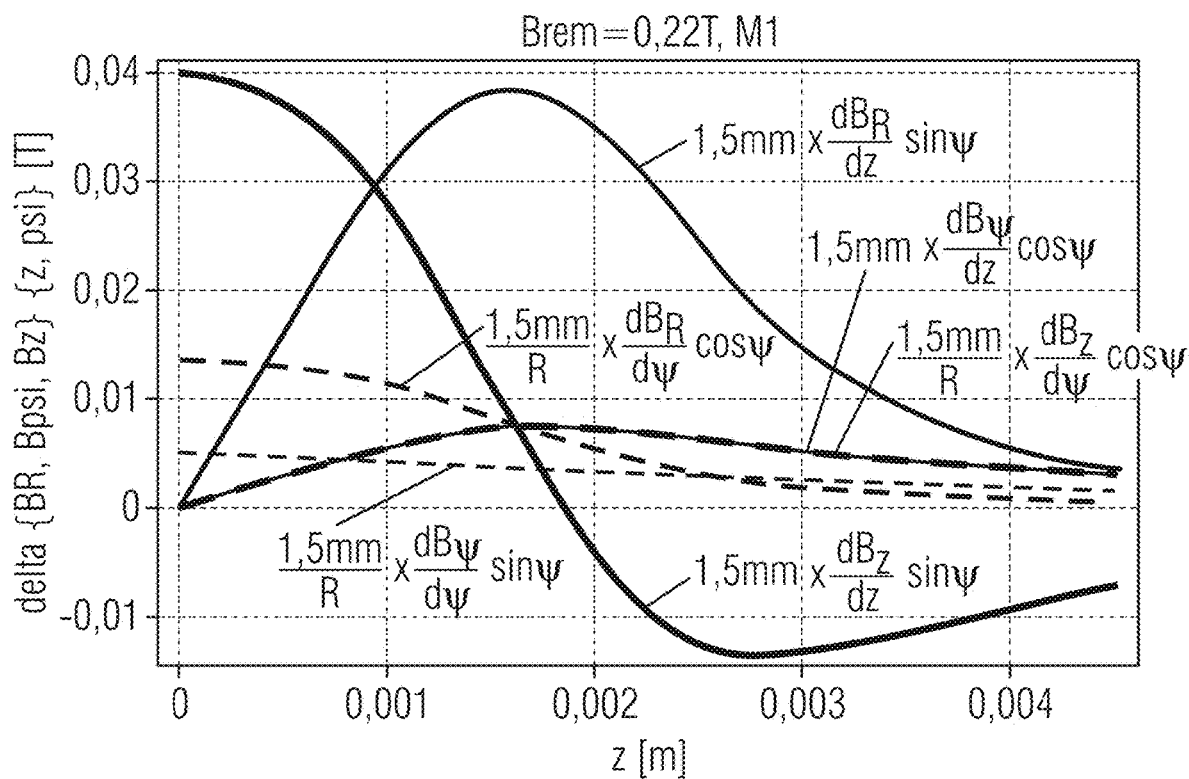
FIG. 23 shows a diagram of different gradients as a function of a distance from a center plane for a magnet M1.
Figure 24:
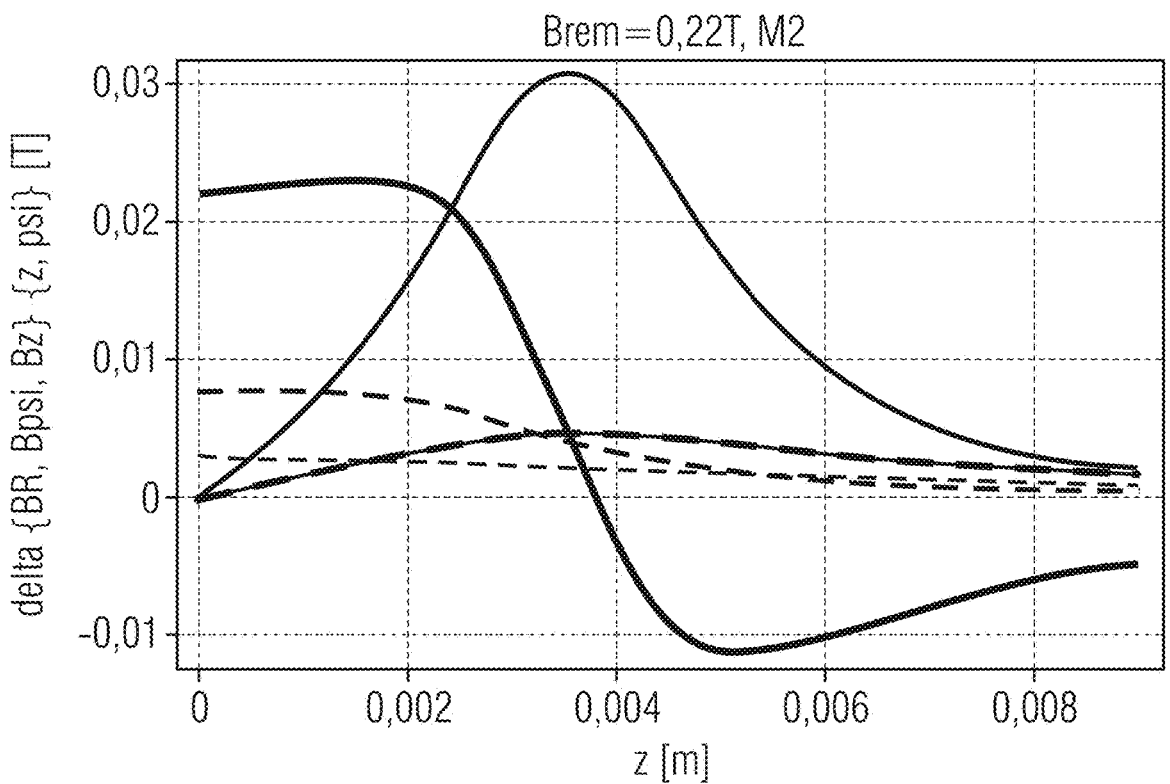
FIG. 24 shows a diagram of different gradients as a function of a distance from a center plane for a magnet M2.
Figure 25:
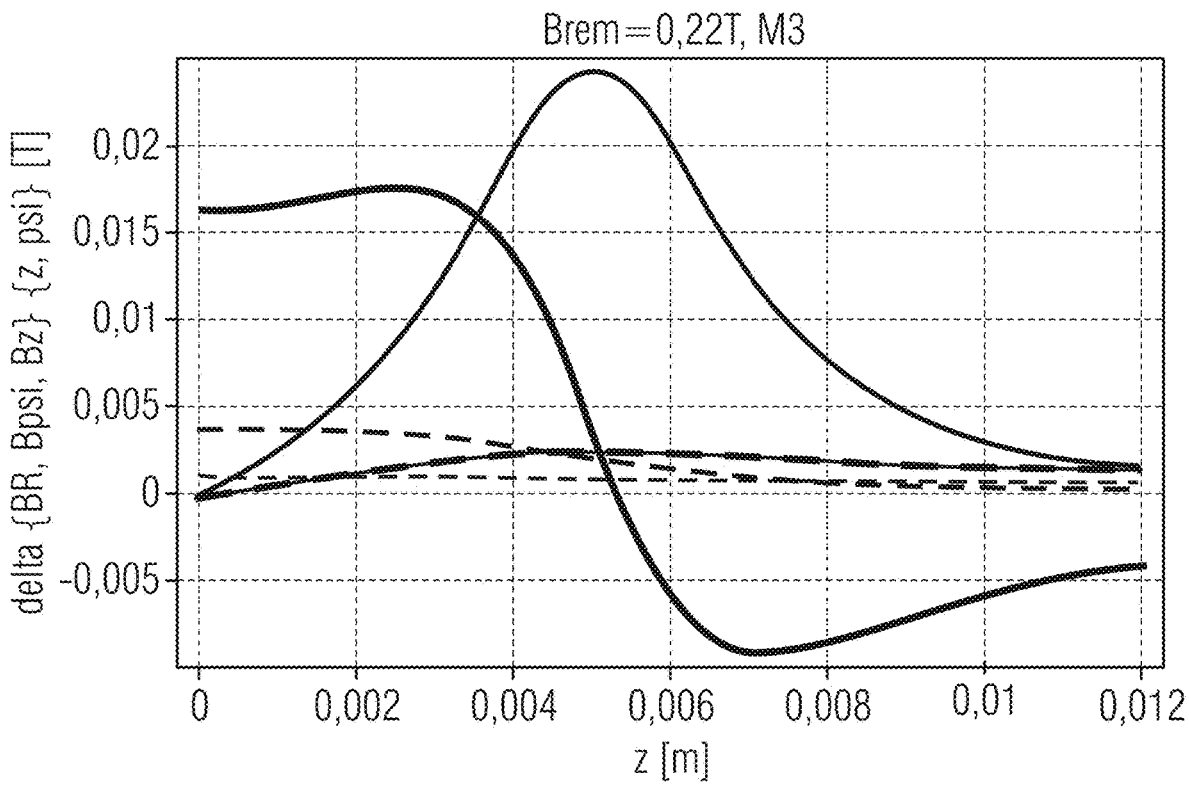
FIG. 25 shows a diagram of different gradients as a function of a distance from a center plane for a magnet M3.

FIGS. 23, 24 and 25 show diagrams of several gradients as a function of a distance from a mid-plane (z=0) for the magnets M1, M2 and M3, respectively. As the simulations show, two signals are large for all magnets:

$$1.5\text{mm} \times \frac{dB_R}{dz} \text{ and } 1.5\text{mm} \times \frac{dB_z}{dz}.$$

Unfortunately, both have a sine(psi)-dependence. The $3^{rd}$ largest gradient signal is $$\frac{1.5\text{mm}}{R} \times \frac{dB_R}{d\psi},$$

which has a cosine(psi)-dependence. In order to boost this signal, it may be possible to increase the spacing along the psi-direction from 1.5 mm to, for instance, 2.5 mm (increases the signal by a factor of approximately 1.67) and try to reduce the thickness of the magnet 220. Therefore, one embodiment, which may be advisable to use under some circumstances, uses the signals dBR/dpsi and dBz/dz at z=0 (i.e. in the mid-plane of the magnet 220). Then even for a large magnet diameter of 60 mm amplitudes up to 8 mT may be possible.

A positive aspect of this embodiment may be that a small signal amplitude dBR/dpsi may be detectable by horizontal Hall sensor elements 180, whereas the larger signals $$1.5\text{mm} \times \frac{dB_z}{dz}$$

may be detectable by, for instance, vertical Hall sensor elements 180. A ratio of signals may be 40/14=2.9 for M1, 22/8=2.8 for M2, and 16/4=4 for M3. These ratios agree with the offset errors of the horizontal to vertical Hall sensor elements 180. The signal three-times larger may be detected by vertical Hall sensor elements 180 with three-times larger offset error. Thus, it gives the same angle error, which may optimize the overall angle error of the sensor 100. In any case, it may be advisable or interesting to center the sensor 100 around the mid-plane of the magnet (z=0). Then small shifts in the z-direction change only little in the amplitude of the signals. If it is assumed that a dBR/dpsi-signal amplitude of 6 mT and a worst case offset of 15 μT for this gradiometer 110 of horizontal Hall sensor elements 180 is present, it may give a worst case angle error of 15/6000*180/pi=0.14° for a single sensor unit 100. The layout of such a sensor 100 may be identical to the embodiment shown in FIG. 9. The arrangement of a complete sensor composed of four sensor units at 0°, 90°, 180°, 270° is shown in FIG. 26-30. Of course, additional sensor units 100, for instance, midway between the ones shown may also be added, for instance, at additional offset angles of 45° to the previously mentioned angles to further improve the accuracy.

Figure 26:
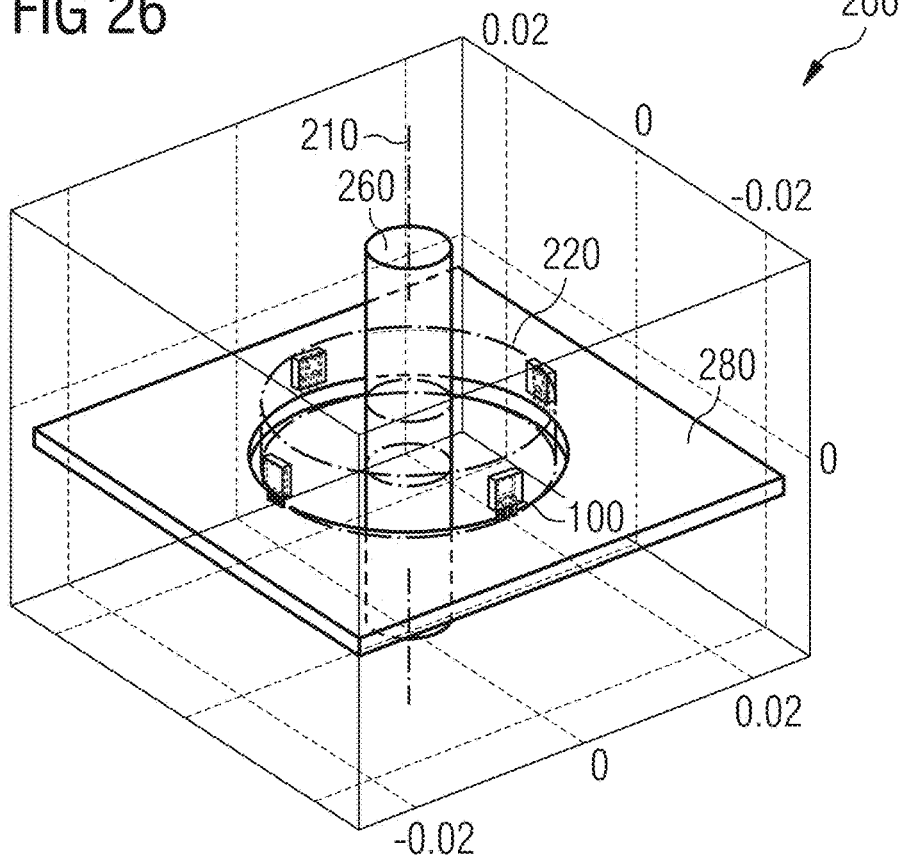
FIG. 26 shows a semitransparent perspective view of a magnetic angle sensor arrangement according to an embodiment in an off-axis configuration.
Figure 27:
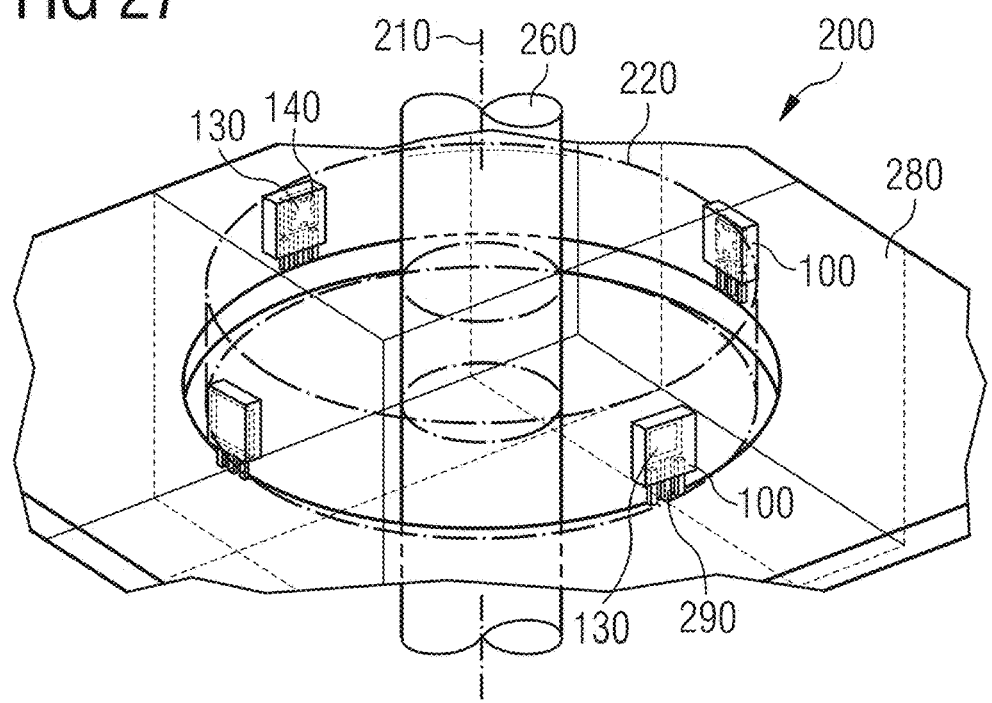
FIG. 27 shows an enlarged part of FIG. 26.

Here, FIG. 26 shows a transparent perspective view of a magnetic angle sensor arrangement 200 as the whole or total system comprising four discrete magnetic angle sensor devices 100. The sensor devices 100 are equidistantly arranged around the rotation axis 210 around which the shaft 260 with the magnet 220 attached to it, may rotate. The magnet 220 is once again arranged as a through-hole magnet 220 with a diametrical magnetization, which leads, essentially to a sinusoidal dependency of the magnetic field components when rotating the magnet 220 around its rotation axis 210. The discrete magnetic angle sensor devices 100 are once again arranged on a carrier plate 280 with their silicon dies 130—as the enlarged portion of FIG. 26 as shown in FIG. 27 shows—facing the rotation axis 210. Although it may be interesting under some conditions that the distance of the sensor elements from the magnet may be minimized, it may also be chosen to place the sensor packages in such a way that the rear side of the die 150 or the die-paddle faces the magnet 220. This may reduce the risk that the sensor die 150 may be damaged by the magnet 220 during rotation if magnet or sensor are displaced laterally by some fault condition during operation. In other words, a line beginning at the rotational axis 210 and radially outward pointing may intersect the main surfaces 140 of the silicon dies 130 perpendicularly.

Figure 28:
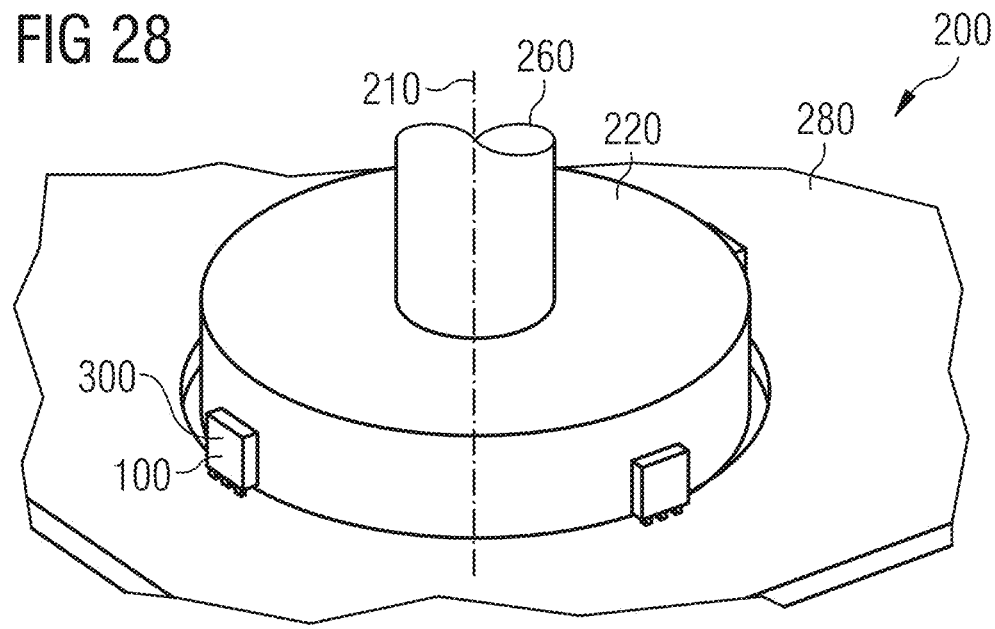
FIG. 28 shows a perspective view of the portion shown in FIG. 27.
Figure 29:
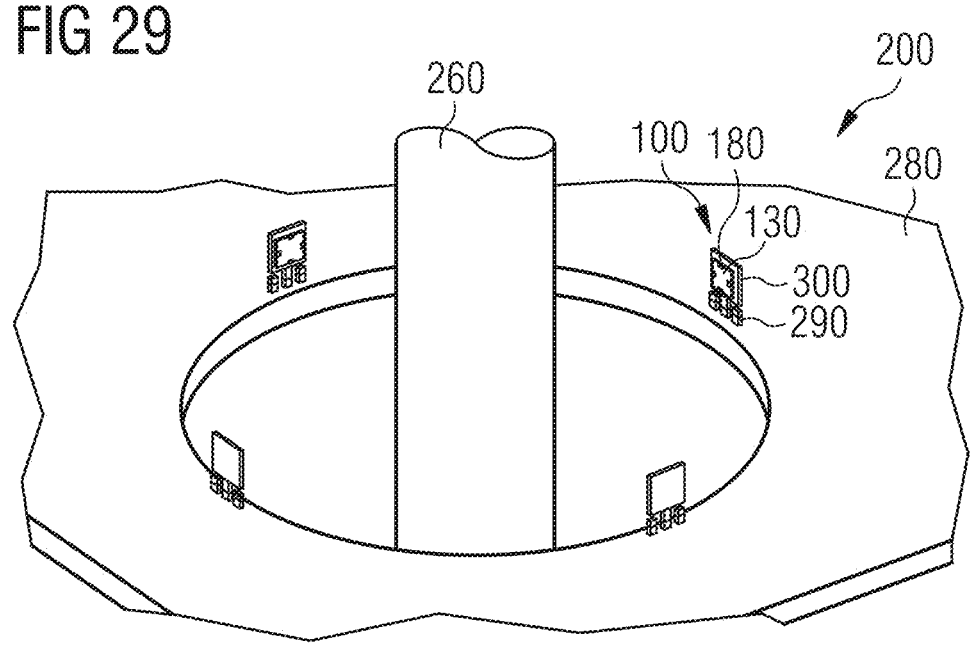
FIG. 29 shows the arrangement of the substrates of the discrete magnetic angle sensor devices of the magnetic angle sensor arrangement of FIGS. 27 and 28.

FIG. 28 shows a solid perspective view of total system of FIG. 27, while FIG. 29 shows the view of FIG. 28 with the magnet 220 and the mold compounds 310 of the discrete magnetic angle sensor devices 100 removed. FIG. 29 illustrates once again that the dies 130 are mounted on a leadframe 300 and coupled via pins 290 to the carrier plate 280. Moreover, FIG. 29 illustrates the positions of the magnetic sensor elements 180.

The magnet 220 is a small magnet, for instance magnet M1 as outlined above. In other words, it may be made from a ferrite with remanence Brem of 0.22 T, an inner diameter of 4 mm, an outer diameter of 12 mm and a thickness of 3 mm.

Figure 30:
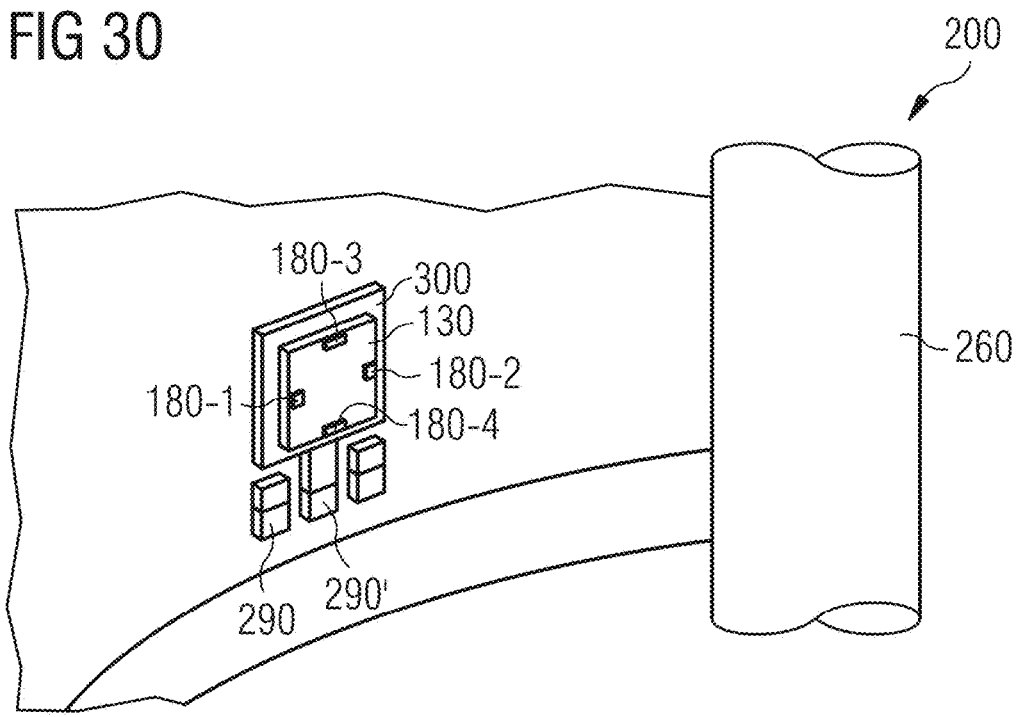
FIG. 30 shows an enlarged perspective view of a substrate of a discrete magnetic angle sensor device of the magnetic angle sensor arrangement according to an embodiment shown in FIGS. 26 to 29.

FIG. 30 shows an enlarged portion of FIG. 29 showing one of the discrete magnetic angle sensor devices 100 along with its die 130. The die 130 is mounted to the leadframe 300 which is connected to the carrier plate 280 by pins 290. For the sake of simplicity, the bond wires are not shown in FIGS. 26 to 30.

As outlined in the context of FIG. 9, the discrete magnetic angle sensor device 100 comprises once again two gradiometers 110 comprising the previously-mentioned four magnetic sensor elements 180-1, . . . , 180-4.

During the assembly of the sensor system or arrangement 200, a gauge may be used, which holds the sensor packages 100 in place during a solder or assembly procedure. Thereby, the sensor packages may eventually be placed with highest possible accuracy with respect to the magnet 220 or at least with respect to the hole in the carrier plate 280 configured to accommodate the magnet 220 afterwards. The carrier plate 280 may be, for instance, a circuit board. The gauge may define the R-, psi-, and z-positions of the sensor dies 130.

The two sensor elements 180-1, 180-2 constituting the dBR/dpsi-gradiometer 110-1 may be implemented as horizontal Hall sensor devices. The two sensor elements 180-3, 180-4 constituting the dBz/dz-gradiometer 110-2 may, for instance, be implemented as vertical Hall sensor elements. Ideally, the horizontal Hall sensor elements 180-1, 180-2 may be in the mid-plane of the magnet 220 (i.e. at z=0). Alternatively, the sensor elements 180-3 and 180-4 may be implemented by AMR-resistor strips with Barber-poles and optional flipping coils and/or field compensation coils across the AMR-resistor strips.

The sensor elements 180 of the gradiometers 110 may be separated from one another by 1.5 mm. With an offset error of, for example, 14 µT for the horizontal Hall sensor elements 180-1, 180-2, in the dBR/dpsi-gradiometer it may be possible to realize an angle error of 0.1°. Similarly, with an offset of, for example, 40 µT for the vertical Hall sensor elements 180-3, 180-4, in the dBz/dz-gradiometer it may also be possible to realize an angle error of 0.1°. In other words, it is a mixed vertical/horizontal Hall sensor system, that might realize a system error of 0.1° if four satellites (discrete sensor devices 100) are used.

Alternatively, one could center the sensor 100 near the z-positions at the maxima of $$1.5\text{mm} \times \frac{dB_R}{dz} \text{ and } 1.5\text{mm} \times \frac{dB_\psi}{dz},$$

which are also in quadrature with respect to the psi-direction. Also the pair $$1.5\text{mm} \times \frac{dB_R}{dz} \text{ and } \frac{1.5\text{mm}}{R} \times \frac{dB_z}{d\psi}$$

may have comparable amplitudes, and they are in quadrature. However, they might suffer from weak signals, which are even weaker than above. Moreover, they might have to be detected by vertical Hall sensor elements 180, whereas the stronger signal $$1.5\text{mm} \times \frac{dB_R}{dz}$$

may be detected by horizontal Hall sensor elements 180. So these systems might need to measure the weak fields with the less appropriate sensor type and this might increases angle errors.

A further embodiment of a sensor arrangement 200 and/or a device 100 according to an embodiment may use a first order gradiometer 110 for dBpsi/dpsi and a second order gradiometer 110 for d²Bpsi/dpsi² at z=0. The gradiometer amplitudes may be small, but AMR-based sensor elements 180 comprising Barber poles, flipping coils and/or compensation coils may be used very well. The AMR sensor elements 180 may be arranged as depicted in FIG. 16, arranged at position z=0. The pairs of sensor elements 180 may be overlapping or their center points may be arranged slightly offset.

Similarly, gradiometers 110 of first and second orders may be used for the psi-direction, the AMR sensor elements 180 of which are tilted by 90° to detect the BR-component. This may allow to use very large magnets 220, leading to very small gradiometer signals. As sensor devices 100 leaded-packages as well as SMD-packages may be used (SMD=surface mountable devices).

Assuming a sensor die 130, the main surface 140 of which is parallel to the (R,z)-plane, which is, for instance, apt for leaded packages. Thus the gradiometers 110 can detect two sorts of slopes directly: d/dR and d/dz for each one of the components BR, Bpsi, Bz. The magnets 220 may be identical, yet the radial positions may be different, because the sensors 100 might not be placed so close to the magnet 220 any more due to package constraints. For instance, it might not be possible to position a Hall device closer than approximately 0.55 mm to the edge of a leaded package, like e.g. PG-SSO-3. Thus, it might be necessary to add 0.25 mm to the radial positions for d/dz-gradiometers 110 and 1.0 mm for d/dR-gradiometers 110 compared to the above given values for tangential die orientation.

The radial position of the sensor may be 7.25 mm and 8.0 mm for M1, 15.75 mm and 16.5 mm for M2, and 32.25 mm and 33 mm for M3. Assuming that the sensors 100 are placed the closest possible way to the magnet 220 (i.e. minimum R-positions), for the magnets M1, M2, M3 the gradients as a function of a distance from a mid-plane as shown in FIGS. 31, 32 and 33 may result.

Figure 31:
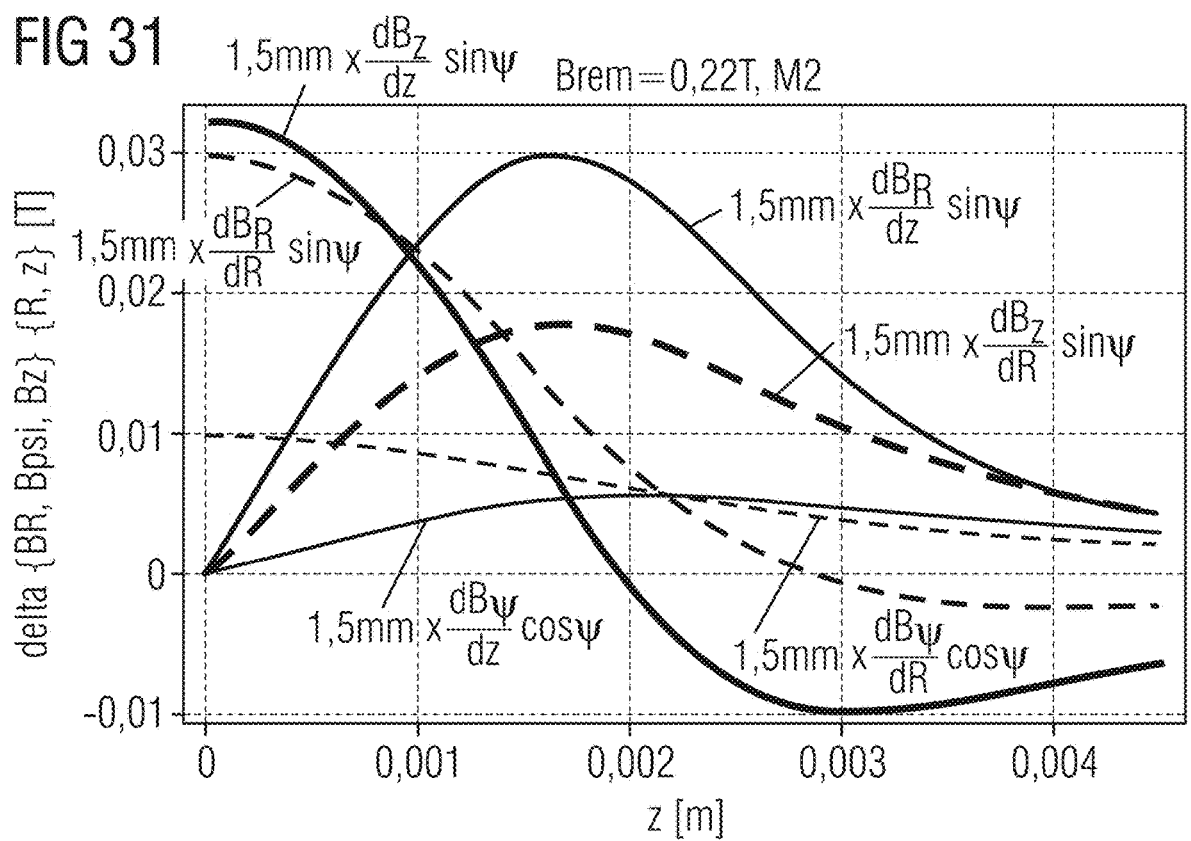
FIG. 31 shows a diagram of different gradients as a function of a distance from a center plane for a magnet M1.
Figure 32:
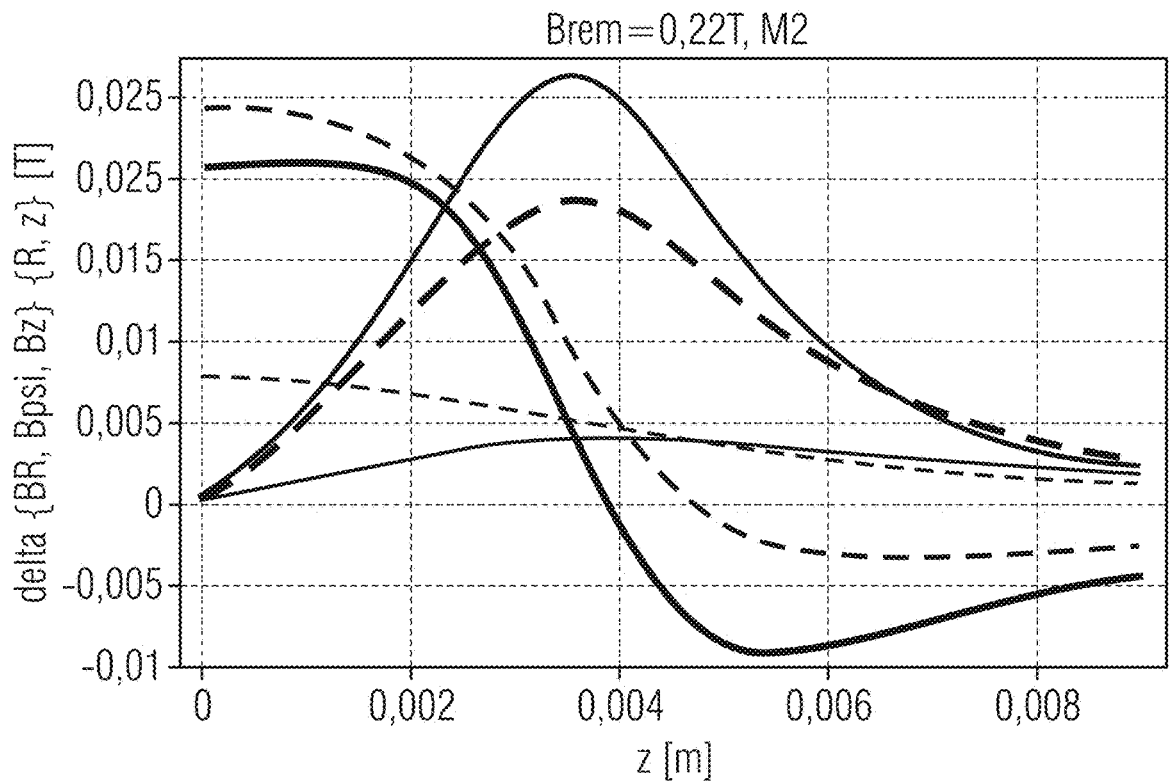
FIG. 32 shows a diagram of different gradients as a function of a distance from a center plane for a magnet M2.
Figure 33:
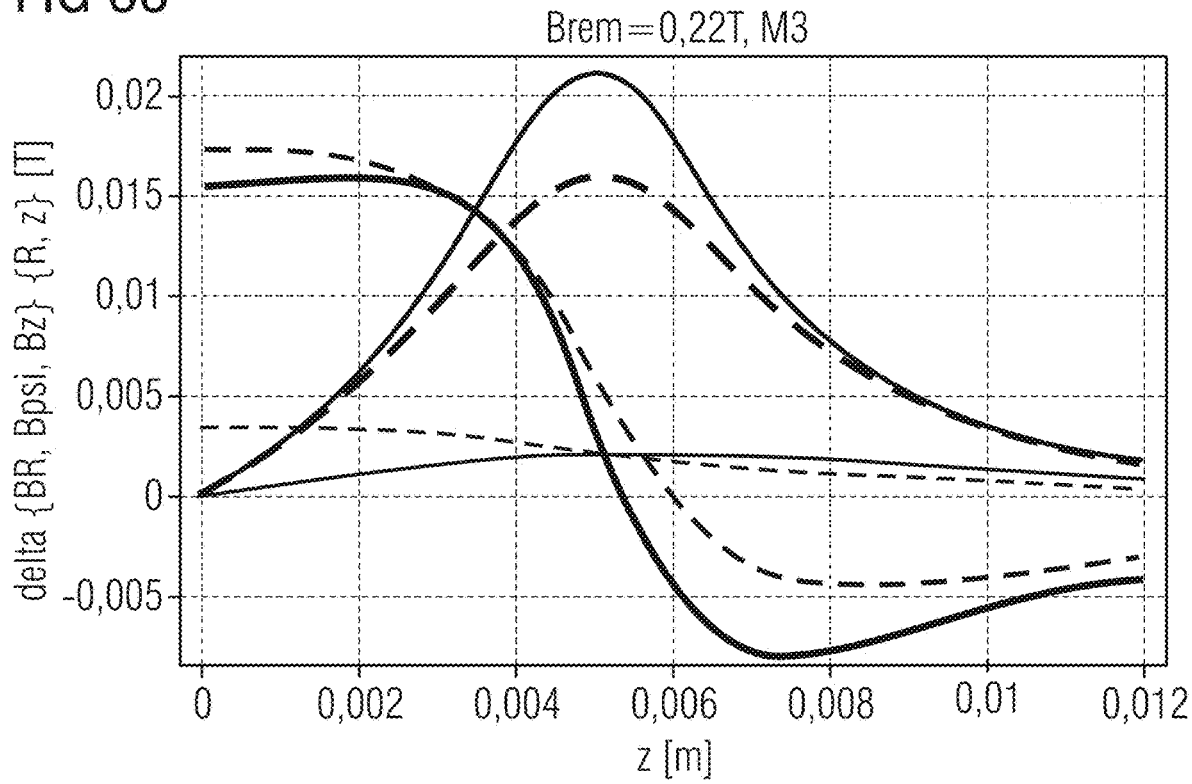
FIG. 33 shows a diagram of different gradients as a function of a distance from a center plane for a magnet M3.

FIGS. 31, 32 and 33 show that there are more strong signals than in the tangential die orientation. However, these curves all have sin(psi)-dependencies. The strongest cos(psi)-signal is $$1.5\text{mm} \times \frac{dB_\psi}{dR} \cos\psi,$$

which calls for z=0 position (mid-plane of magnet) for the sensor devices 100. This component may, however, be detected by horizontal Hall sensors 180. Together with the vertical Hall sensor elements 180, that detect $$1.5\text{mm} \times \frac{dB_z}{dz} \sin\psi \text{ or } 1.5\text{mm} \times \frac{dB_R}{dR} \sin\psi$$

one can implement an angle sensor 100. The magnetic field components detected by the vertical Hall sensor elements 180 may be three- to four-times larger than the components to be detected by the horizontal Hall effect sensors 180, which may be favorable to achieve a good angle accuracy.

However, the difference field for the horizontal Hall sensor element may only be 4 mT for magnet M3. Like in the case of tangential die orientation, one may increase the distance of the gradiometer (in R-direction) in order to improve the smaller amplitude by a factor of 2. Then the signals may become similar like in the case of tangential die orientation.

Figure 34:
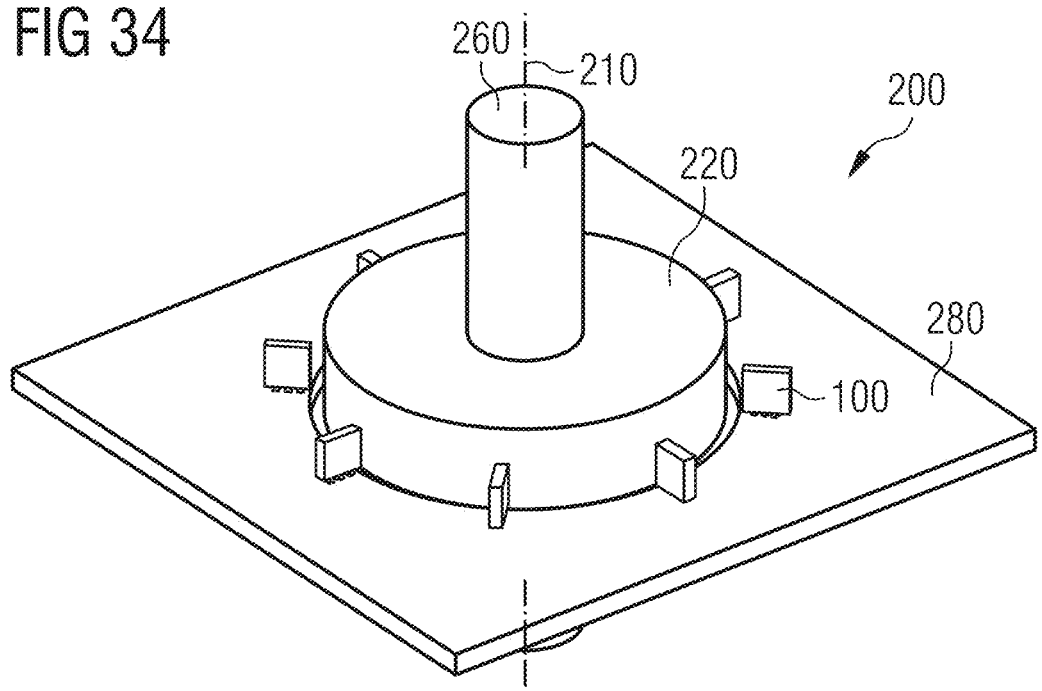
FIG. 34 shows a perspective view of a magnetic angle sensor arrangement according to an embodiment comprising eight discrete magnetic angle sensor devices in an off-axis configuration.
Figure 35:
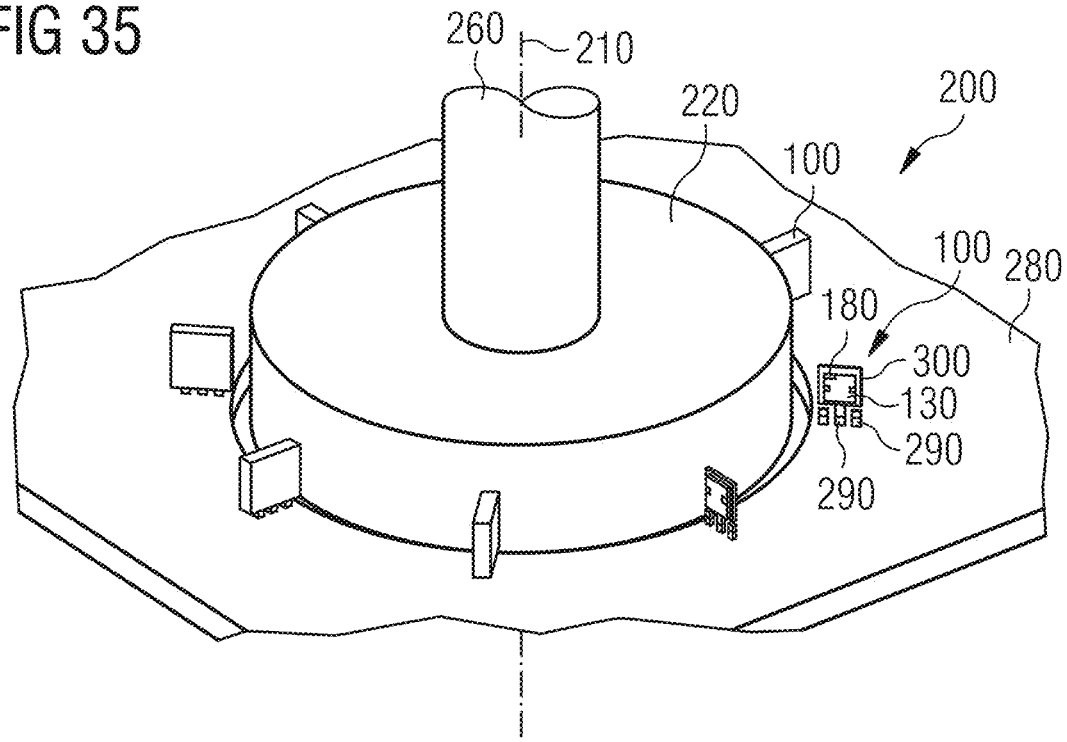
FIG. 35 shows an enlarged perspective view of the magnetic angle sensor arrangement of FIG. 34 with the mold compound removed from two discrete magnetic angle sensor devices.

Layout and arrangement versus magnet 220 of such an arrangement 200 according to an embodiment is shown in FIGS. 34 and 35. Each of the equidistantly distributed eight magnetic angle sensor devices 100 comprise {dBz/dz, dBpsi/dR}-gradiometers 110 as shown in FIG. 22. Like outlined above, the sensor elements 180 may comprise horizontal Hall sensor elements 180 aligned in the mid-plane of the magnet (i.e. at z=0) and vertical Hall sensor elements 180 sensitive to the z-component of the magnetic field Bz. The layout is similar to the one shown in FIG. 22 with the dBz/dz-gradiometer 110 being shifted towards the magnet 220.

This layout could also be used for the tangential die orientation discussed above—so it might be possible to implement this layout more generally than the original layout of the embodiment shown in FIG. 9. The FIGS. 34 and 35 show eight discrete magnetic angle sensors 100 positioned at integer multiples of 45°, yet more or less discrete sensors 100 may also be possible, which might lead to a higher or lower accuracy. The magnet 220 may be magnetized in a diametrical direction.

The size of the complete angle sensor arrangement 200 may be slightly larger, because the sensor packages 100 are aligned in radial direction (6 mm in diameter). Perhaps this is not relevant in practice, because the circuit board 280 itself might need a certain width for structural stability.

Figure 36:
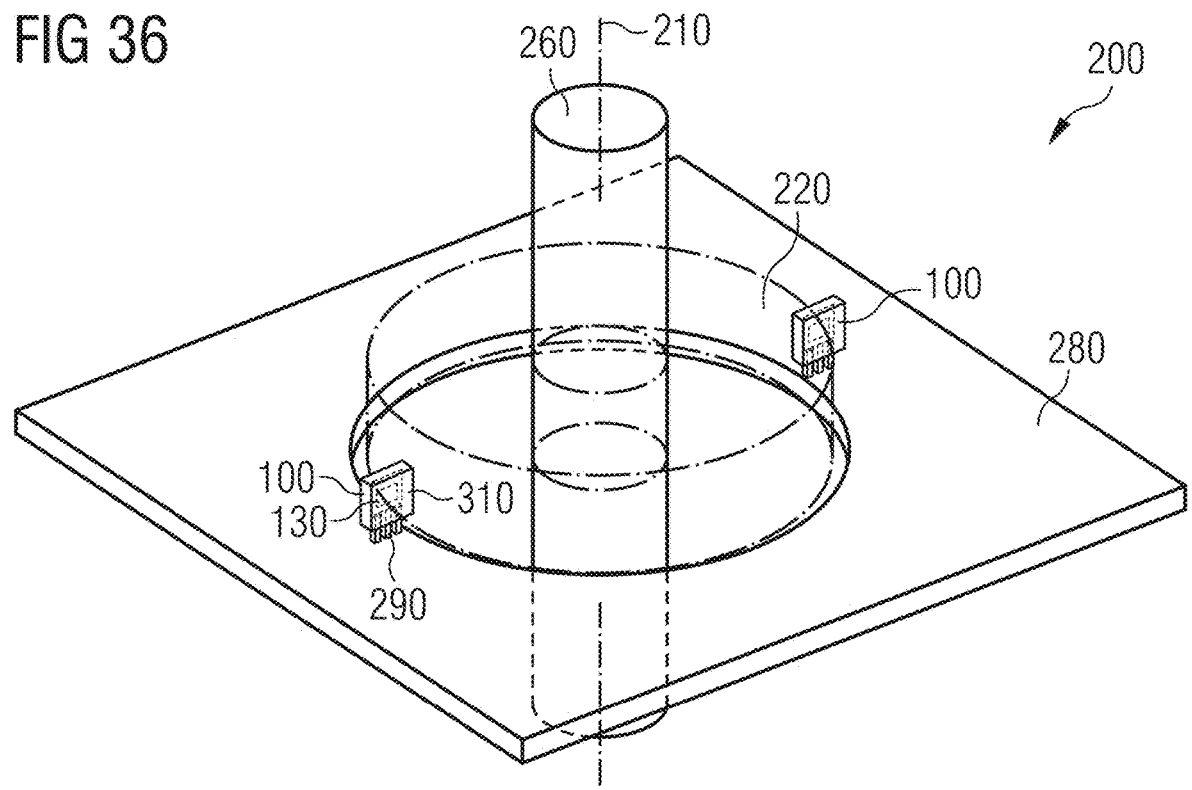
FIG. 36 shows a semi-transparent perspective view of a magnetic angle sensor arrangement according to an embodiment comprising two discrete magnetic angle sensor devices in an off-axis configuration.
Figure 37:
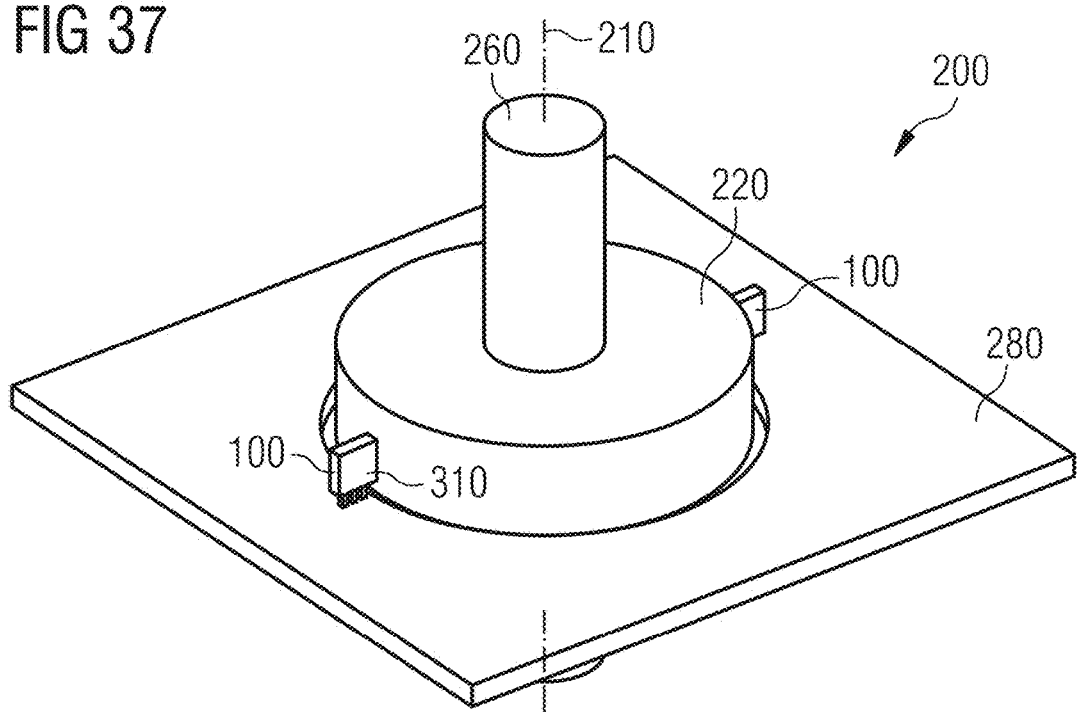
FIG. 37 shows a solid perspective view of the magnetic angle sensor arrangement of FIG. 36.
Figure 38:
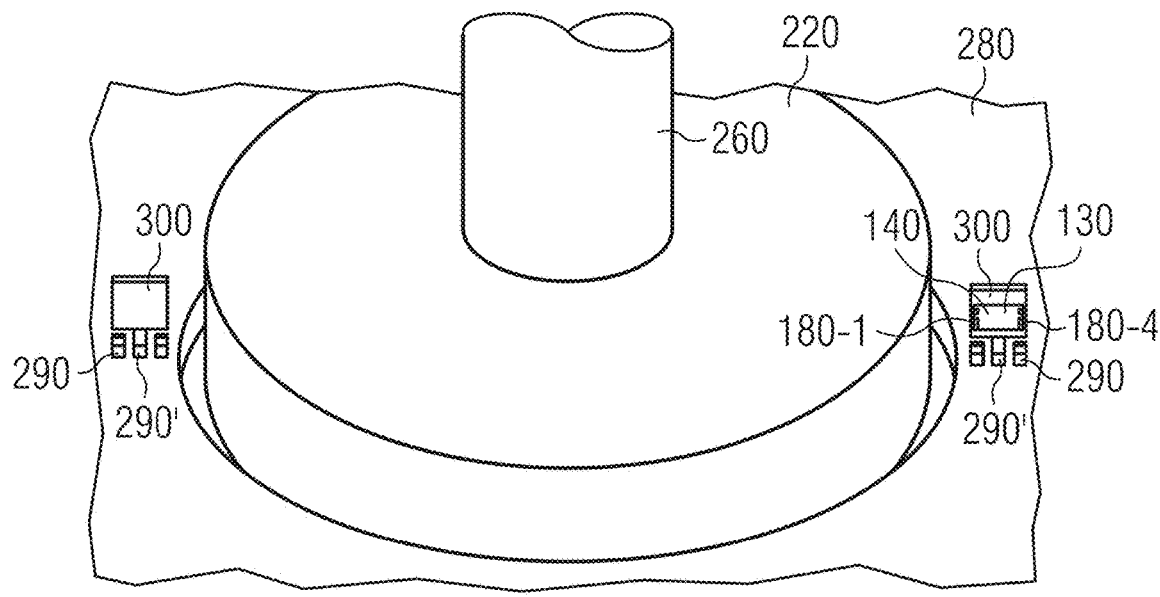
FIG. 38 shows an enlarged view of the magnetic angle sensor arrangement as shown in FIGS. 36 and 37 with the mold compounds removed from the discrete magnetic angle sensor devices.

An alternative version of a magnetic angle sensor arrangement 200 is shown in FIGS. 36, 37 and 38 comprising two discrete magnetic angle sensor devices 100 according to an embodiment. The arrangement 200 uses {dBR/dR, dBpsi/dR}-gradiometers 110, which results in a layout similar to those shown in FIGS. 10 and 11, but with gradiometers 110 separated from each other along the z-direction. This layout might enable both types of sensor elements 180 being spaced apart along the same direction, here the radial direction, so that for a given die size, the longer edge of the die 130 may be radially arranged. This increased R-spacing might give larger signals and smaller errors. The magnet 220 is again diametrically magnetized. The sensor system or arrangement 200 may comprise only two sensor units 100 at opposite sides of the magnet. Using two satellites or discrete sensor devices 100 diametrically arranged at positions offset by 180°, may already strongly reduce angle errors caused by an eccentricity of the magnet 220 with respect to the rotation axis 210. Using an even number of discrete sensor devices 100 may allow placing them such that to each discrete sensor device 100 with respect to the rotation axis, a diametrically placed discrete sensor device 100 exists. In other words, with an integer L indicative of the number of discrete sensor devices 100, it might be favorable under at least some circumstances to use an even number. This may allow a more efficient way of canceling out eccentricity errors caused, for instance, by the magnet or a carrier of the discrete sensor devices 100. However, also an odd number of discrete sensor devices 100 (L) may be advisable to implement under some circumstances.

In FIG. 38 the mold compound 310 is removed. The first gradiometer 110-1 comprises the two magnetic sensor elements 180-1, 180-2, which may be implemented as horizontal Hall sensor elements, which detect the magnetic field components 120 perpendicular to the die surface 140 (i.e. Bpsi). The second gradiometer 110-1 comprises the magnetic sensor elements 180-3, 180-4, which may be implemented as vertical Hall sensor elements, which detect the radial magnetic flux component BR. They may be shifted in axial direction (i.e. z-direction) slightly in order not to overlap. However, it is also possible to place them on the same z-position and shift them slightly along the R-direction. FIG. 38 shows that both sensor elements 180 may be oriented in the same azimuthal direction (e.g. in clockwise direction), yet one of them may also be rotated by 180° around its symmetry axis going through the center pin so that eventually one sensor is oriented clockwise and the other one counterclockwise. This may lead to simpler layout on the circuit board.

Based on the assumption that the magnetic sensor elements 180 of the gradiometers 110 separated from one another by a distance of 1.5 mm along the gradiometer directions, with an offset error of 9.5 µT for the horizontal Hall sensor elements for the dBR/dpsi-gradient, an angle error of approximately 0.1° may be achievable. With an offset error of 15 µT for the vertical Hall sensor elements for the dBz/dz-gradient, an angle error of 0.3° may be achievable, yielding a total error of approximately 0.2° for this 2 satellite mixed vertical/horizontal Hall element system.

For a system comprising 8 or 12 mixed vertical/horizontal Hall element satellites with a distance of 1.5 mm of the magnetic sensor elements 180 of the gradiometers 110 along the gradiometer directions, with a small magnet (e.g. M1) and an offset error of 9.5 µT a for the horizontal Hall sensor elements for dBpsi/dR, an angle error of 0.1° may be achievable. Similarly, for the vertical Hall sensor elements with an offset error of 32 µT for the dBz/dz-gradient or 30 µT for the dBR/dR-gradient, an angle error of 0.1° may be achievable, yielding a system error of 0.1°.

Figure 39:
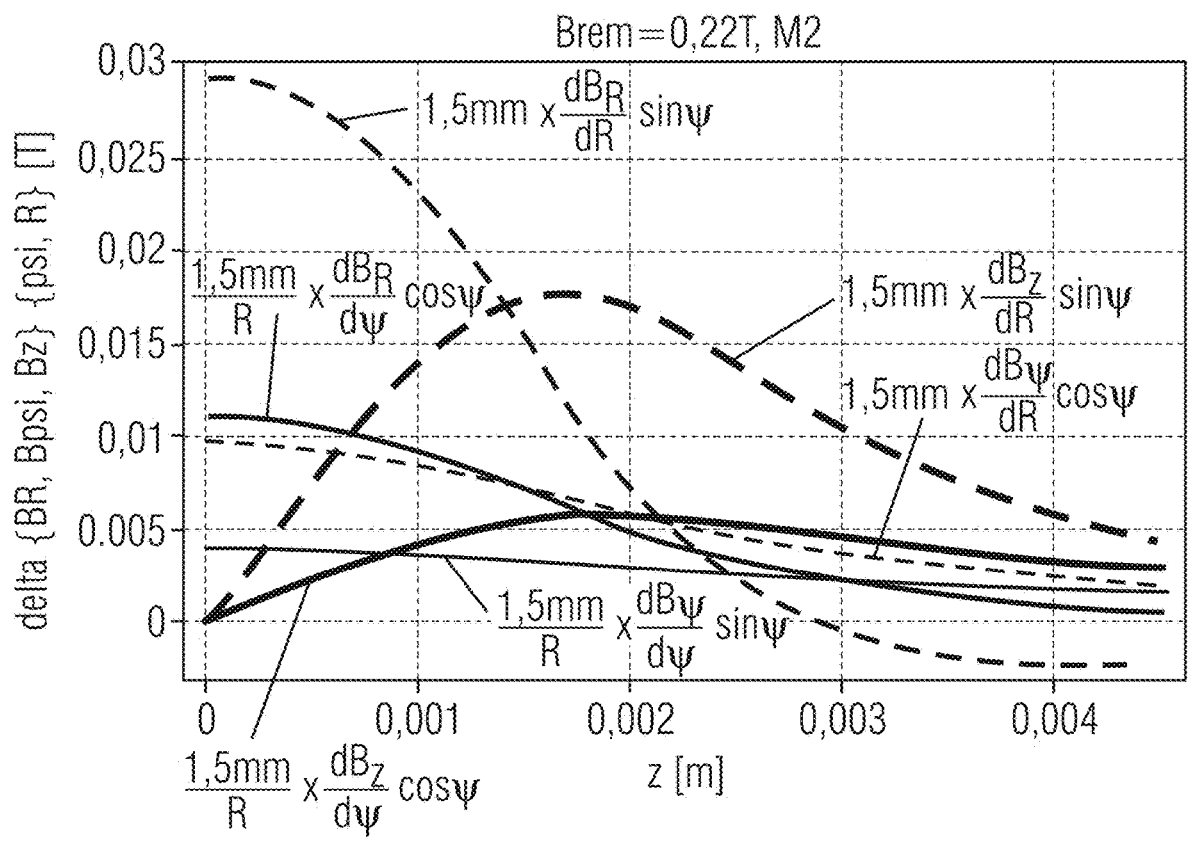
FIG. 39 shows a diagram of different gradients as a function of a distance from a center plane for a magnet M1.
Figure 40:
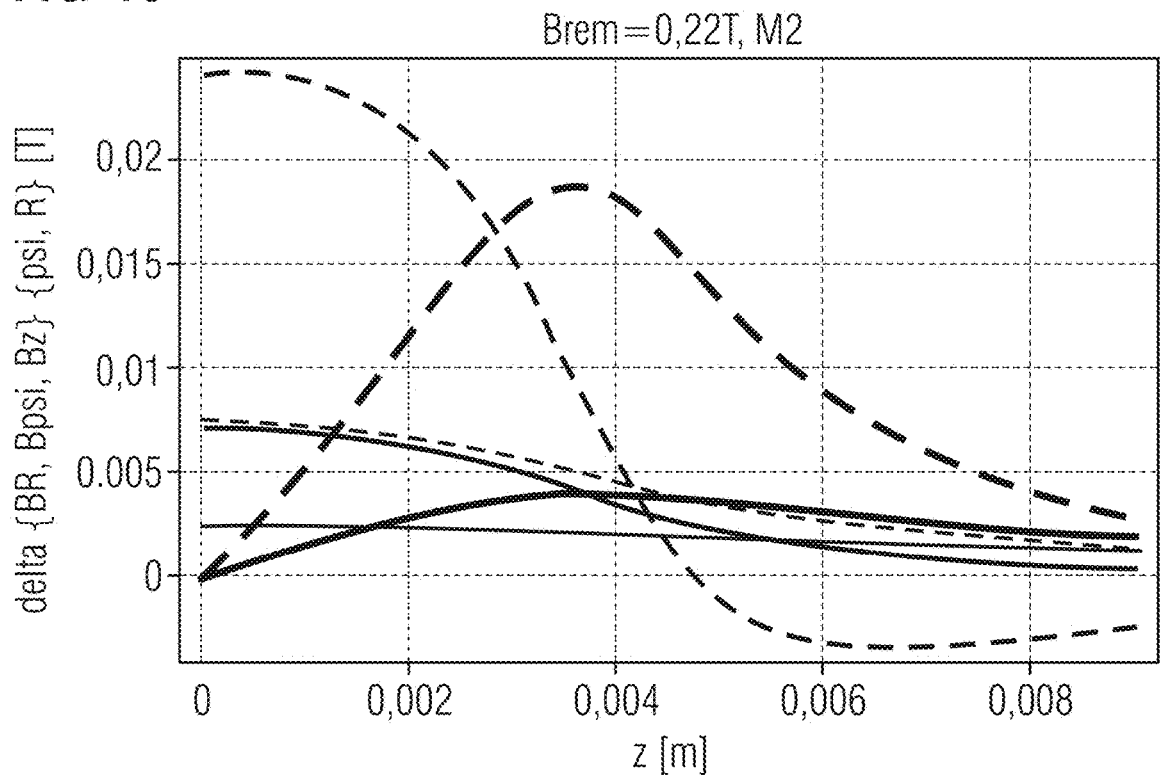
FIG. 40 shows a diagram of different gradients as a function of a distance from a center plane for a magnet M2.
Figure 41:
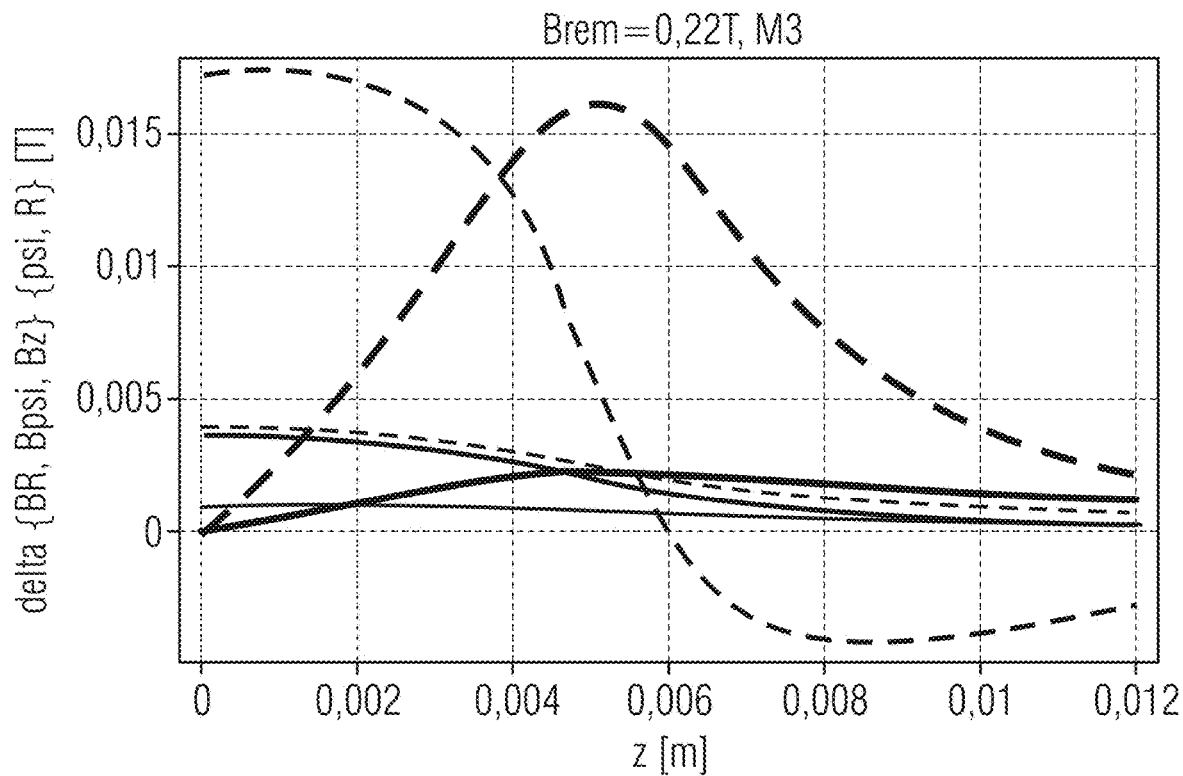
FIG. 41 shows a diagram of different gradients as a function of a distance from a center plane for a magnet M3.

Finally, an embodiment assumes a sensor die 130, the main surface 140 of which is parallel to the (R,psi)-plane and which is apt for SMD-packages, FIGS. 39, 40 and 41 show different gradients as function of a distance from a mid-plane for different magnets 220. Thus, the gradiometers 110 may be able to detect two sorts of slopes directly: d/dR and d/dpsi for each one of the components BR, Bpsi, Bz. The magnets 220 are assumed to be identical to the above discussed magnets M1, M2 and M3. Moreover, the radial positions are identical to the last case for the d/dR-gradiometers 110, whereas the d/dpsi-gradiometers may need radial positions like the d/dz-gradiometers previously discussed.

The radial positions of the sensor elements 180 are 7.25 mm and 8.0 mm for M1, 15.75 mm and 16.5 mm for M2 and 32.25 mm and 33 mm for M3. Assuming that the discrete sensors 100 are placed the closest possible way to the magnet 220 (i.e. minimum R-position), for the magnets M1, M2, M3 the gradients as a function of a distance from the mid-plane are shown in FIGS. 39, 40 and 41.

There are again two large signals, which are in phase:

$$1.5\text{mm} \times \frac{dB_R}{dR}\sin\psi \text{ and } 1.5\text{mm} \times \frac{dB_z}{dR}\sin\psi.$$

At z=0, embodiments may utilize $$1.5\text{mm} \times \frac{dB_R}{dR}\sin\psi$$

and, as cosine-signal, either $$\frac{1.5\text{mm}}{R} \times \frac{dB_R}{d\psi}\cos\psi \text{ or } 1.5\text{mm} \times \frac{dB_\psi}{dR}\cos\psi.$$

However, both options may not yield the best results, because they might favor vertical Hall sensor elements 180. This might give larger angle errors than the arrangements discussed above.

However, it may also be possible to place the sensors 100 next to the shaft 260, but below or above the magnet 220. This may avoid large radial distances, and thus increase dpsi=1.5 mm/R for the azimuthal gradiometer 110. For instance, for a magnet 220 having an inner diameter of 6 mm, an outer diameter of 30 mm, a thickness of 8 mm and an iron shaft 260 through it with a relative permeability of $\mu_r$ of 1000 or more, it may be possible to increase the signal strength. The magnet is characterized by a remanence Brem=0.22 T, $\mu_r$(recoil)=1.5.

Figure 42:
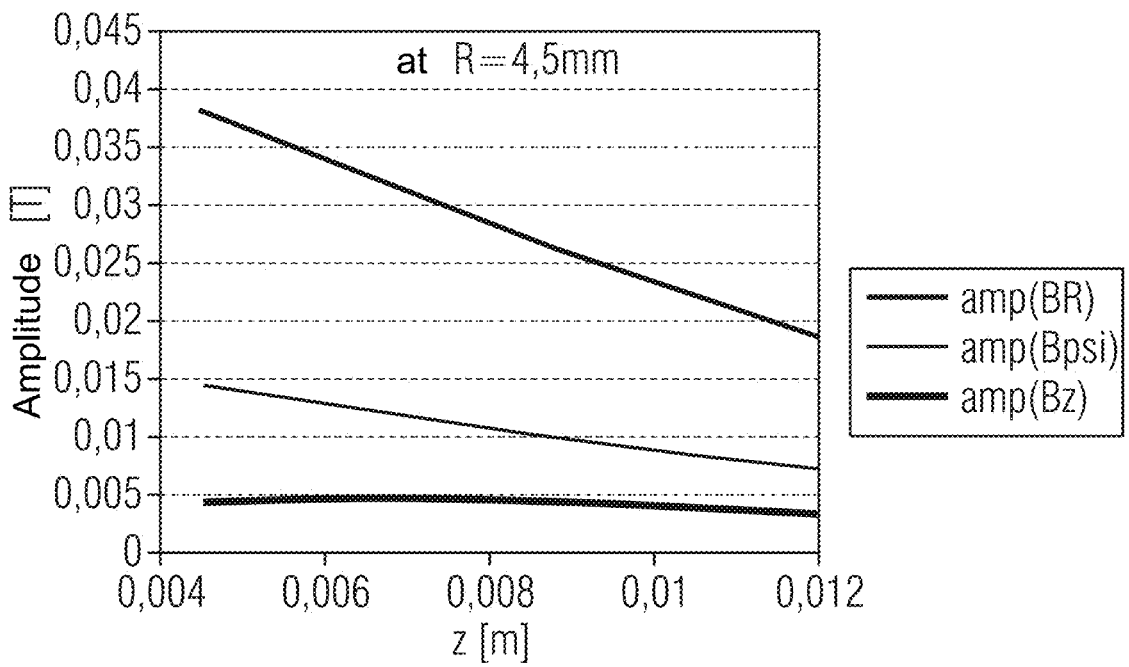
FIG. 42 shows a diagram illustrating an amplitude as a function of a distance along the z-direction at a radial distance of 4.5 mm.
Figure 43:
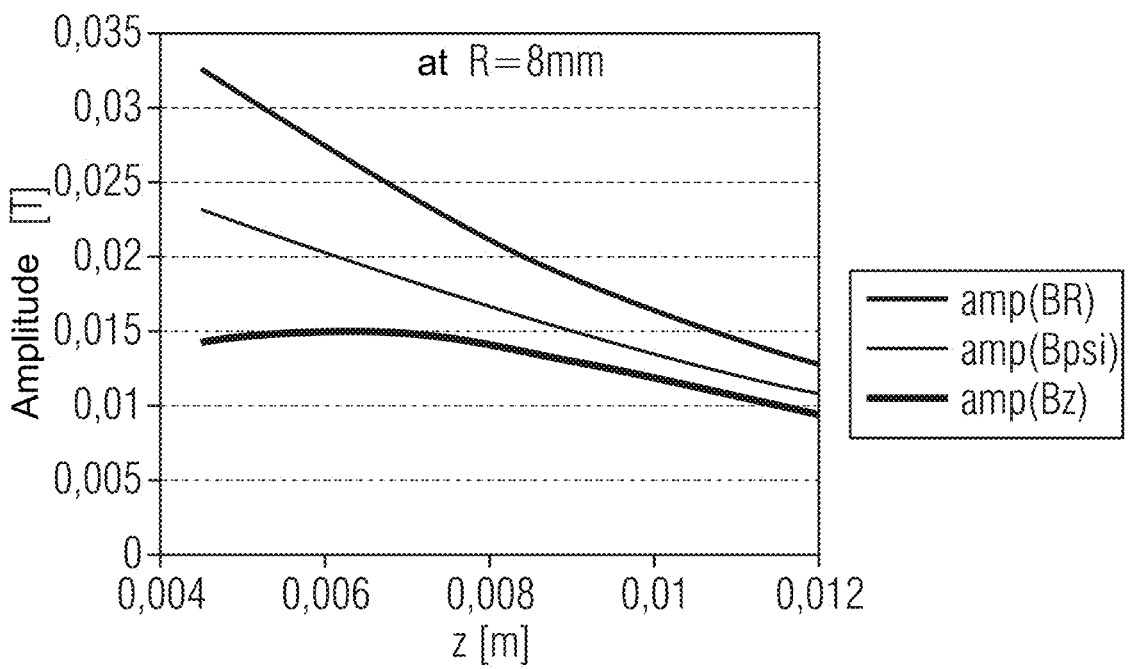
FIG. 43 shows a diagram illustrating an amplitude as a function of a distance along the z-direction at a radial distance of 8 mm.
Figure 44:
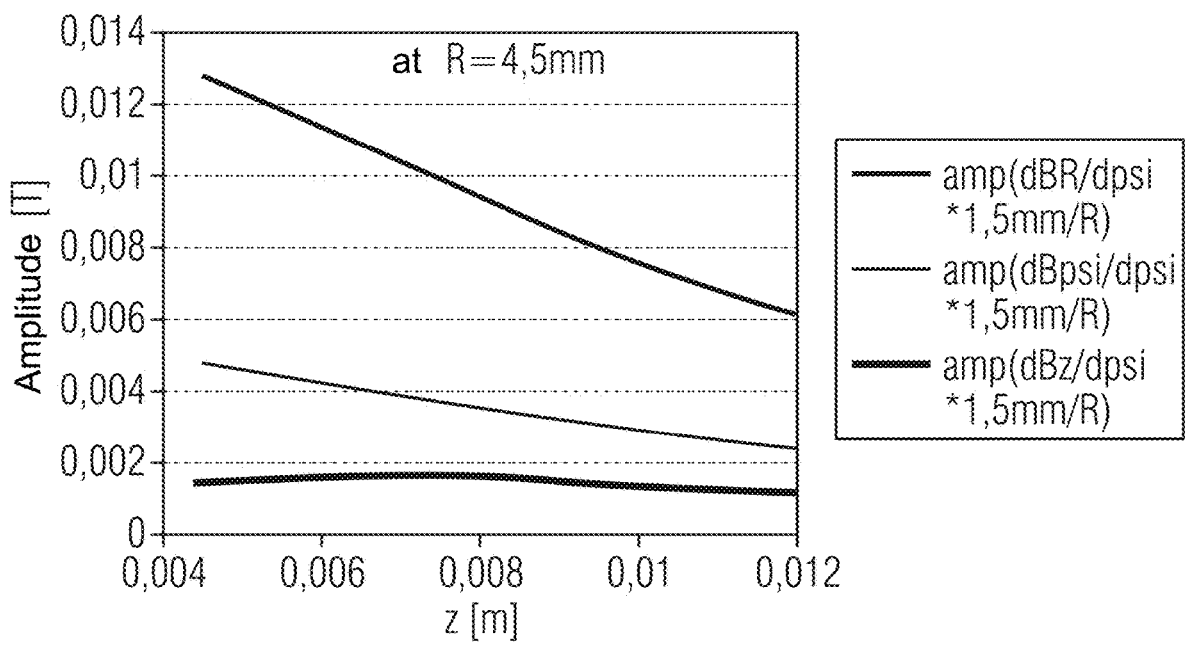
FIG. 44 shows a diagram of amplitudes of a gradiometer output as a function of the z-direction for a radial distance of 4.5 mm.
Figure 45:
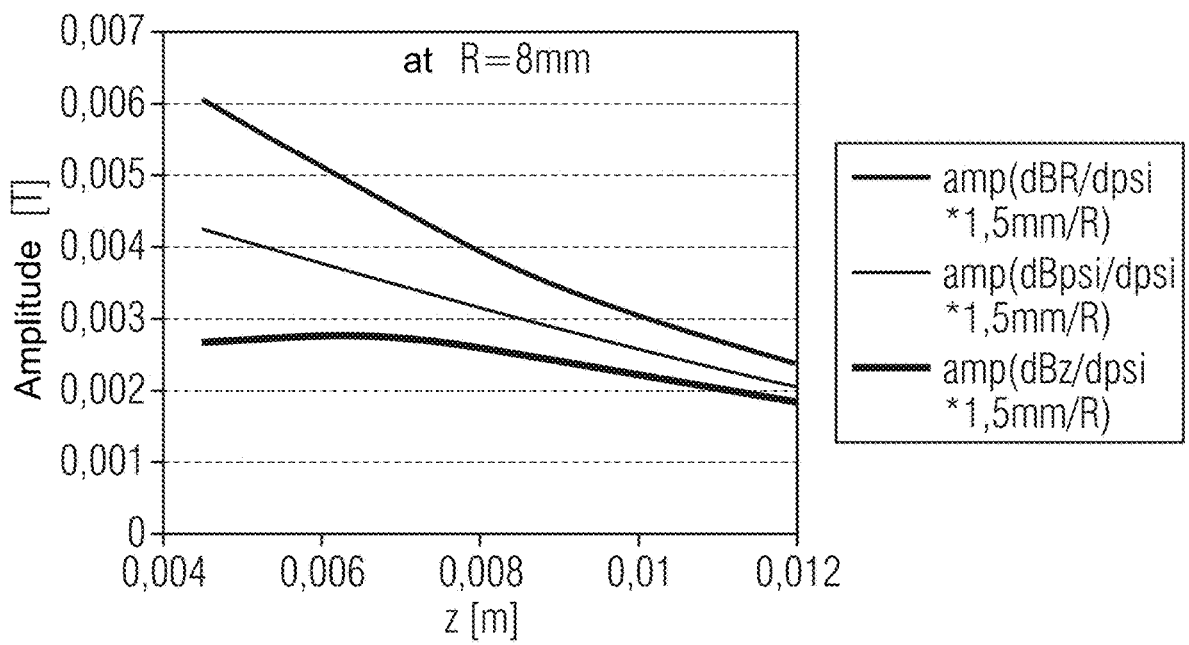
FIG. 45 shows a diagram of amplitudes of a gradiometer output as a function of the z-direction for a radial distance of 8 mm.
Figure 46:
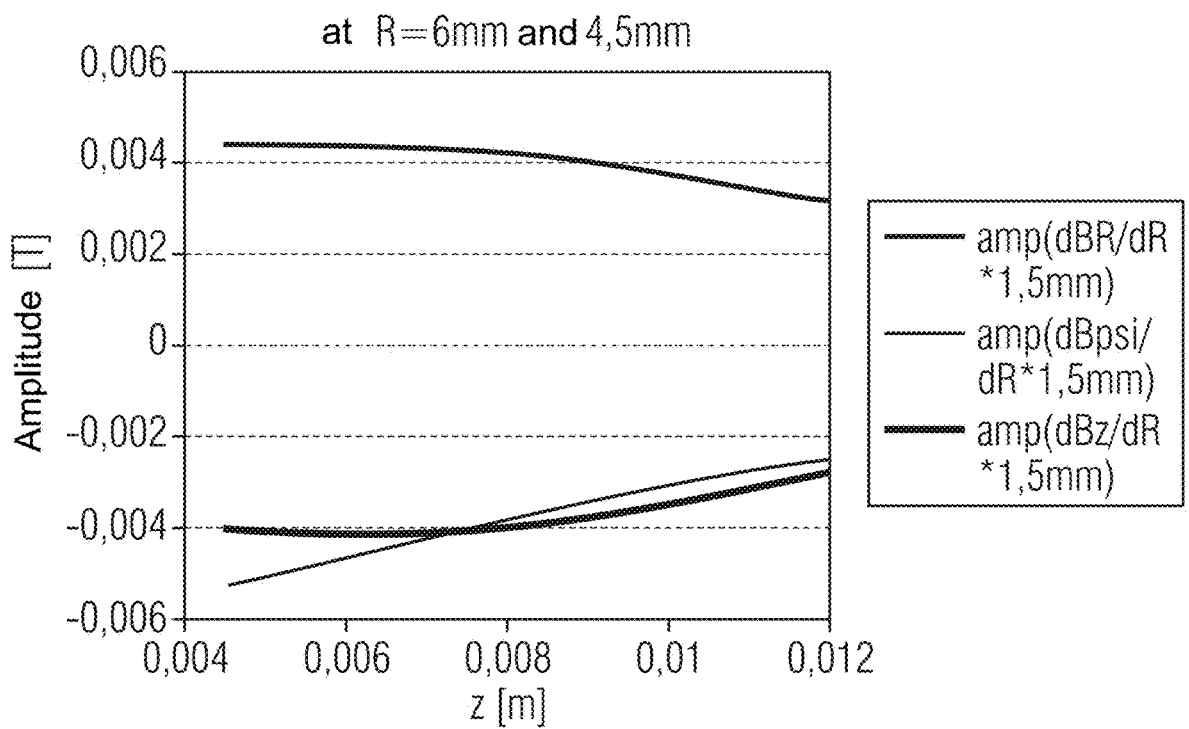
FIG. 46 shows a diagram of amplitudes of gradiometer outputs along the radial direction taken as differences at the radial distances of 6 mm and 4.5 mm as a function of a distance along the z-axis.
Figure 47:
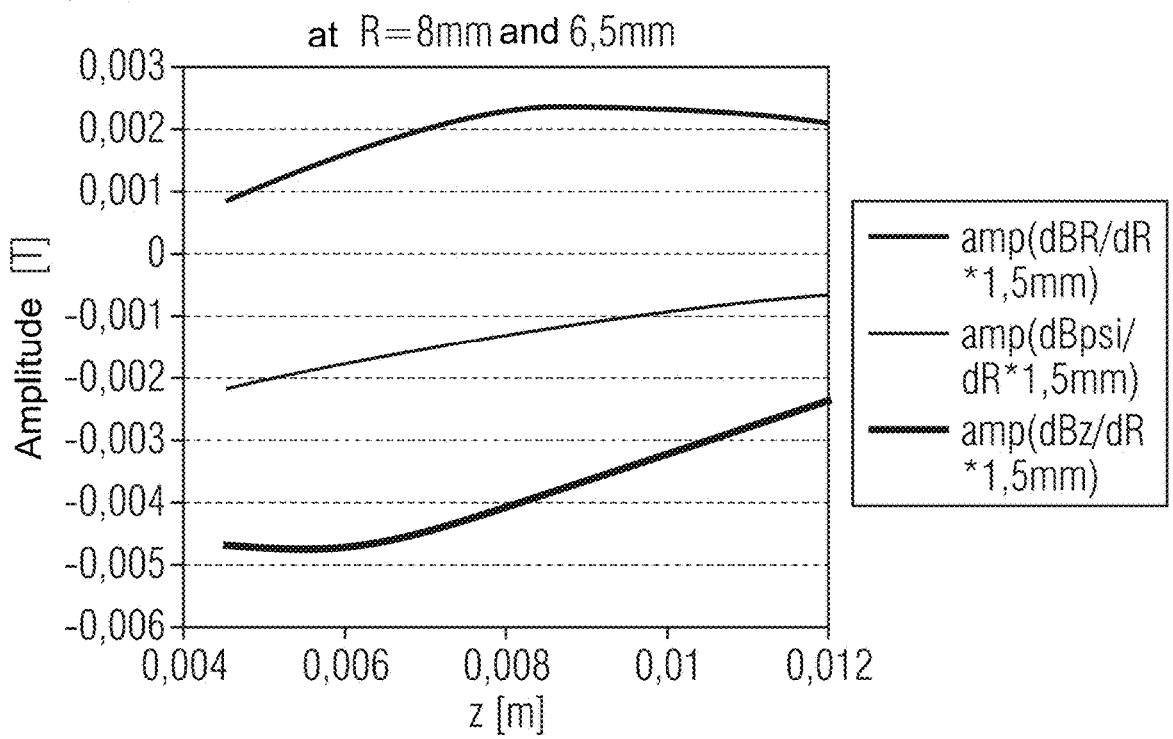
FIG. 47 shows a diagram of amplitudes of gradiometer outputs along the radial direction taken as differences at the radial distances of 8 mm and 6.5 mm as a function of a distance along the z-axis.

The BR-field may be strong near the shaft 260, but also at larger radial distances. Yet the Bpsi- and Bz-fields may be strong only when the position is not too close to the shaft 260, since the shaft might short the field lines, as illustrated in FIGS. 42 and 43 for radial positions of 4.5 mm and 8 mm, respectively. The gradiometer outputs along the psi-direction are comparably weak, except for dBR/dpsi close to the shaft 260, as illustrated in FIGS. 44 and 45 for the two radial distances mentioned before. FIGS. 46 and 47 finally show the gradiometer outputs along the R-direction for 1.5 mm-gradiometers located at R=4.5 mm and 6.5 mm, respectively, with the second sensor element 180 of the gradient 110 being placed 1.5 mm further outwards. Their output is also comparably weak.

Both Bpsi/dR and dBR/dpsi dependencies are comparably strong for small radial distances. However, they are both cos(psi)-functions.

However, it might be a better solution to use the pair of gradients {dBR/dpsi, dBz/dR} of two gradiometers 110. As outlined in context of FIG. 39, they might have cosine and sine dependencies versus angle psi and their amplitudes are approximately 13 mT and 4 mT, respectively, whereby the weaker signal might be detected by horizontal Hall sensor elements, if the package is an SMD-type as shown in FIGS. 48-51.

Figure 48:
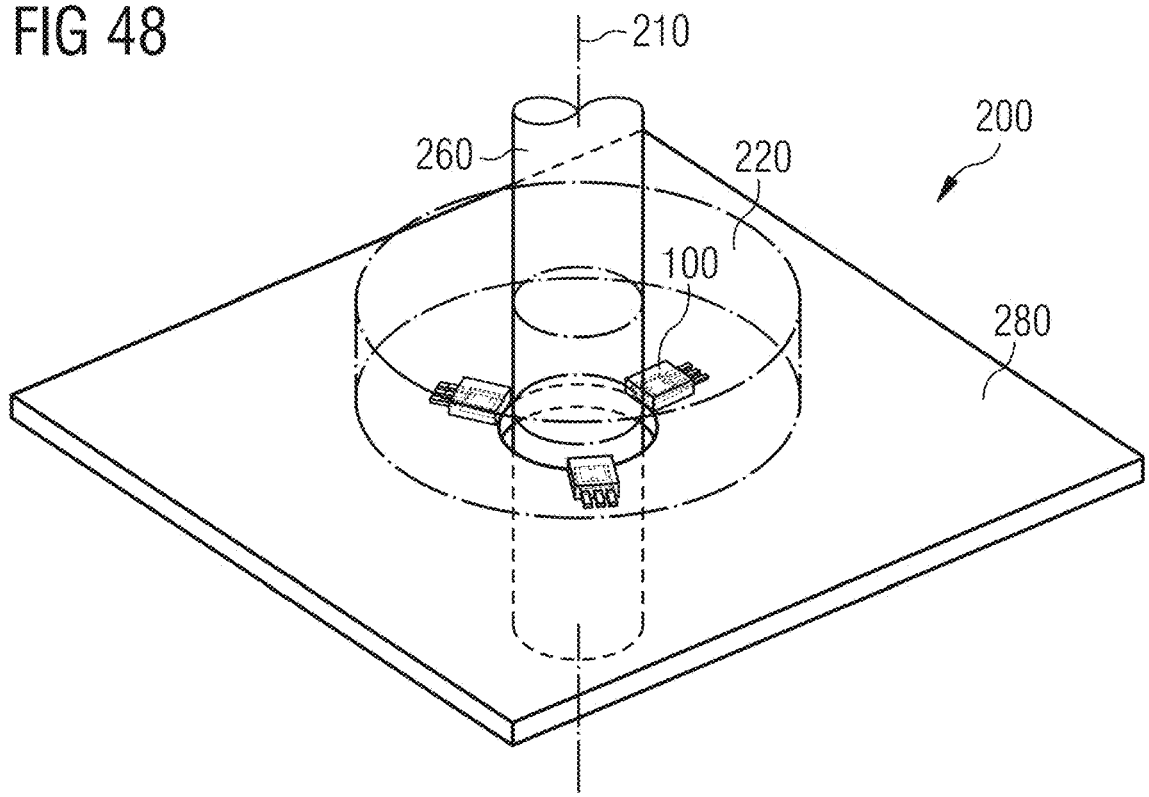
FIG. 48 shows a transparent perspective view of a further magnetic angle sensor arrangement comprising three SMD-type discrete magnetic angle sensor devices according to an embodiment in an off-axis configuration.
Figure 49:
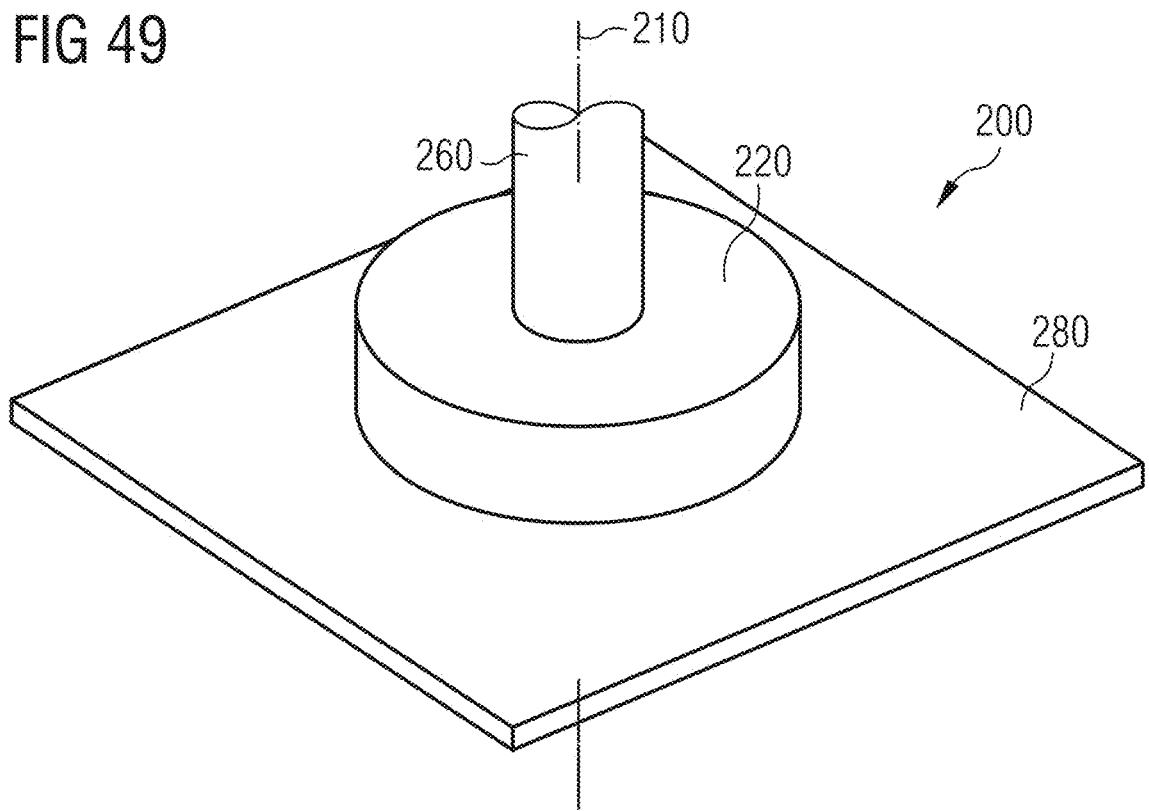
FIG. 49 shows a solid perspective view of the magnetic angle sensor arrangement of FIG. 48.
Figure 51A:
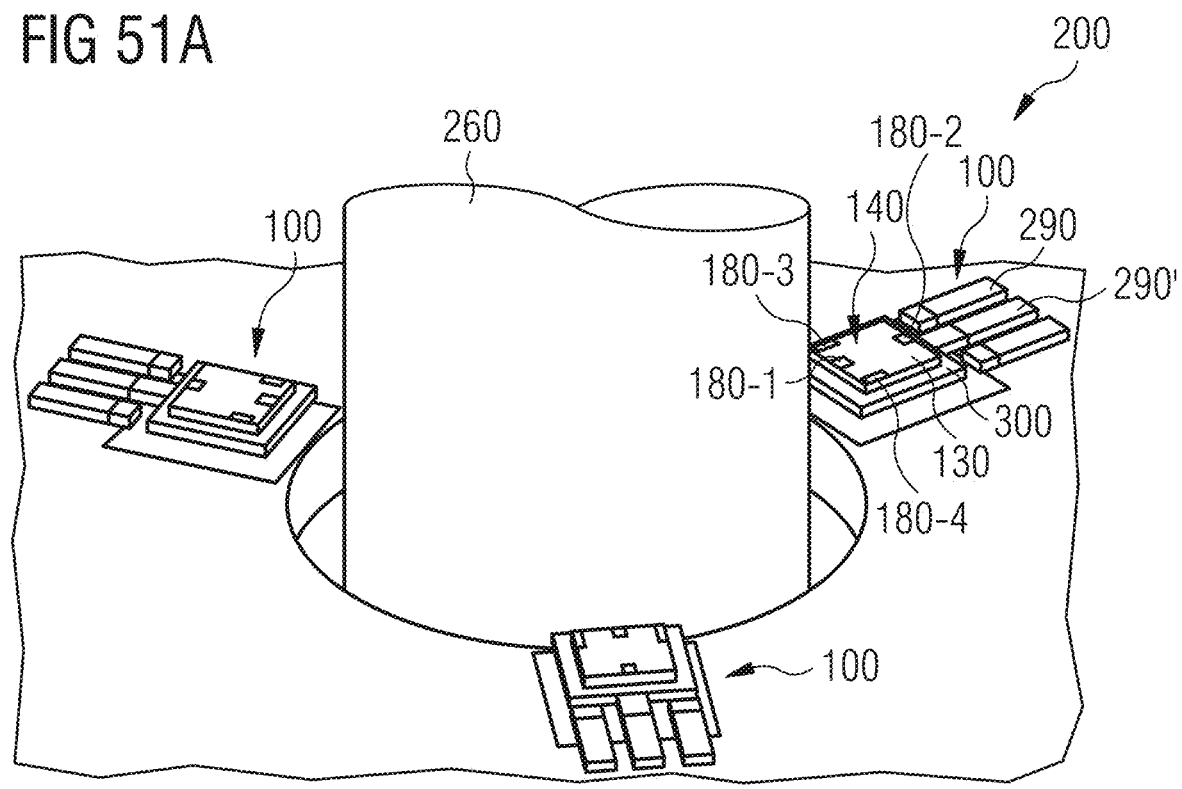
FIG. 51a shows an enlarged perspective view of the magnetic angle sensor arrangement shown in FIGS. 48 to 50 with the mold compounds removed from the discrete magnetic angle sensor devices.
Figure 51B:
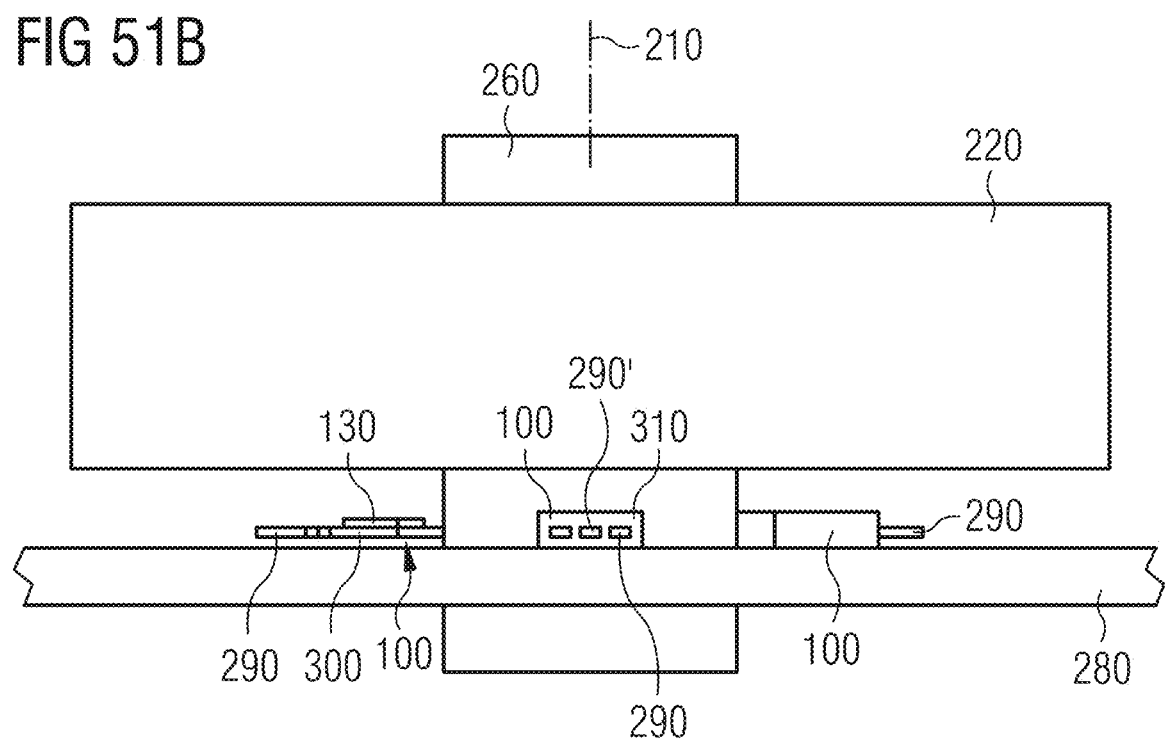

FIGS. 48 and 49 show perspective view of a magnetic angle sensor arrangement 200 according to an embodiment comprising three equidistantly arranged discrete magnetic angle sensor devices 100 as surface-mounted devices (SMD) arranged on a carrier plate 280 which may be, for instance, implemented as a printed circuit board. The magnet 220 is once again implemented as a through-hole magnet 220 mechanically fixed to a shaft 260. However, the discrete magnetic angle sensor devices 100 are, arranged along the rotation axis 210 between the magnet 220 and the carrier plate 280, as also shown in FIG. 51b.

FIG. 50 shows a perspective view of the magnetic angle sensor arrangement 200 with the magnet 200 removed. FIG. 50 illustrates that the discrete magnetic angle sensor devices 100 comprise a mold compound 310, which has been removed to offer an insight into the inner structure of the discrete magnetic angle sensor devices 100 in the enlarged perspective view of FIG. 51a. FIG. 51a illustrates once again that the discrete magnetic angle sensor devices 100 comprise a sensor die 130 with a main surface 140 onto which the magnetic sensor elements 180 are provided. The die 130 is mounted onto a leadframe 300 coupled to three pins 290, where—for the sake of simplicity—the bond wires are once again not shown in FIG. 51a. A central pin 290 is coupled to the leadframe 300 providing, for instance, a ground potential for the discrete magnetic angle sensor device 100. Naturally, the number of pins 290 may be chosen differently from three in this embodiment as well as the previously-described embodiments and the embodiments described below. Moreover it is also possible to reverse the orientation of the sensor packages, so that the die is placed face-down and the die-paddle of the leadframe faces the moving magnet. This might be more reliable if the air-gap between moving magnet and sensor package is small, because then the sensor die is protected not only by the mold compound but also by the die paddle from the moving magnet.

The pins 290 of the sensor packages 100 may be bent towards a surface of the circuit board 280, where they may be soldered to copper traces. However, this bending is not shown in FIGS. 48-51. Instead of a package 100 with all pins 290 on a single side, one may also use conventional SMD-packages with pins 290 on opposite sides. It is also possible to use VQFN types of packages, which have no leads standing off the package body, but only lands or pads or gull-wings. Hence, instead of pins 290 also other coupling structures may be implemented to mechanically and/or electrically couple the discrete sensor devices 100 to a system. In other words, the term "coupling structure" serves as a summarizing term for all these structures including the pins 290, which may be fully or partially replaced in embodiments by appropriate coupling structures.

The shaft may be non-magnetic ($\mu_r$=1) or ferrous ($\mu_r$>1000). The magnet 220 may be magnetized in diametrical direction. The system comprises three sensor units 100 placed at integer multiples of 120° around the shaft 260. A gap between the sensor packages 100 and the bottom surface of the magnet 220 may be chosen to be about 1 mm. The sensor elements 180-1, 180-2 on the die 130 may be implemented as horizontal Hall sensor elements detecting the Bz-component, whereas the sensor elements 180-3, 180-4 on the die 130 may be implemented as vertical Hall sensor elements, that detect Bpsi-components.

Figure 52:
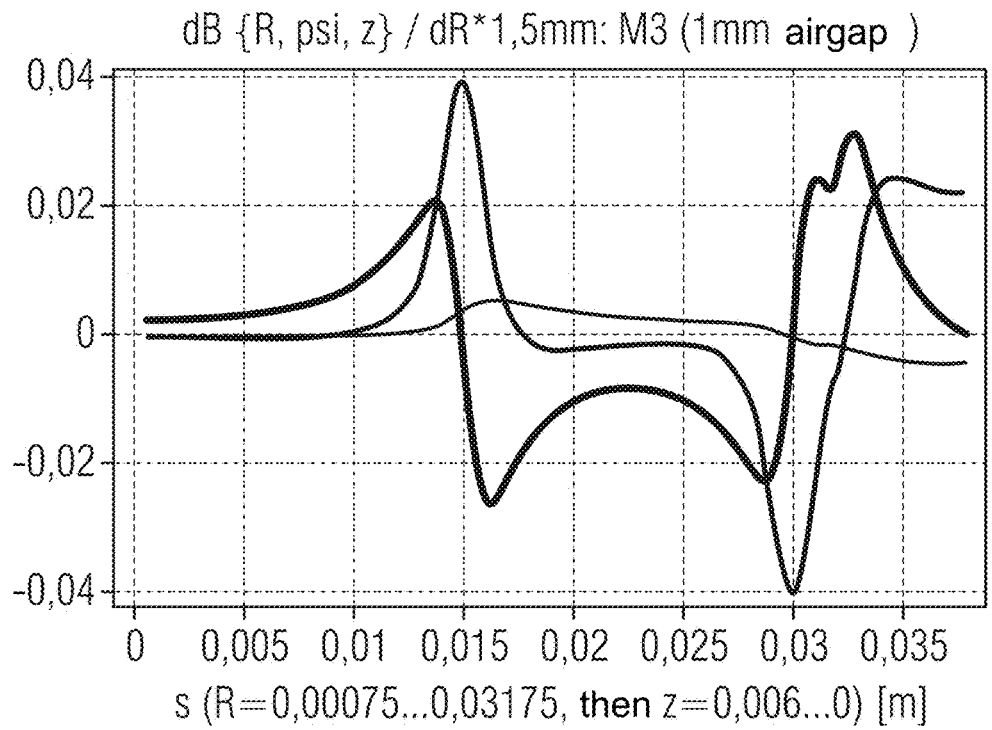
FIG. 52 shows a diagram of gradients of the radial, the tangential and the axial magnetic field components with respect to the radial direction for magnet M3.
Figure 53:
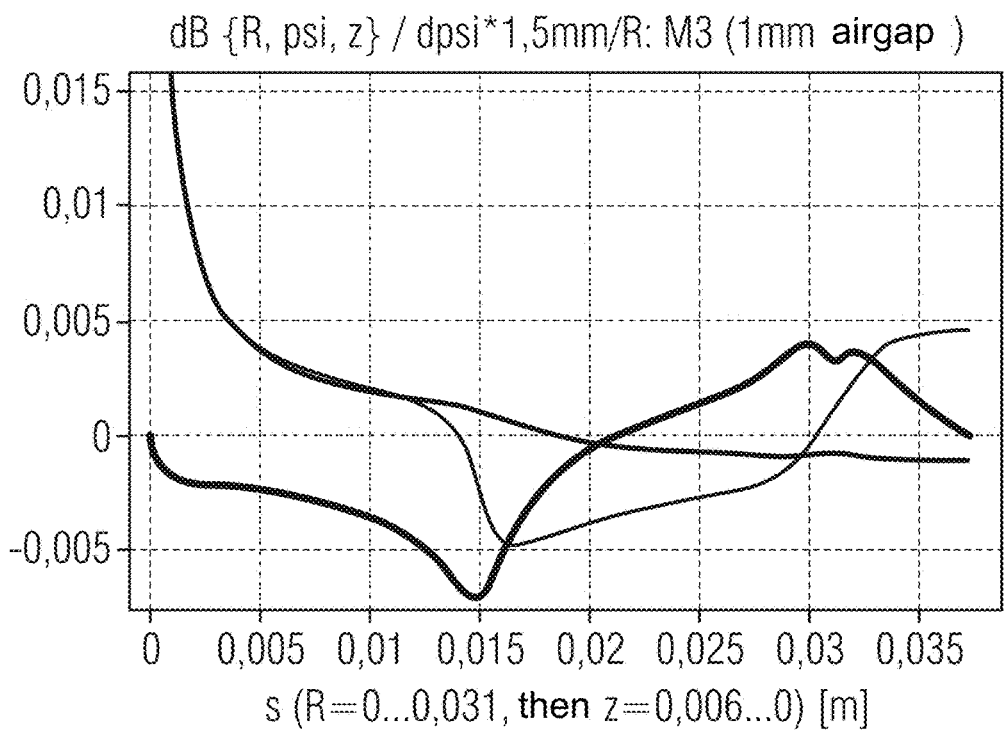
FIG. 53 shows a diagram of gradients of the radial, the tangential and the axial magnetic field components with respect to the tangential direction for magnet M3.
Figure 54:
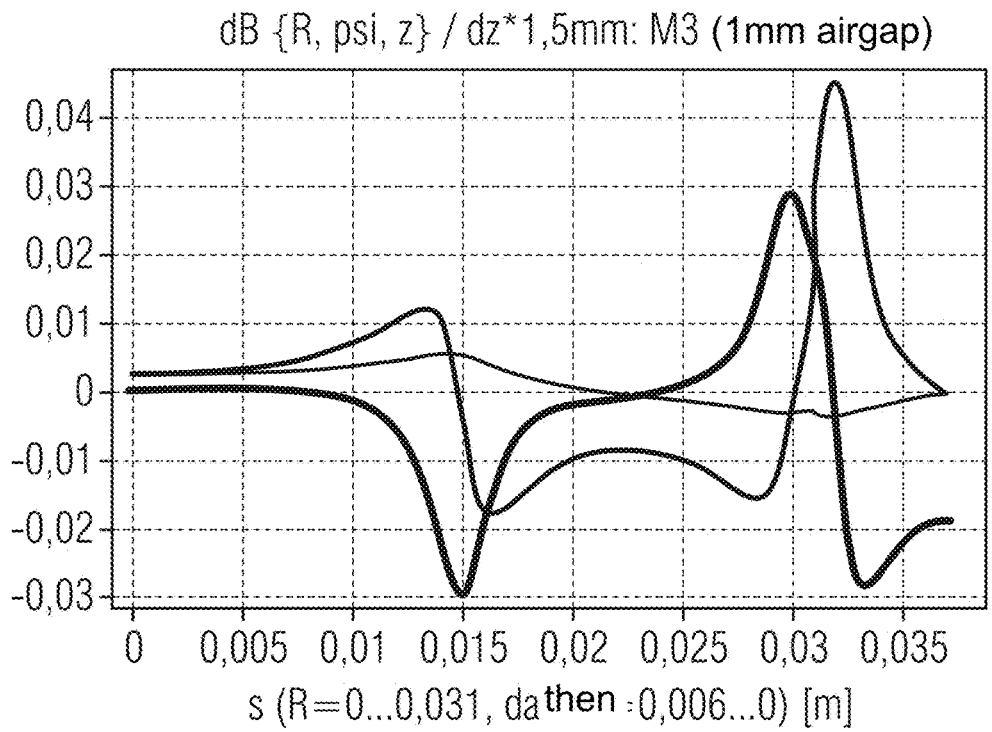
FIG. 54 shows a diagram of gradients of the radial, the tangential and the axial magnetic field components with respect to the axial direction for magnet M3.

In order to find locations, where the gradiometer outputs are large, magnetic field derivatives in the (R,z)-plane for magnet M3 are determined. FIGS. 52, 53 and 54 show the gradients of the three magnetic field components with respect to the radial, the tangential and the axial direction, respectively, as a function of a parameter s. In FIG. 52, the wide curve illustrates the dBz/dR*1.5 mm-dependency, the thin light curve the dBpsi/dR*1.5 mm-dependency, and the thin dark line the dBR/dR*1.5 mm-dependency. Similarly, in FIG. 53, the wide curve illustrates the dBz/dpsi*1.5 mm/R-dependency, the thin light curve the dBpsi/dpsi*1.5 mm/R-dependency, and the thin dark line the dBR/dpsi*1.5 mm/R-dependency. Finally, in FIG. 53, the wide curve illustrates the dBz/dz*1.5 mm-dependency, the thin light curve the dBpsi/dz*1.5 mm-dependency, and the thin dark line the dBR/dz*1.5 mm-dependency.

The gradients decay with larger distance to the surface of the magnet 220. Therefore, it might be possible to compare the gradients along an envelope in 1 mm distance to the surface. In the following, the parameter s is the length along the following path: Beginning at s=0, which corresponds to (R,z)=(0, 6 mm). Then s increases up to s=31 for (R,z)=(31 mm, 6 mm). For larger s, the location is (R,z)=(31 mm, 37 mm-s). Thus, for example, s=31 corresponds to (R,z)=(31 mm, 6 mm) and s=37 corresponds to (R,z)=(31 mm, 0 mm).

From these plots, the derivatives at a specific location can be determined and they can be ranked according to their strength. Finding strong sin-cos-pairs may offer a possibility of implementing a corresponding angle sensor device 100 or a corresponding arrangement 200. Mainly locations are interesting, which have zero slope (d/ds=0, i.e. the extremes), because they represent points, which are robust against misplacement in s-direction. However, a problem of misplacement orthogonal to the s-direction may still exist. Summary for s=37 mm which is (R,z)=(31 mm, 0 mm):

| 1.5 mm * dBR/dR | 22 mT | Sin (psi) |
|---|---|---|
| 1.5 mm * dBz/dz | 18 mT | Sin (psi) |
| 1.5 mm * dBpsi/dR | 5 mT | Cos (psi) |
| 1.5 mm/R * dBR/dpsi | 4.5 mT | Cos (psi) |

Summary for s=33 mm to 34 mm which is (R,z)=(31 mm, 3 mm to 4 mm):

| | | |
|---|---|---|
| 1.5 mm * dBz/dz | 28 mT | Sin (psi) |
| 1.5 mm * dBR/dR | 24 mT | Sin (psi) |
| 1.5 mm/R * dBR/dpsi | 4.4 mT | Cos (psi) |

Summary for s=32 mm to 33 mm which is (R,z)=(31 mm, 4 mm to 5 mm):

| | | |
|---|---|---|
| 1.5 mm * dBR/dz | 45 mT | Sin (psi) |
| 1.5 mm * dBz/dR | 32 mT | Sin (psi) |
| 1.5 mm/R * dBz/dpsi | 3.7 mT | Cos (psi) |
| 1.5 mm * dBpsi/dz | 3.7 mT | Cos (psi) |

Summary for s=30 mm which is (R,z)=(30 mm, 6 mm):

| | | |
|---|---|---|
| 1.5 mm * dBR/dR | 40 mT | Sin (psi) |
| 1.5 mm * dBz/dz | 28 mT | Sin (psi) |
| 1.5 mm/R * dBz/dpsi | 4 mT | Cos (psi) |

Summary for s=16 mm which is (R,z)=(16 mm, 6 mm):

| | | |
|---|---|---|
| 1.5 mm * dBz/dR | 27 mT | Sin (psi) |
| 1.5 mm * dBR/dz | 17 mT | Sin (psi) |
| 1.5 mm * dBpsi/dR | 4.7 mT | Cos (psi) |
| 1.5 mm/R * dBR/dpsi | 4.7 mT | Cos (psi) |

Summary for s=15 mm which is (R,z)=(15 mm, 6 mm):

| | | |
|---|---|---|
| 1.5 mm * dBR/dR | 39 mT | Sin (psi) |
| 1.5 mm * dBz/dz | 30 mT | Sin (psi) |
| 1.5 mm/R * dBz/dpsi | 7.5 mT | Cos (psi) |
| 1.5 mm * dBpsi/dz | 5 mT | Cos (psi) |

Figure 55:
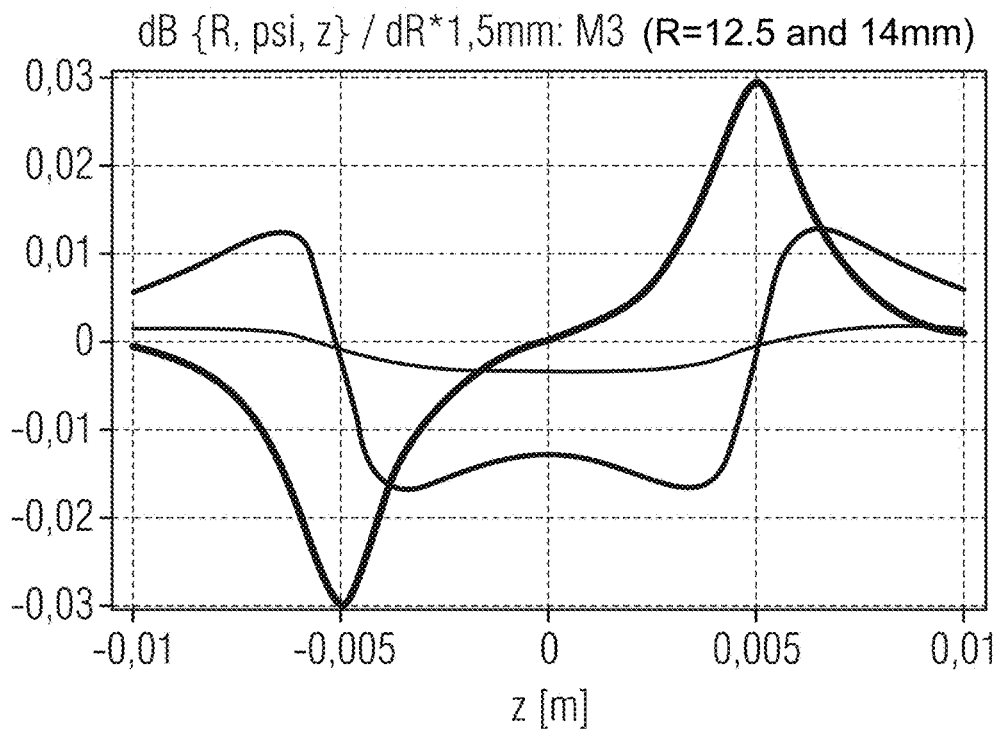
FIG. 55 shows a diagram of gradients of the radial, the tangential and the axial magnetic field components with respect to the radial direction for magnet M3 in the bore of the magnet.
Figure 56:
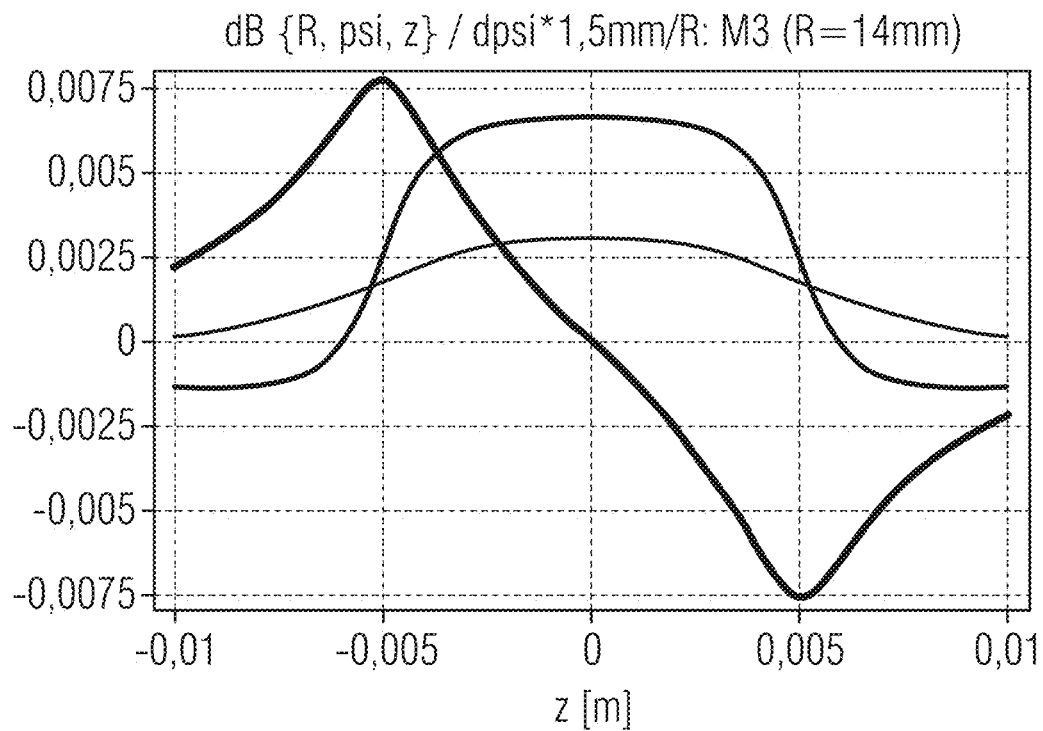
FIG. 56 shows a diagram of gradients of the radial, the tangential and the axial magnetic field components with respect to the tangential direction for magnet M3 in the bore of the magnet.
Figure 57:
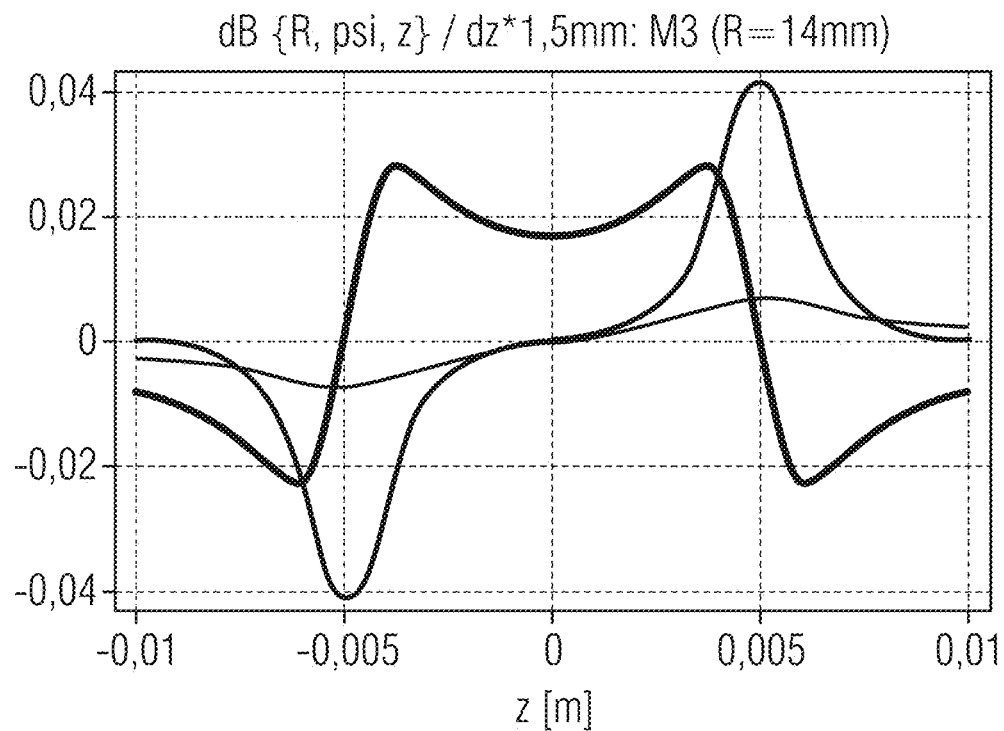
FIG. 57 shows a diagram of gradients of the radial, the tangential and the axial magnetic field components with respect to the axial direction for magnet M3 for the bore of the magnet.

Thus, the strongest cosine-signal occurs at R=15 mm. The small radial distance increases the factor "1.5 mm/R" in front of dBz/dpsi. Accordingly, an even stronger gradient may be found in the bore of the magnet, as illustrated in FIGS. 55, 56 and 57 corresponding to FIGS. 52, 53 and 54, respectively. However, instead of the diagrams being a function of the parameter s, in these figures the axial distance from the mid-plane of the magnet 220 is used.

Summary for (R,z)=(14 mm, 0 mm):

| | | |
|---|---|---|
| 1.5 mm * dBz/dz | 17 mT | Sin (psi) |
| 1.5 mm * dBR/dR | 12.6 mT | Sin (psi) |
| 1.5 mm/R * dBR/dpsi | 6.7 mT | Cos (psi) |

Thus, the pair {dBz/dz, dBR/dpsi} may be a good alternative for a tangential die orientation, which may fit well into the small gap between the magnet 220 and the shaft 260. If the sensor packages 100 are, for instance, arranged on a circle with a radius of 14 mm (R=14 mm) and each package 100 has about 6 mm width, a maximum number of 14 sensor units 100 can be accommodated. Thus, an angular spacing of 30° with a total of 12 discrete sensor units 100 may still be possible and it should be enough to achieve very good angular accuracy, if the angle estimations of these 12 sensor units are combined (e.g. averaged) by a control unit.

In the following, results of a finite element method simulation (FEM-simulation) will be discussed. These simulations are based on an iron shaft 260 with $\mu_r$ of 1000 or more and a diameter of 24 mm. The magnet 220 has an inner diameter of 30 mm, an outer diameter of 60 mm, a thickness of 10 mm and it is magnetized with remanence Brem=0.22 T ($\mu$(recoil)=1.5).

Figure 58:
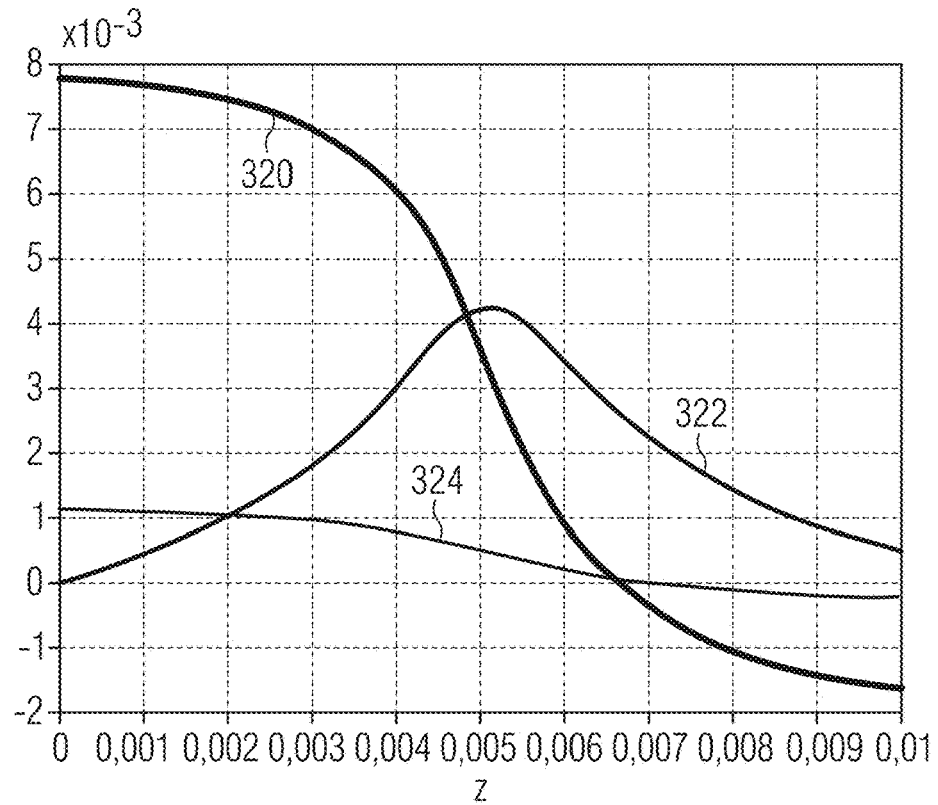
FIG. 58 shows the radial, the tangential and the axial component of the magnetic field as a function of a distance from a mid-plane of a magnet based on a FEM-simulation.

FIG. 58 shows a first result of the FEM-simulation. A curve 320 shows the gradiometer signal 1.5 mm/R*dBR/dpsi as a function of a distance from the mid-plane of the magnet 220 and at a radial distance R=14 mm, given in units of Tesla. A curve 322 shows the gradiometer signal proportional to dBz/dpsi and a curve 324 the gradiometer signal proportional to dBx/dpsi. The curve 320 shows the value 0.007783 T at a position z=0 mm.

This is approximately 16% larger than in the case of a shaft with $\mu_r$=1. The other two components (1.5 mm/R*dBz/dpsi, 1.5 mm/R*dBpsi/dpsi) are smaller due to the iron shaft having values of approximately 57% and 38% of the values for the non-magnetic shaft 260, respectively.

Figure 59:
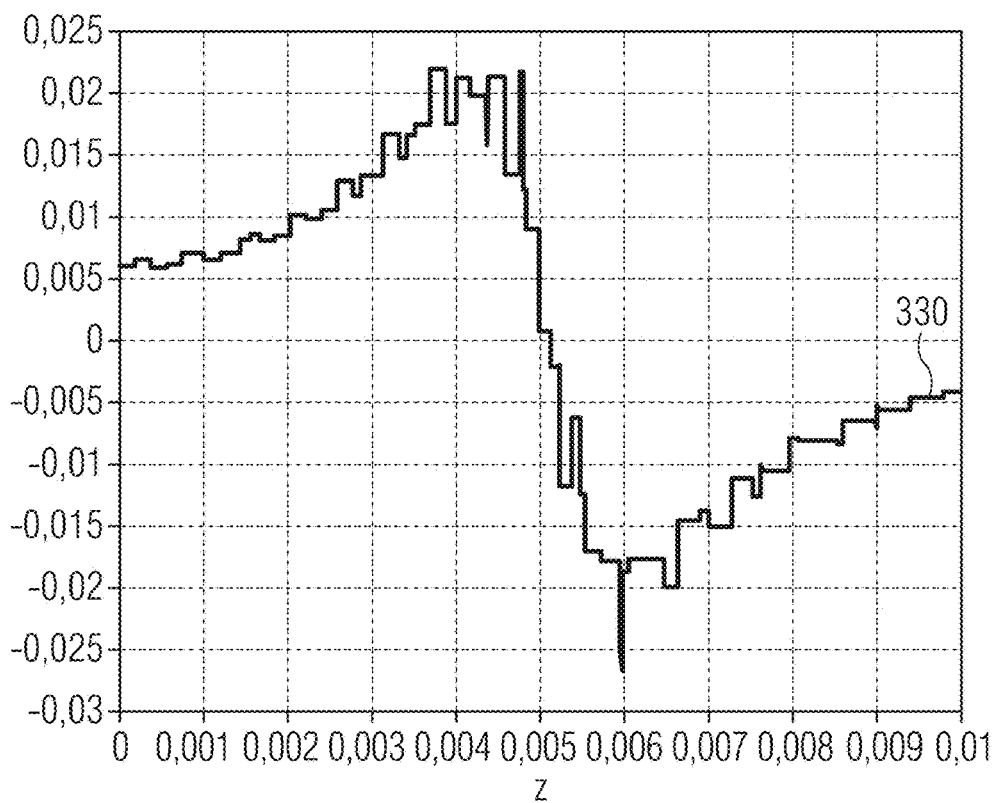
FIG. 59 shows a further result of a FEM-simulation.

However, also the sine-signal 1.5 mm*dBz/dz (curve 330 in FIG. 59) is much weaker due to the ferrous shaft: only 6.3 mT at R=14 mm and z=0.

Hence, a ferrous shaft 260 may reduce one of the two gradiometer signals. Therefore, it might be advisable not to place the sensor units 100 near the inner diameter of a ring-shaped magnet 220, if it is mounted on a ferrous shaft 260. If the shaft 260 is non-magnetic, it might be advisable to place the sensor units 100 in the mid-plane of the magnet ring 220 near the inner diameter.

Figure 60:
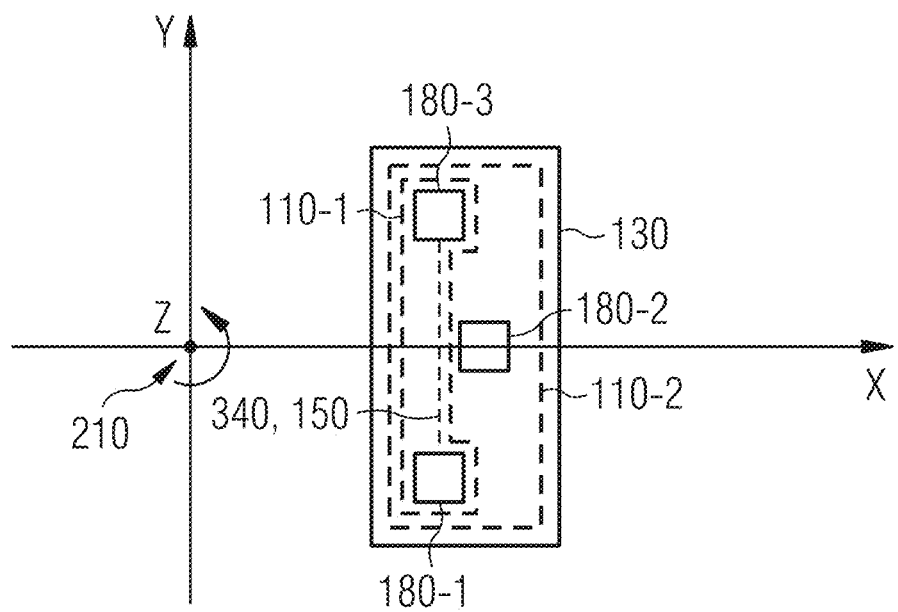
FIG. 60 shows a plan view of a substrate comprising two gradiometers being part of a discrete magnetic angle sensor device according to an embodiment in an off-axis configuration.

FIG. 60 shows a schematic plan view of a discrete magnetic angle sensor device 100 comprising three lateral Hall sensor devices 180-1 (H1), 180-2 (H2) and 180-3 (H3). The three Hall sensor devices 180, which may be replaced by other magnetic sensor devices 180 such as AMR sensor devices 180 in other embodiments, are arranged on a die 130 and form a first gradiometer 110-1 comprising the first and third Hall sensor element 180-1, 180-3, and a second gradiometer 110-2 comprising all three Hall sensor devices 180 used to estimate an angle of a magnetic field. The first gradiometer 110-1 is a first order gradiometer 110, the second gradiometer 110-2 a second order gradiometer 110.

The Hall sensor elements may be arranged on common line 340 equidistantly separated from one another along the line 340. Optionally, as shown in FIG. 60, the second Hall sensor element 180-2 may be displaced perpendicular to the line 340. For instance, the three sensor elements 180 may be arranged on a circular arc, the center of which may coincide with the rotation axis 210.

A first gradiometer signal GS1 may be based on the signals H1, H3 of the first and third sensor elements 180-1, 180-3, respectively. The first gradiometer signal GS1 may be equal to GS1=H1-H3. A second gradiometer signal GS2 may be based on the signals H1, H2, H3 of all sensor elements 180-1, 180-2, 180-3, respectively, and equal to GS2=H1+H3−2*H2. As a consequence, the first gradiometer signal GS1 may be proportional to sin(psi), the second gradiometer signal GS2 to cos(psi), when, for instance, the line 340 is tangentially oriented to a circle being concentrically arranged around the rotation axis 210. Accordingly, both gradiometers 110 are arranged along a common gradiometer direction 150 being collinear to the line 340.

As outlined before, the first gradiometer signal GS1 may be proportional to sin(psi). As a consequence, the second gradiometer signal GS2 is then proportional to cos(psi), since it is (approximately) proportional to the derivative with respect to psi of the first gradiometer signal GS1. Hence, based on both signals GS1 and GS2 the angle may be derivable based on a arctan-computation (psi=arctan (GS1, k*GS2) with a factor k) or a similar calculation as outlined before.

The device 100 may be arranged with respect to the magnet 220 as shown, for instance, in FIG. 8 or 60. Such a package may, for instance, be arranged under the magnet 220 (not shown in FIG. 60). Alternatively, the device 100 may be moved radially outwards such that the rotation axis 210 does not intersect the die 130 as shown in FIG. 60. Hence, the device 100 may eventually be used as an on-axis sensor or as an off-axis sensor. In the latter case, two discrete devices 100 may be used, when the shaft 260 is arranged in between the two devices 100.

It may be interesting to use such a device 100, due to the small number of sensor devices 180 that may offer a limited space and a small energy consumption compared to other systems and devices. Moreover, only sensor elements 180 of the same type may be used, which may be fabricated having similar technology-related and thermal properties as well as similar expected life times.

Figure 61:
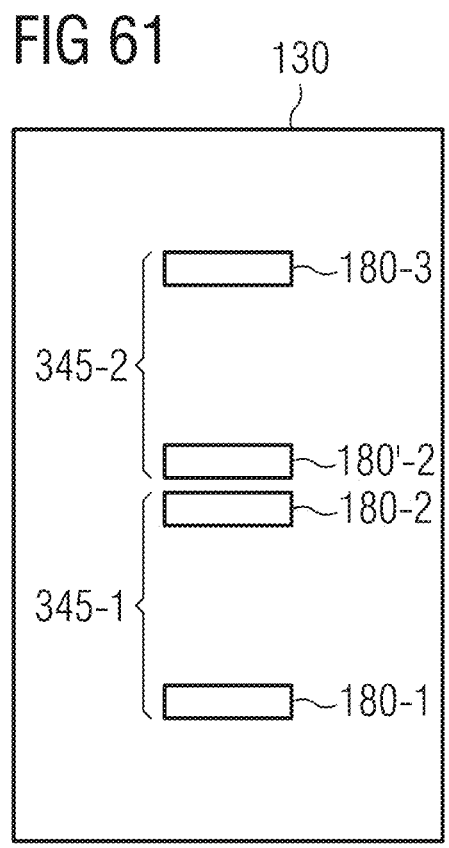
FIG. 61 shows a plan view of a substrate comprising two gradiometers being part of a discrete magnetic angle sensor device according to an embodiment in an off-axis configuration.

FIG. 61 shows a plan view of a further device 100, which may be based on vertical Hall sensor elements 180, AMR-sensor elements 180 or sensor elements 180 of another type. The device 100 comprises four sensor elements 180-1, 180-2, 180'-2, 180-3, which may be single sensor elements 180 or comprise series connections of, for instance, xMR-sensor elements such as AMR-sensor elements. Accordingly, the sensor elements 180-1, 180-2 may form a first bridge 345-1, while the sensor elements 180'-2 and 180-3 form a second bridge 345-2. Depending on whether the sensor elements 180 shown in FIG. 61 are single elements 180 or series connections of sensor elements 180 forming half bridges, the bridges 345 are half bridges or full bridges. The sensor elements 180 may be arranged on a die 130.

Assuming the sensor elements 180-1, 180-2, 180'-2 and 180-3 provide the signals A1, A2, A2' and A3, respectively, two gradiometer signals GS1, GS2 may be derivable based on the bridges 345-1, 345-2 providing the signals B1=A1-A2, B2=A2'-A3, respectively. GS1 may be given by GS1=B1+B2=(A1-A2)+(A2'-A3) and GS2 by GS2=B1-B2=(A1-A2)-(A2'-A3). In other words, the signals B1 and B2 are first order gradiometer signals. The signal GS1 is also a first order gradiometer signal and it is identical to the sum of the first order gradiometer signals B1 and B2. The signal GS2 is also a second order gradiometer signal and it is identical to the difference of the first order gradiometer signals B1 and B2.

A further embodiment of a device 100 may comprise four sensor elements 180 arranged on a circle, two of which are, for instance, diametrically arranged lateral Hall sensor elements 180 and two of which are diametrically arranged magnetic field effect transistors (MAG-FET). Naturally, the magnetic field effect transistors may be replaced by triangular Hall sensor elements, a signal is derivable at a node in between the two triangular Hall sensor elements.

Figure 62A:
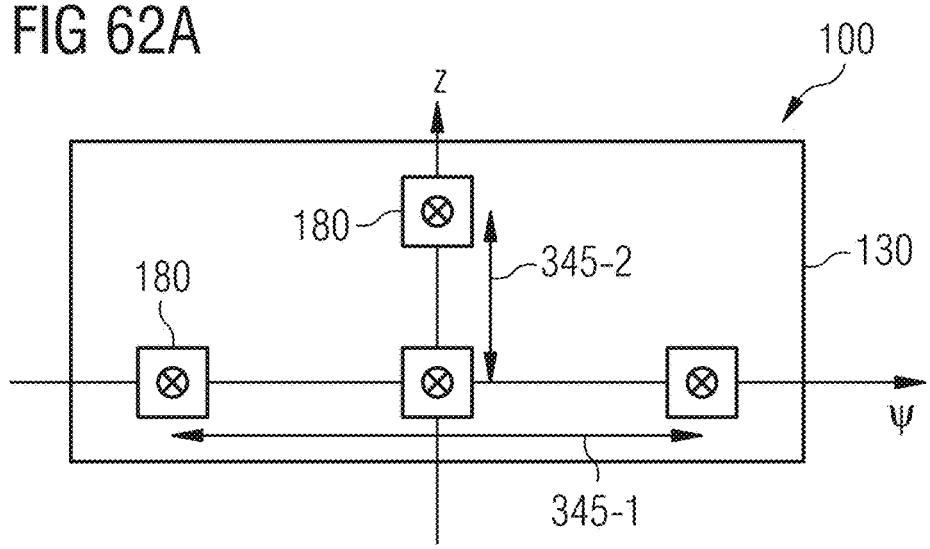
FIG. 62a shows a plan view of a substrate comprising two gradiometers being part of a discrete magnetic angle sensor device according to an embodiment in an off-axis configuration.
Figure 62B:
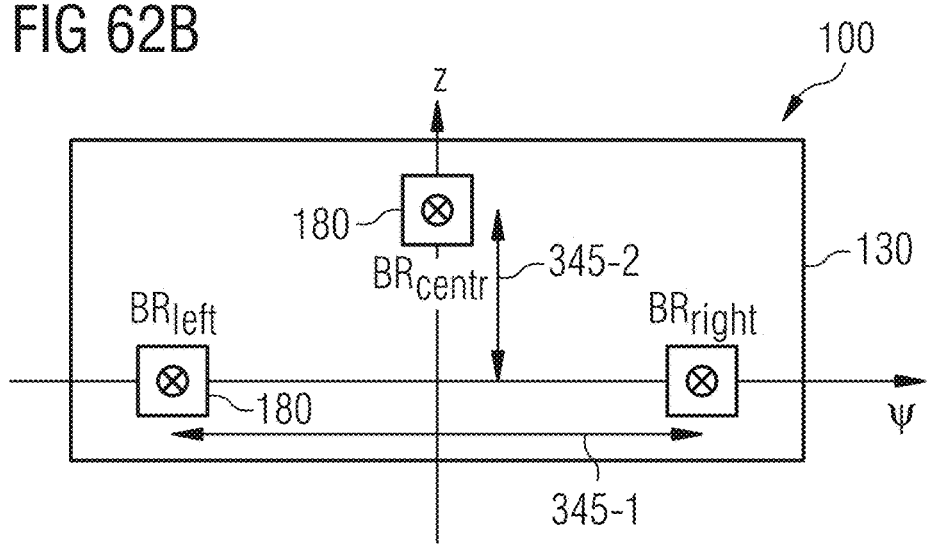
FIG. 62b shows a plan view of a substrate comprising two gradiometers being part of a discrete magnetic angle sensor device according to an embodiment in an off-axis configuration.
Figure 62C:
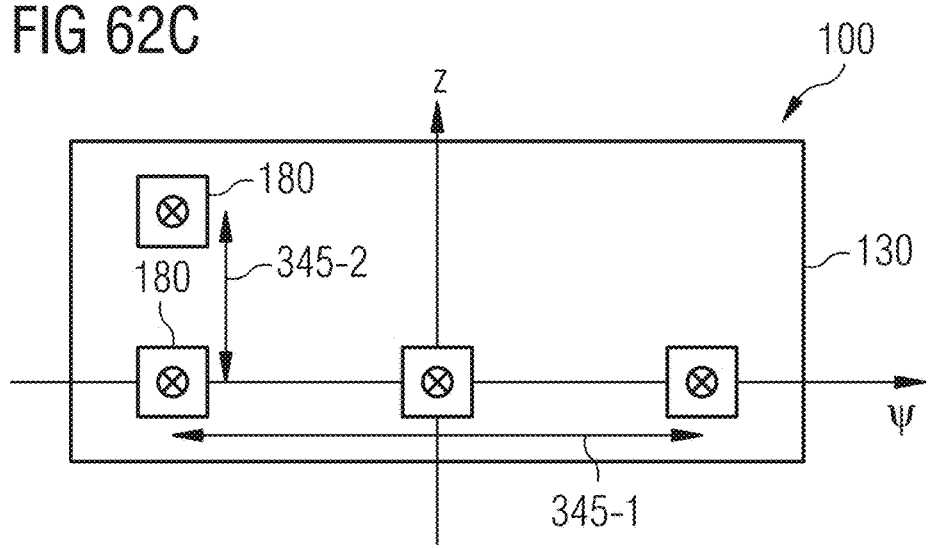
FIG. 62c shows a plan view of a substrate comprising two gradiometers being part of a discrete magnetic angle sensor device according to an embodiment in an off-axis configuration.

FIGS. 62a, 62b and 62c show plan views of further devices 100 according to an embodiment, which will be described below. These devices 100 use the pair $\{dB_R/dz, dB_R/d\psi\}$. If the die 130 is parallel to the (psi,z)-plane, it may be possible to use a single type of magnetic field sensor 180 sensitive to, for instance, BR. This type of sensor element 180 may be a horizontal Hall plate, which may have a smaller error than vertical Hall sensor elements. In this case it might be interesting to use a rectangular die 130, where the spacing of the pair aligned in the z-direction is smaller than the spacing of the pair aligned in psi-direction. In the example discussed above, when, for instance, the first one has a spacing of only 0.9 mm and the second one has a spacing of 2.45 mm, this may give an amplitude of 15.7*0.9/1.5=9.4 mT for the gradiometer in z-direction and 3.6*2.45/1.5=5.9 mT for the gradiometer in psi-direction. Thus, the difference of signal amplitudes for both gradiometers 110 may be smaller than given above. If each gradiometer 110 has a worst case offset error of 15 this may give a worst case angle error of 15μ/5.9 m*180°/pi=0.15°.

As FIG. 62b shows, it may even be possible to use only three sensor elements 180 in order to reduce the power consumption and the area consumption of the circuit. In this case the sensor 100 may compute GS1=BR(right)-BR(left) to obtain a first sinusoidal signal as the gradiometer signal GS1 of the first order gradiometer 110 and GS2=BR(center)-(BR(right)+BR(left))/2 to obtain a second sinusoidal signal that is in quadrature to the first sinusoidal signal (cosine signal) as the gradiometer signal GS2 of the second order gradiometer 110.

Alternatively, as shown in FIG. 62c, the upper sensor element 180 may be placed asymmetrically forming an "L"-shaped design.

Then the sensor may compute GS1=BR(lower right)-BR (lower left) to obtain a first sinusoidal signal and GS2=BR (upper left)-(BR(lower right)+BR(lower left))/2 to obtain a second sinusoidal signal. Alternatively, the second sinusoidal signal by be obtained by GS2'=BR(upper left)-BR (lower left). GS2' is a gradiometer signal of a first order gradiometer, whereas GS2 is an approximate second order gradiometer signal. These two sinusoidal signals may not be exactly 90° phase shifted (with respect to psi) any more but for a given magnet this orthogonality error can be accounted for. Naturally, the gradiometer signals GS1, GS2 may be used as outlined above in context with FIG. 62b.

FIG. 63 shows a perspective view of a shaft 260, a disc-like magnet 220 with a central bore, through which the shaft 260 runs. The magnet 220 is once again diametrically magnetized. However, the arrangement shown further comprises a disc 350 having the same outer diameter as the ring-shaped magnet 220. The disc 350 furthermore comprises a sensor bore through which the shaft 260 also extends. The disc 350 comprises a thickness along the rotation axis 210, which is smaller than the outer diameter of the disc 350.

The disc 350 may be ferromagnetic or ferrous, for instance, made from a ferrous material and having a thickness of 1 mm along the rotation axis 210 (z-direction). It is fixed on the shaft 260. Being produced from a ferrous material, it may comprise a relative permeability $\mu_r$ of 1000 or more. Based on the structure shown in FIG. 63, a FEM-simulation has been carried out.

The presence of the ferrous disk 350 alone—using a non-magnetic shaft 260—reduces dBR/dpsi and increases dBz/dz. This may eventually degrade an achievable accuracy. To sum up, the strongest signals may be obtained, if the shaft 260 and the disk 350 are ferrous. Then the amplitudes of the {dBz/dz, dBR/dpsi}-gradiometer pair 110 with a spacing of 1.5 mm may be 15 mT and 9.5 mT, respectively. If, for instance, a tangential die orientation is used, this may fit perfectly into the narrow gap. However, a limitation may be present for the dBz/dz-gradiometer, because it might only be detectable by vertical Hall sensor elements 180, whereas a dBR/dpsi-gradient may be detectable by horizontal Hall sensor elements 180.

Assuming a worst case vertical Hall sensor element offset error of 75 μT, an angle error of 75/15000·180°/π=0.3° may result, while in the case of a horizontal Hall sensor element offset of 15 μT may give an angle error of 15/9500*180°/

π=0.1°. In this case one may increase the z-spacing of the vertical Hall sensor elements of the corresponding gradiometer and reduce the psi-spacing of the horizontal Hall sensor elements. Additionally or alternatively, one may reduce the thickness of the magnet 220 to increase the gradient dBz/dz.

Figure 64:
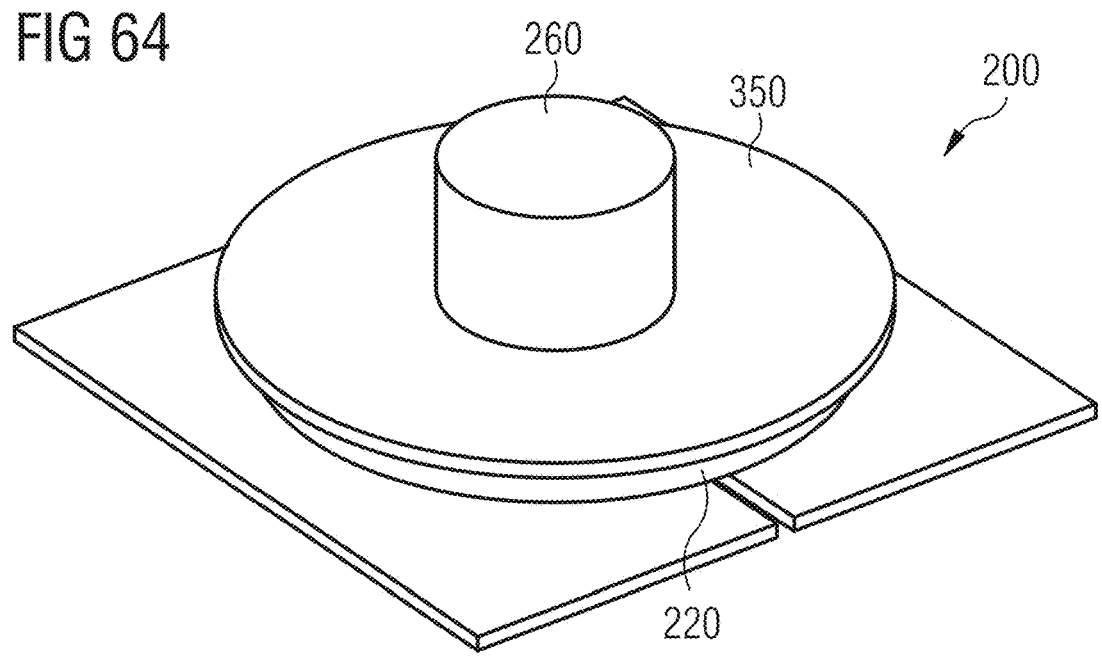
FIG. 64 shows a perspective view of a magnetic angle sensor arrangement according to an embodiment in an off-axis configuration comprising a ferrous disc.

FIG. 64 shows a perspective view of a mechanical setup of a magnetic angle sensor arrangement 200. The arrangement 200 comprises a shaft 260, which may optionally comprise a ferrous material, such as iron. The material may comprise a relative permeability $\mu_r$ of 1000 or more ($\mu_r$>1000).

The arrangement 200 further comprises a disk 350, which may optionally and additionally or alternatively comprise a ferrous material as well. The arrangement 200 further comprises an optionally diametrically magnetized magnet 220. The disk 350 may have the same outer diameter as the magnet 220, which may be ring- or cylinder-shaped. The arrangement 200 may further comprise a carrier plate 280, which may be implemented as a single or more than one circuit board. In the embodiment shown in FIG. 64-67, the carrier plate 280 comprises two separate printed circuit boards. The carrier plate 280 or—in other words—the printed circuit board(s) may hold the sensor units or discrete magnetic angle sensor devices 100 according to an embodiment. The arrangement 200 may comprise one or more sensor devices 100. The carrier plate 280 may further be configured to make electrical connections to and possibly also between the sensor devices 100.

Figure 65:
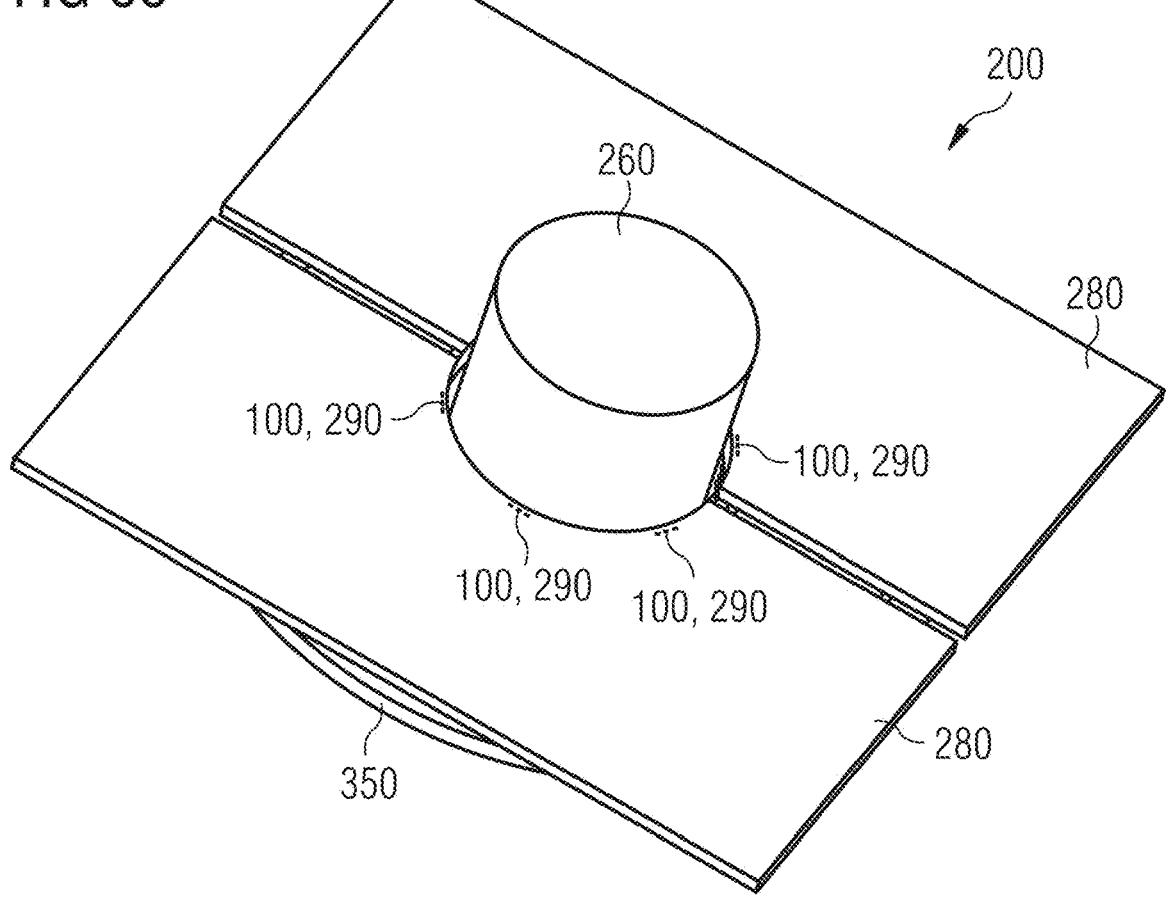
FIG. 65 shows a further perspective view of a magnetic angle sensor arrangement of FIG. 64.

FIG. 65 shows a bottom view with parts of the leads or pins 290 of the sensor units 100 going through the circuit board. The sensor devices 100 may be positioned on a circle around the shaft 260. Consequently, the sensor devices 100 are in this embodiment not outside the magnet 220, but inside the bore of the magnet 220, which has the shape of a ring. The circuit boards 280 are split in two halves, because this may simplify an assembly procedure of the arrangement 200. The two halves may be held together by some mechanical fixture or they are mounted on a single frame, which holds them together, to name just two alternative approaches.

Of course, it may be advisable, if not vital that the position tolerances of the sensor units 100 versus the magnet 220 and the shaft 260 are not unduly impaired by the splitting of the circuit board. Naturally, the circuit board (carrier plate 280) may be split asymmetrically such that one part (the larger one) may hold at least two opposite sensor units 100. Then it may be possible to compare the readings of the opposite two units 100 in a test after assembly with the readings of other opposite pairs. If they are not similar, this might be an indication that the two boards are not positioned accurately enough or symmetrically enough around the rotation axis 210.

Figure 66:
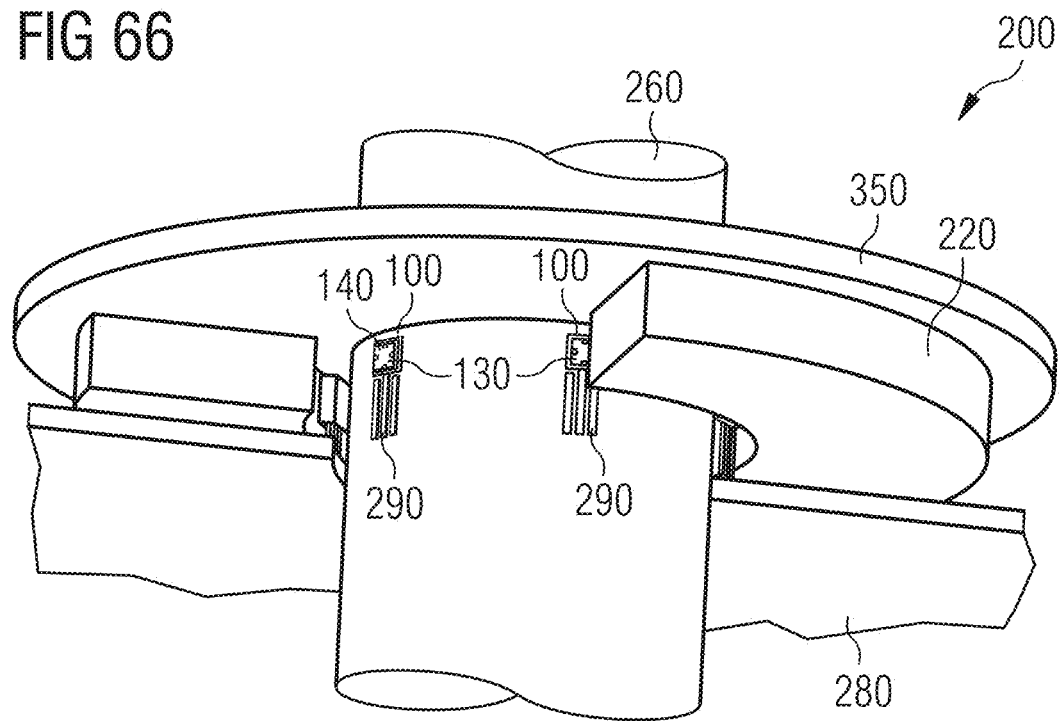
FIG. 66 shows a perspective partial sectional view of a magnetic angle sensor arrangement shown in FIGS. 72 and 73.
Figure 67:
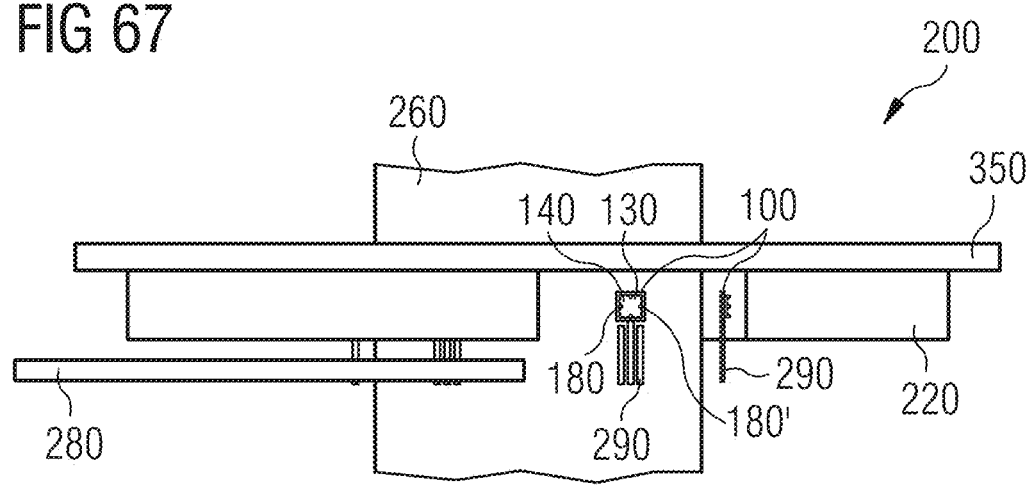
FIG. 67 shows a sideways partial sectional view of the magnetic angle sensor arrangement shown in FIGS. 72 to 75.

In the FIGS. 66 and 67 a quarter of the magnet 220 is cut away and one of the two circuit boards is hidden in order to enable a better view to the sensor units 100. The sensor dies 130 are oriented in a tangential way so that their main surfaces 140 are parallel to the (psi,z)-plane. The two gradiometers are shown. The gradiometers comprise two sensor elements 180, which may, for instance, be implemented as horizontal Hall sensor elements making up the dBR/dpsi-gradiometer 110. The discrete sensor device 100 further comprises the two sensor elements 180', which may be implemented as vertical Hall sensor elements making up the dBz/dz-gradiometer 110.

The active or main surface 140 of the dies 130 is here oriented towards the inner diameter of the magnet 220 and not towards the shaft 260. In fact, from a magnetic point of view, it may be beneficial, if the gap between the sensor elements 180 and the magnet 220 is small, whereas the gap between sensor elements 180 and the shaft 260 may be larger.

FIG. 67 shows the axial position of the elements 180. The centers of both gradiometers 110 may be in the mid-plane of the magnet 220.

Additionally, a further disk may be added below the circuit board or—in other words—on a side facing away from the disk 350. The further disk may optionally comprise or be fabricated from a ferrous material as outlined before. For specific dimensions this may increase the signals and it may also increase a shielding against external fields. It may—additionally or alternatively—improve the mechanical robustness of the system, although it might make the assembly of the arrangement 200 more complicated.

Hysteresis effects of all ferrous parts fixed to the magnet 220 may be irrelevant, since they are fixed with respect to the magnetic field they are not likely to distort the functional relationship of signals-versus-rotation-angle.

In the FIG. 64-67 the ferrous disk 350 has a larger diameter than the magnet 220. Yet it may also have a smaller one or an identical one. The outer diameter may not be so important for magnetic reasons, since the fields may be evaluated at the inner diameter. However, it may be advisable to use specific profiling of the disk 350 near the inner diameter. However, such a profile might be independent of the rotation angle psi (no psi-dependence). It may have an (R,z)-dependence, for instance, the disk 350 may have a conical shape at diameters between the magnet 220 and the shaft 260. Alternatively or additionally, it may approach the discrete sensor units 100 in axial direction by, for instance, about 1 mm there.

Implementing such a disk 350, which is also referred to as a swashplate, may be freely combined with embodiments described before, for instance, having several sensor units 100, each one outputting an angle estimation and a control unit 170, which combines all these estimations to get an improved angle estimation.

Since more than one sensor unit 100 may be used, they should provide means to obtain synchronous readings. For instance, as outlined before, an external control unit like a microprocessor (μC) may be able to send them a synchronization pulse or triggering signal that initiates a synchronized measurement or sampling of magnetic fields or estimated rotation angles at all sensor units 100. Since the discrete sensors 100 usually run asynchronously according to their own clock generated in the individual sensor units 100, they may have algorithms on-board, which interpolate or extrapolate synchronized angle values from former readings. If it is assumed that, for instance, a discrete sensor 100 computes updates of values of rotation angle every 30 μs, it may store a predefined number of preceding values, for instance the preceding five values, in an on-chip register. If a synchronization pulse is applied to the sensor unit 100 22 μs after the last update was computed, the sensor unit 100 may fit, for instance, a $2^{nd}$-order polynomial through the five values in the register and compute the extrapolated value at the time of the synchronization pulse. This value is then communicated to the microprocessor. Thus the microprocessor may obtain synchronized values of all sensor units 100 and it may use these readings to get an improved estimate of rotation angle by various algorithms, for instance, simply by taking the average of all values with respect to their position in the arrangement 200.

Figure 68:
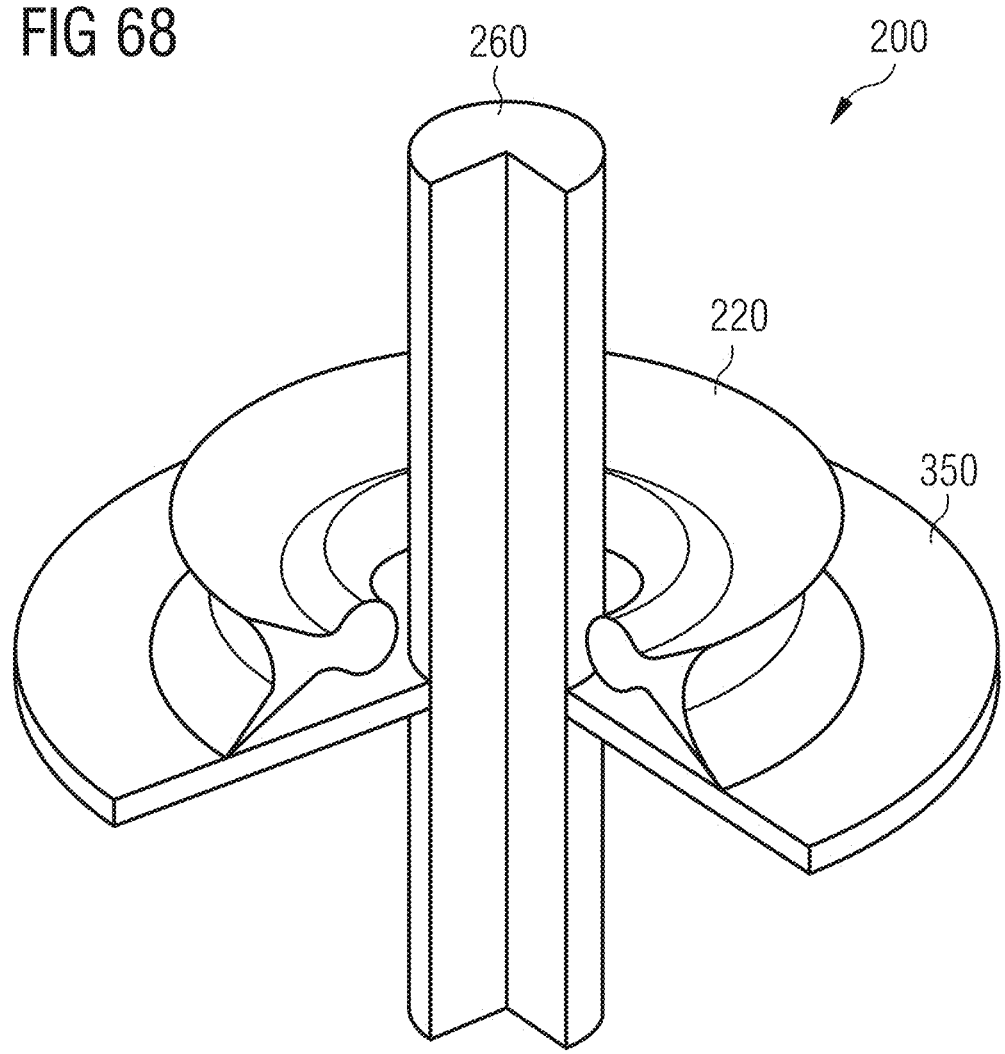
FIG. 68 shows a perspective partial sectional view of a magnet for a magnetic angle sensor arrangement according to an embodiment.

FIG. 68 shows a perspective view of a magnet 220, having a generic form, which may offer a diametrical and/or homogeneous magnetization along with a rotational shape. However, it may not be a magnet practical to implement. However, it may allow purely sinusoidal fields according to the following equations:

$$B_R(R,\psi,z)=b_R(R,z)\sin\psi \quad (19)$$

$$B_\psi(R,\psi,z)=b_\psi(R,z)\cos\psi \quad (20)$$

$$B_z(R,\psi,z)=b_z(R,z)\sin\psi \quad (21)$$

Figure 69:
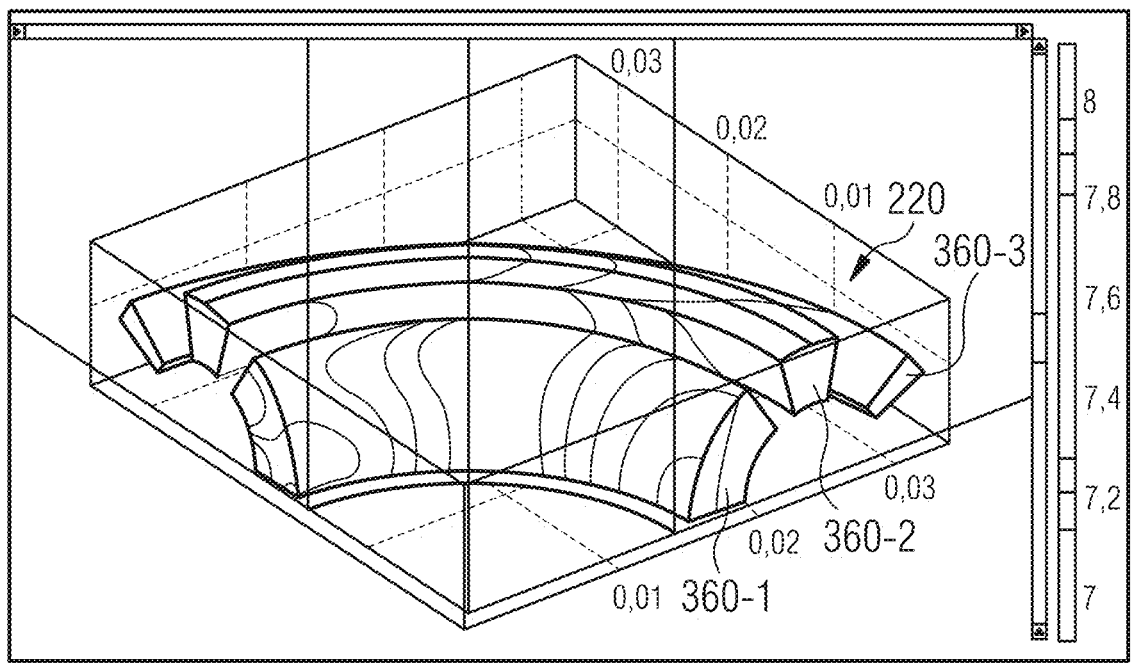
FIG. 69 shows a perspective view of a multi-part magnet.
Figure 70:
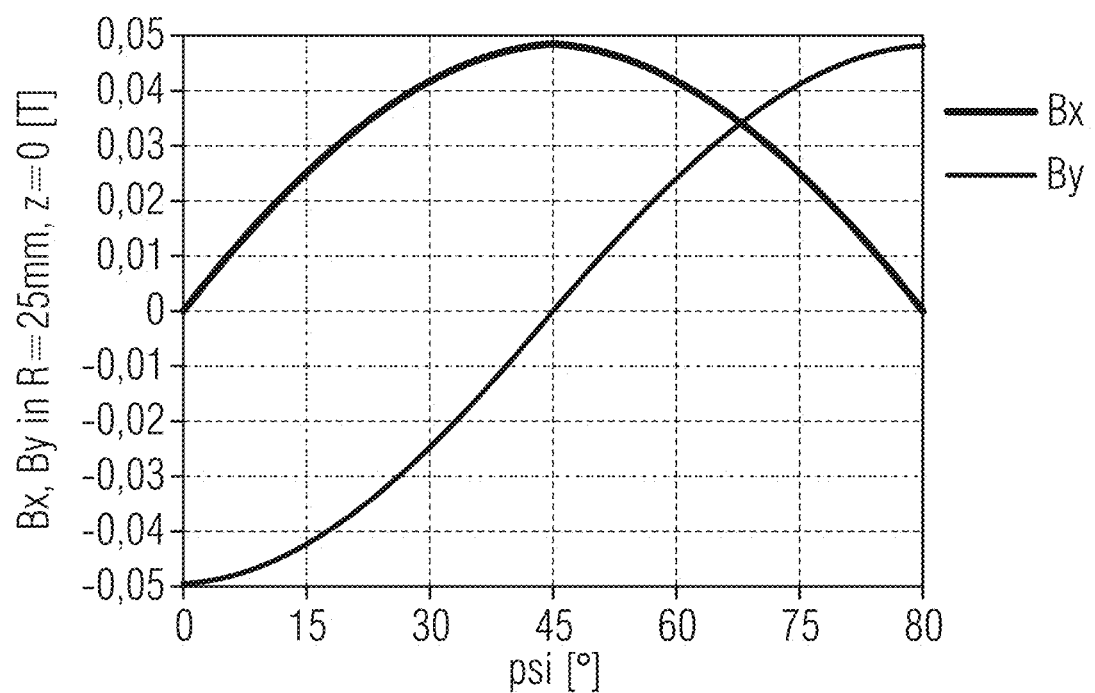
FIG. 70 shows a diagram of magnetic field components along an x-direction and a y-direction in a mid-plane of the magnet shown in FIG. 69 as a function of a rotation angle of the magnet.

FIG. 69 shows a further magnet 220 comprising three toroidal parts 360-1, 360-2, 360-3 along with results of a numerical simulation of the magnetization based on a real demagnetization curve of a typical ferrite material. FIG. illustrates that the magnets 220 shown before, may, for instance, also be implemented based on more than one part 360. Moreover, FIG. 70 illustrates the sinusoidal dependencies of the x- and y-components of the magnetic field Bx, By.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The methods described herein may be implemented as software, for instance, as a computer program. The sub-processes may be performed by such a program by, for instance, writing into a memory location. Similarly, reading or receiving data may b e performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

The invention claimed is:

1. A discrete magnetic angle sensor device, comprising:
a first magnetic field gradiometer sensitive to a first magnetic field component in a first direction, the first magnetic field gradiometer including a first magnetic sensor element and a second magnetic sensor element, wherein the first magnetic field gradiometer is configured to cancel out a homogeneous disturbance field in the first direction; and
a second magnetic field gradiometer sensitive to a second magnetic field component in a second direction different from the first direction, the second magnetic field gradiometer including a third magnetic sensor element and a fourth magnetic sensor element, wherein the second magnetic field gradiometer is configured to cancel out a homogeneous disturbance field in the second direction.

2. The discrete magnetic angle sensor device according to claim 1, wherein the first and second magnetic field gradiometers are formed within or on a surface of a substrate.

3. The discrete magnetic angle sensor device according to claim 2, wherein the substrate is at least one of: a semiconductor substrate, an inorganic substrate, and a monocrystalline substrate.

4. The discrete magnetic angle sensor device according to claim 1, further comprising: a sensor circuit configured to generate a sensor signal indicative of a rotation angle based on a first gradiometer signal of the first magnetic field gradiometer and on a second gradiometer signal of the second magnetic field gradiometer.

5. The discrete magnetic angle sensor device according to claim 1, wherein at least one of the first and second gradiometers is of an order higher than one, and wherein a gradiometer of order n is indicative of a difference of two gradiometer signals of order (n−1).

6. The discrete magnetic angle sensor device according to claim 1, wherein the first magnetic field component is perpendicular to the second magnetic field component.

7. The discrete magnetic angle sensor device according to claim 1, wherein:
the first magnetic sensor element and the second magnetic sensor element are of a same sensor type of a group of sensor types, and
the third magnetic sensor element and the fourth magnetic sensor element are of a same sensor type of the group of sensor types.

8. The discrete magnetic angle sensor device according to claim 7, wherein the group of sensor types comprises: a vertical Hall-sensor, a horizontal Hall-sensor, a giant magneto-impedance device, a magnetic field effect transistor, and a magnetoresistive sensor element.

9. The magnetic angle sensor arrangement according to claim 1, wherein the first magnetic field gradiometer and the second magnetic field gradiometer are of different types of a group of gradiometer types.

10. The discrete magnetic angle sensor device according to claim 1, wherein:
the first magnetic sensor element and the second magnetic sensor element are of a same sensor type; and
the third magnetic sensor element and the fourth magnetic sensor element are of a same sensor type.

11. The magnetic angle sensor arrangement according to claim 1, wherein the first magnetic sensor element is a first lateral Hall sensor element, the second magnetic sensor element is a second lateral Hall sensor element, the third magnetic sensor element is a first vertical Hall sensor element, and the fourth magnetic sensor element is a second vertical Hall sensor element.

12. A method for generating an angle signal, comprising:
providing a magnetic field;
generating first and second sensor signals indicative of a rotation angle by first and second magnetic field gradiometers, respectively, wherein: the first magnetic field gradiometer includes a first magnetic sensor element and a second magnetic sensor element, the first magnetic field gradiometer is sensitive to a first magnetic field component of the magnetic field in a first direction and configured to generate the first sensor signal to be independent of a homogeneous external magnetic disturbance field in the first direction, the second magnetic field gradiometer includes a third magnetic sensor element and a fourth magnetic sensor element, and the second magnetic field gradiometer is sensitive to a second magnetic field component of the magnetic field in a second direction different from the first direction and configured to generate the second sensor signal to be independent of a homogeneous external magnetic disturbance field in the second direction; and
generating the angle signal indicative of the rotation angle based on the first and the second sensor signals.

13. The method according to claim 12, wherein generating the first and the second sensor signals comprises generating the first and the second sensor signals based on a gradient of the first magnetic field component of the magnetic field with respect to a first gradiometer direction and based on a gradient of the second magnetic field component of the magnetic field different from the first magnetic field component with respect to the first gradiometer direction or a second gradiometer direction different from the first gradiometer direction.

14. The method according to claim 12, further comprising: generating a triggering signal, wherein generating the first and the second sensor signals comprises generating each of the first and the second sensor signals indicative of a measurement, wherein each of the first and the second sensor signals takes the measurement synchronously based on the triggering signal.

15. The method according to claim 12, wherein providing the magnetic field comprises providing the magnetic field by a rotatably mounted magnet, the magnet comprising an essentially diametrical magnetization oriented such that the magnetization is essentially oriented perpendicular to a rotation axis, around which the magnet is rotatable.

16. The method according to claim 12, wherein at least one of the first and second magnetic field gradiometers is of an order higher than one, and wherein a magnetic field gradiometer of order n is indicative of a difference of two sensor signals of order (n−1).

17. A method for providing a sensor signal, comprising:
generating a first gradiometer signal using a first gradiometer sensitive to a first magnetic field component in a first direction, the first gradiometer including a first magnetic sensor element and a second magnetic sensor element, and the first gradiometer signal being independent of a homogeneous external magnetic field in the first direction;
generating a second gradiometer signal using a second gradiometer sensitive to a second magnetic field component in a second direction different from the first direction, the second gradiometer including a third magnetic sensor element and a fourth magnetic sensor element, and the second gradiometer signal being independent of a homogeneous external magnetic field in second direction; and
generating the sensor signal indicative of a rotation angle of the magnetic field based on the first and the second gradiometer signals.

18. The method according to claim 17, wherein the first gradiometer and the second gradiometer are of different types of a group of gradiometer types.

19. The method according to claim 17, wherein the first and second gradiometers are comprised in a magnetic angle sensor.

20. The method according to claim 17, wherein the first gradiometer is configured to cancel out the homogeneous external magnetic field in the first direction such that the first gradiometer signal is independent of the homogeneous external magnetic field in the first direction, and the second gradiometer is configured to cancel out the homogeneous external magnetic field in the second direction such that the second gradiometer signal is independent of the homogeneous external magnetic field in the second direction.

21. The method according to claim 17, further comprising: generating a triggering signal, wherein generating the first and the second gradiometer signals comprises generating each of the first and the second gradiometer signals indicative of a measurement, and wherein each of the first and the second gradiometer signals takes a measurement synchronously based on the triggering signal.

\* \* \* \* \*